(12) United States Patent
White et al.

(10) Patent No.: US 7,795,995 B2
(45) Date of Patent: Sep. 14, 2010

(54) LIQUID CRYSTALLINE POLYMER AND MULTILAYER POLYMER-BASED PASSIVE SIGNAL PROCESSING COMPONENTS FOR RF/WIRELESS MULTI-BAND APPLICATIONS

(75) Inventors: George E. White, Marietta, GA (US); Madhavan Swaminathan, Marietta, GA (US); Venkatesh Sundaram, Norcross, GA (US); Sidharth Dalmia, Norcross, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 932 days.

(21) Appl. No.: 10/590,851

(22) PCT Filed: Feb. 23, 2005

(86) PCT No.: PCT/US2005/006006

§ 371 (c)(1),
(2), (4) Date: Nov. 13, 2006

(87) PCT Pub. No.: WO2005/084090

PCT Pub. Date: Sep. 9, 2005

(65) Prior Publication Data

US 2007/0085108 A1    Apr. 19, 2007

Related U.S. Application Data

(63) Continuation-in-part of application No. 10/402,313, filed on Mar. 28, 2003.

(60) Provisional application No. 60/546,998, filed on Feb. 23, 2004.

(51) Int. Cl.
*H01P 5/12* (2006.01)
*H01P 3/08* (2006.01)

(52) U.S. Cl. .................. 333/134; 333/185; 333/204
(58) Field of Classification Search .............. 333/134, 333/185, 204; 336/200, 223, 232; 361/303
See application file for complete search history.

(56) References Cited

U.S. PATENT DOCUMENTS 5,739,193 A    4/1998  Walpita et al.

(Continued)

FOREIGN PATENT DOCUMENTS

JP    5371164    2/1993

(Continued)

OTHER PUBLICATIONS

Office Action for Japanese Patent Application No. 2006-554327 dated Apr. 20, 2010.

*Primary Examiner*—Robert Pascal
*Assistant Examiner*—Kimberly E Glenn
(74) *Attorney, Agent, or Firm*—Sutherland Asbill & Brennan LLP

(57) ABSTRACT

The present invention provides all organic fully-packaged miniature bandpass filters, baluns, diplexers, multiplexers, couplers and a combination of the above manufactured using liquid crystalline polymer (LCP) and other multilayer polymer based substrates. These devices are manufactured using one or more LCP layers having integrated passive components formed thereon to provide the density and performance necessary for multi-band wireless devices. In the designs involving multiple LCP layers, the LCP layers are separated by prepeg layers. In accordance with an aspect of the present invention, coplanar waveguide, hybrid stripline/coplanar waveguide and/or microstrip topologies are utilized to form the integrated passive components, and the devices can be mass produced on large area panels at least 18 inches by 12 inches with line widths smaller than 10 um.

33 Claims, 37 Drawing Sheets

U.S. PATENT DOCUMENTS

| | | | |
|---|---|---|---|
| 6,900,708 B2 * | 5/2005 | White et al. ................. | 333/185 |
| 6,914,500 B2 * | 7/2005 | Hirabayashi ................. | 333/204 |
| 7,012,481 B2 * | 3/2006 | Maekawa et al. ............ | 333/134 |
| 7,364,672 B2 * | 4/2008 | Koes et al. ................... | 252/500 |
| 2002/0158305 A1 | 10/2002 | Dalmia et al. | |
| 2002/0195270 A1 | 12/2002 | Okubora et al. | |
| 2004/0000425 A1 | 1/2004 | White et al. | |
| 2004/0034489 A1 | 2/2004 | Ogino et al. | |

FOREIGN PATENT DOCUMENTS

| | | |
|---|---|---|
| JP | 637512 | 2/1994 |
| JP | 08070201 A | 3/1996 |
| JP | 10224108 A | 8/1998 |
| JP | 2001292002 A | 10/2001 |
| JP | 2002271109 A | 9/2002 |
| JP | 200387007 | 3/2003 |
| JP | 2003198226 | 7/2003 |
| WO | WO 0195679 | 12/2001 |

* cited by examiner

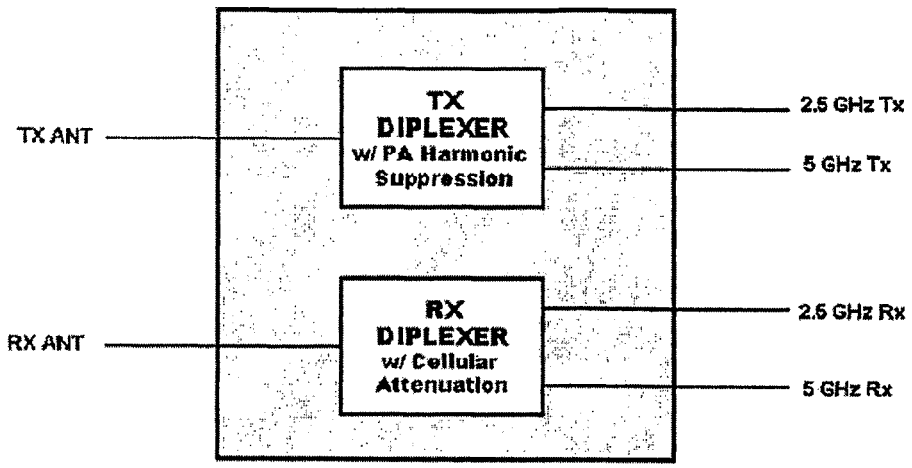
| | |
|---|---|
| 1 | Receive Antenna |
| 2 | Receive 2.4 GHz |
| 3 | Transmit 5 GHz |
| 4 | Transmit Antenna |
| 5 | Transmit 2.4 GHz |
| 6 | Transmit 5 GHz |
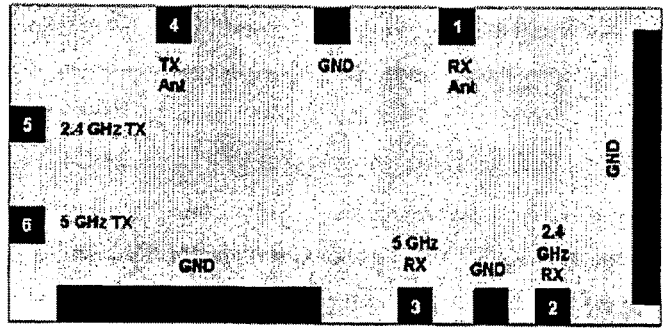
FIG. 31

LIQUID CRYSTALLINE POLYMER AND MULTILAYER POLYMER-BASED PASSIVE SIGNAL PROCESSING COMPONENTS FOR RF/WIRELESS MULTI-BAND APPLICATIONS

CROSS-REFERENCE TO RELATED APPLICATIONS

This application is a national stage of PCT/US2005/006006, filed on Feb. 23, 2005, and entitled "Liquid Crystalline Polymer and Multilayer Polymer-Based Passive Signal Processing Components for Multi-Band Applications." This application also claims the benefit of U.S. Provisional Application No. 60/546,998, filed Feb. 23, 2004, and entitled "Liquid Crystalline Polymer-Based R/F Wireless Components for Multi-band Applications," which is incorporated herein by reference.

CROSS REFERENCE TO RELATED APPLICATION

This application claims the priority benefit of PCT/US2005/006006 filed on Feb. 23, 2005.

BACKGROUND OF THE INVENTION

I. Field of the Invention

The present invention generally relates to integrated passive devices fabricated utilizing organic laminates.

II. Description of Related Art

In recent times, voice communication has become just one of the myriad purposes for the transfer of radio Frequency ("RF") data. An increasing number of bands, size reduction, integration, and refinements in design and fabrication technology have made it possible to pack more functionality into computing devices such as handhelds, gaming systems, broadcast units, global positioning units, satellite TV, last mile access, and radar units. It is becoming a reality that the market will soon demand cellular handsets with undropped calls over long coverage areas worldwide (using for, example, quadband GSM, WCDMA, TCDMA), that also are able to receive real-time entertainment from broadcast and satellite units, navigate using positioning systems, and connect seamlessly to the internet and local clients such as printers and scanners. In this scenario a single handheld, PDA or client such as laptop would have the following standards integrated (or comparable standards thereto): IEEE 802.11a/b/g WLAN (wireless local area network), LMDS/MMDS (local multipoint distribution system), satellite/digital TV (digital broadcasting service), UWB (ultra wideband), GPS (global positioning system) cellular and Bluetooth.

One of the initiatives to achieve such levels of performance, computing and connectivity was the integration of passive devices such as inductors, capacitors and resistors. Passive devices account for 75-85% of all components used in a cellular phone today. In comparison, only 15-25% of the components are active devices. Passive devices such as inductors, capacitors and transmission lines are combined to form filters, diplexer, multiplexers, duplexers, baluns, and couplers, which are utilized in multi-band RF systems. Thus, the size of these devices is very important to the viability of these multi-functional devices.

Currently, low-temperature co-fired ceramic (LTCC), multilayer ceramic (MLC), ceramic monoblock technologies, surface acoustic wave (SAW), and field bulk acoustic resonator (FBAR) are the prevalent technologies for the implementation of surface mount components such as front-end RF passive band pass filters, duplexers, multiplexers, couplers, and baluns. LTCC is a widely used ceramic technology because it uses miniature lumped components such as inductors and capacitors that can be optimized for operation over a wide band of frequencies, whereas monoblock, SAW, FBAR and MLC components use different materials for different frequencies and limits the integration of devices for multiband applications, which are required for different functions. Additionally, with the ability to integrate in excess of 20 layers, LTCC has become a desirable platform for the integration of front-end modules for multiband applications that combine several lumped element filters, baluns, couplers, multiplexers, matching circuits and diplexers for integrated multi-band, multi-standard applications.

It is typical for LTCC front-end modules to comprise more than 10-15 metal metallic layers with microvias connecting each layer, and in many instances also include SAW and FBAR filters mounted on the multiple ceramic layers to meet the more stringent requirements of bandpass filters. The need for many layers to provide the needed density translates to more design time and higher tooling cost and problems of shrinkage and performance issues. In addition, increases in density have been slow, and has not reached further than 75 components/cm$^2$. To meet current density requirements, discrete components are mounted on the top surface of LTCC modules as discrete components. Besides the need for discretes to achieve the desired density or using thin film based devices, such modules have to be mounted on a printed circuit board (PCB). Further, LTCC also generally suffers from higher costs since it generally cannot be manufactured in panel sizes larger than 6x6 square inches. Moreover, LTCC generally has relatively low performance due to process tolerances and relatively high dielectric losses (e.g., tan $\delta$=0.005-0.007 at 1 GHz).

Thus, there is an unsatisfied need in the industry for a high frequency, low loss, inexpensive filters, baluns, and diplexers having a relatively small footprint for multi-band, multi standard applications.

SUMMARY OF THE INVENTION

In accordance with an embodiment of the present invention, a signal processing module for wireless applications includes a liquid crystal polymer (LCP) layer having a first surface and a second surface opposite the first surface, a first patterned metal layer on the first surface of the LCP layer, a second metal patterned metal layer on the second surface of the LCP layer, where the first and second metal layers are patterned to form integrated components such that the first and second metal layers interact with one another to form a first resonator and a second resonator, a first prepreg layer on the first metal layer opposite the LCP layer and a second prepreg layer on the second metal layer opposite the LCP layer, and a first laminate layer on the first prepreg layer opposite the first metal layer, and a second laminate layer on the second prepreg layer opposite the second metal layer.

According to an aspect of the present invention, the first resonator of the signal processing module includes a first inductor formed in the first patterned metal layer and a second inductor formed in the second patterned metal layer, where the first inductor is connected by a first microvia to the second inductor. According to another aspect of the present invention, the first resonator is magnetically coupled to the second resonator. According to another aspect of the present invention, the signal processing module also includes a third resonator formed in the first and second metal layers and electrically connecting the first resonator to the second resonator, where the third resonator provides a primary attenuation zero in a stopband. According to another aspect of the present invention, the first and second resonators include transmission line resonators. According to another aspect of the present invention, the first and second resonators include one or more of co-planar waveguide, stripline, and microstrip topologies. According to another aspect of the present invention, the signal processing module also includes a third metal layer on a first surface of the first laminate layer and patterned to form a first capacitor plate, and a fourth metal layer on a second surface of the first laminate layer opposite the first surface and patterned to form a second capacitor plate, wherein the first capacitor plate and second capacitor plate form a parallel plate capacitor. According to another aspect of the present invention, the signal processing module also includes a first shielding layer on the first laminate layer opposite the first prepreg layer and a second shielding layer on the second laminate layer opposite the second prepreg layer. According to yet another aspect of the present invention, the integrated components of the signal processing module include at least one of capacitors and inductors.

According to another embodiment of the present invention, a diplexer for a multi-band wireless application includes a liquid crystal polymer (LCP) layer having a first surface and a second surface opposite the first surface, a first patterned metal layer on the first surface of the LCP layer, a second metal patterned metal layer on the second surface of the LCP layer, where the first and second metal layers are patterned to form integrated components such that the first and second metal layers interact with one another to form a first filter and a second filter connected by a common port, a first prepreg layer on the first metal layer opposite the LCP layer, and a second prepreg layer on the second metal layer opposite the LCP layer, and a first laminate layer on the first prepreg layer opposite the first metal layer, and a second laminate layer on the second prepreg layer opposite the second metal layer.

According to an aspect of the present invention, the first filter of the diplexer includes a first inductor formed in the first patterned metal layer and a second inductor formed in the second metal layer, where the first inductor is connected by a first microvia to the second inductor. According to another aspect of the present invention, the first and second metal layers of the diplexer include one or more of co-planar waveguide, stripline, and microstrip topologies. According to another aspect of the present invention, the diplexer also includes a third metal layer on a first surface of the first laminate layer and patterned to form a first capacitor plate, and a fourth metal layer on a second surface of the first laminate layer opposite the first surface and patterned to form a second capacitor plate, wherein the first capacitor plate and second capacitor plate form a parallel plate capacitor. According to another aspect of the present invention, the diplexer also includes a first shielding layer on the first laminate layer opposite the first prepreg layer and a second shielding layer on the second laminate layer opposite the second prepreg layer. According to another aspect of the present invention, the integrated components of the diplexer include at least one of capacitors and inductors.

According to another embodiment of the present invention, a balun for a wireless application includes a high K organic layer having a first surface and a second surface opposite the first surface, a first patterned metal layer on the first surface of the LCP layer, a second patterned metal layer on the second surface of the LCP layer, wherein the first and second metal layers are patterned to form integrated components such that the first and second metal layers interact with one another to form a first passive device and a second passive device, a first prepreg layer on the first metal layer opposite the LCP layer, and a second prepreg layer on the second metal layer opposite the LCP layer, and a first outer organic layer on the first prepreg layer opposite the first metal layer, and a second outer organic layer on the second prepreg layer opposite the second metal layer.

According to an aspect of the present invention, the first outer organic layer of the balun includes one of a laminate layer, LCP layer, or high K organic layer. According to another aspect of the present invention, the first metal layer of the balun is patterned to form a first capacitor plate and the second metal layer is patterned to form a second capacitor plate, and further includes a third metal layer on the first outer organic layer patterned to for a third capacitor plate, and wherein the first, second and third capacitor plates form a capacitor. According to another aspect of the present invention, the integrated components of the balun include at least one of capacitors and inductors. According to yet another aspect of the present invention, the balun also includes a first shielding layer on the first outer organic layer opposite the first prepreg layer and a second shielding layer on the second outer organic layer opposite the second prepreg layer.

According to yet another embodiment of the present invention, a signal processing module for multi-band wireless applications includes a first liquid crystal polymer (LCP) layer having a first surface and a second surface opposite the first surface, a first patterned metal layer on the first surface of the first LCP layer, a second patterned metal layer on the second surface of the first LCP layer, wherein the first and second metal layers are patterned to form integrated components such that the first and second metal layers interact with one another to form at least a first filter and a second filter connected by a common port, a second LCP layer having a first surface and a second surface opposite the first surface, a third patterned metal layer on the first surface of the second LCP layer, a fourth patterned metal layer on the second surface of the second LCP layer, wherein the third and fourth metal layers are patterned to form integrated components such that the third and fourth metal layers interact with one another to form at least a first filter and a second filter connected by a common port, a first prepreg layer disposed between the first and second LCP layers, a second prepreg layer on the second metal layer opposite the first LCP layer, and a third prepreg layer on the third metal layer opposite the second LCP layer, and a first outer organic layer on the second prepreg layer opposite the second metal layer, and a second outer organic layer on the third prepreg layer opposite the third metal layer.

According to an aspect of the present invention, the module also includes a first shielding layer on the first outer organic layer opposite the second prepreg layer and a second shielding layer on the second outer organic layer opposite the third prepreg layer. According to another aspect of the present invention, the first outer organic layer of the module includes one of a laminate layer, LCP layer or high K organic layer. According to another aspect of the present invention, the module also includes a first RCF layer on first outer organic layer opposite the second prepreg layer, and a second RCF layer on the second outer organic layer opposite the third prepreg layer.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 7 is an X-ray from a top plan view of an organic bandpass filter in accordance with an embodiment of the present invention.

FIG. 13 is a graphical representation of a model to hardware correlation for the organic dielectric filter in FIG. 12.

FIG. 31 illustrates an integrated device with multiple integrated passive devices according to an embodiment of the present invention.

DETAILED DESCRIPTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The operation of a filter in accordance with the present invention is explained below with reference to the bandpass filter 10 of FIG. 1A. However, it will be appreciated by those of ordinary skill in the art that the teachings of the present invention readily apply to other integrated passive devices. Accordingly, the scope of the present invention is not limited to bandpass filters, but is inclusive of other devices such as but not limited to diplexer, duplexer, multiplexer, baluns, power combiner, band-stop/band elimination filter and power divider low-pass filter and high-pass filter.

Figure 1A:
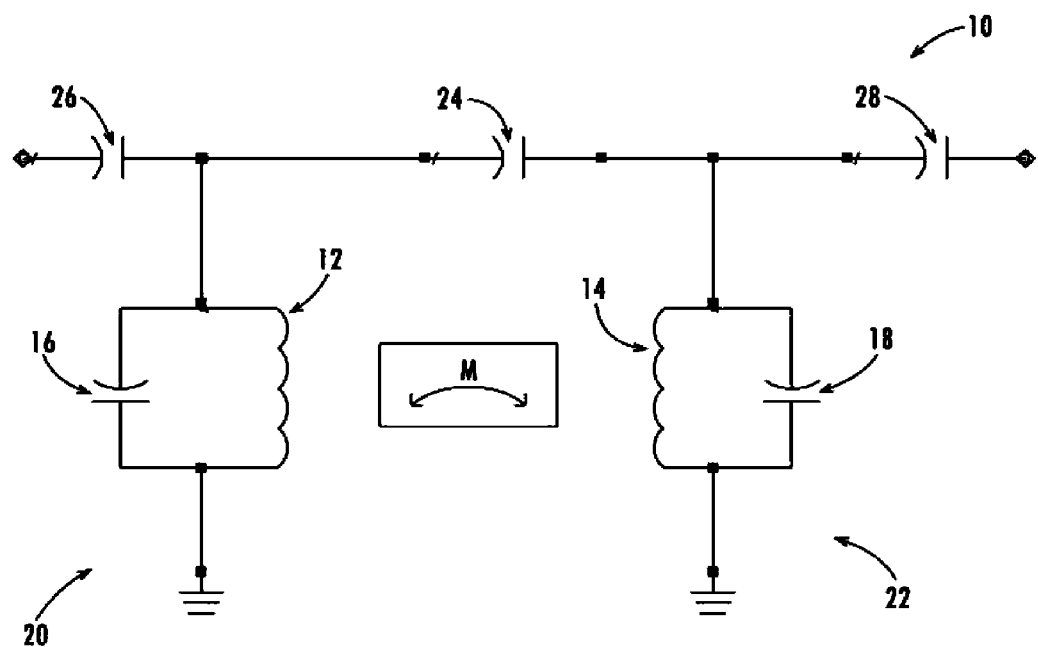
FIG. 1A is a first equivalent circuit diagram for explaining the operation of the dielectric filters shown in FIGS. 2, 3 and 4.

With reference to the figures, FIG. 1A is an equivalent circuit diagram of a dielectric bandpass filter 10 in accordance with the present invention. In FIG. 1A, inductors 12, 14 cooperate with their corresponding capacitor 16, 18, respectively, to form resonators 20, 22, respectively. The inductors 12, 14 correspond to the stripline or CPW/strip-line or CPW/microstrip inductors discussed below with reference to FIGS. 2-4. The capacitors 16 and 18, respectively, correspond to the capacitors formed on the same layer as inductors 12 and 14 or by using discrete capacitors. The capacitor 24 corresponds to the capacitor formed for the purposes of inter-resonator coupling. In FIG. 1A, capacitors 26 and 28, respectively, provide matching to the desired impedances at the input and output. In addition, M is the magnetic coupling between the inductors 12 and 14. The inductances of inductors 12 and 14 could also represent equivalent inductance components of the resonators, and capacitances of capacitors 16 and 18 could represent capacitance components of the resonators. While the circuit topology shown in FIG. 1A depicts one embodiment of a two pole filter, and an additional pole can be attained by the mutual inductance between inductors 12, 14 and the capacitor 24. In addition, resonators may be added with the required coupling elements by adding more inductors and capacitors in various configurations to achieve transfer characteristics that emulate such responses as first order, second order to nth order butterworth, chebychev, elliptic, blinkoff, symmetric, asymmetric, notch added filters using topologies such as nodal capacitor coupled, nodal-inductor coupled, shunt-input geometry, input geometry or mesh capacitor coupled.

The stopband characteristics of a filter is a prime factor in determining the isolation between the transmitting and receiving paths in duplexer designs. It is well known that the stopband rejection may be enhanced, either by increasing the number of resonators as mentioned earlier, or by adding transmission zeros.

Figure 1B:
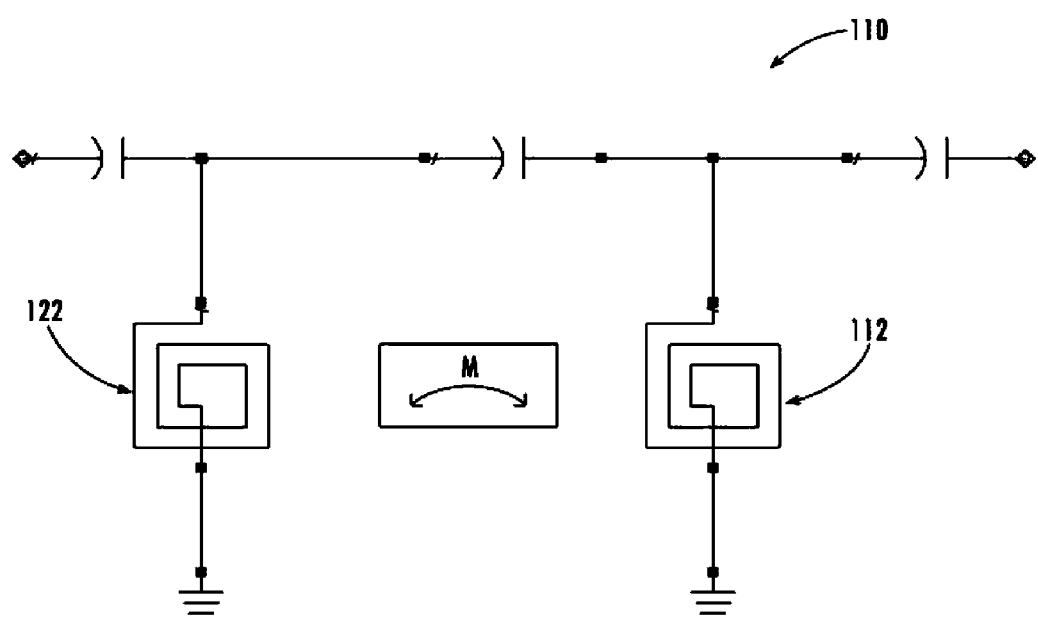
FIG. 1B is a second equivalent circuit diagram for explaining the operation of the dielectric filter of FIG. 1A using transmission lines or inductor resonator elements.

FIG. 1B is an alternative equivalent circuit diagram 10 of a dielectric filter using transmission lines or inductor resonator elements, wherein the inductors 112 resonate at a desired center frequency. The physical parameters of the circuit 110, such as the number of turns, length of conductor, outer and inner diameter, can be altered to resonate the inductor 112 at the desired frequency. This reduces the number of components required to achieve a filtering function by removing the need for capacitors of the resonators. However, a disadvantage is the increase in length of the metallization to increase the capacitance, though the increased inductance could increase loss in the circuit. If the inductor element becomes too large or too lossy, then it may be desirable to use an alternative circuit design, such as that illustrated in FIG. 1A. It should be noted that in the circuits of FIG. 1A and FIG. 1B, the coupling between the components can be achieved by magnetic coupling, electric coupling or a combination thereof.

Illustrative physical layouts of dielectric filters in accordance with the equivalent circuit diagram of FIG. 1A are depicted in FIGS. 2-4. The dielectric filters of FIGS. 2-4 have a two-pole structure and an additional pole attained by the mutual inductance and the capacitor 24 according to the equivalent circuit diagram shown in FIG. 1A.

Figure 2A:
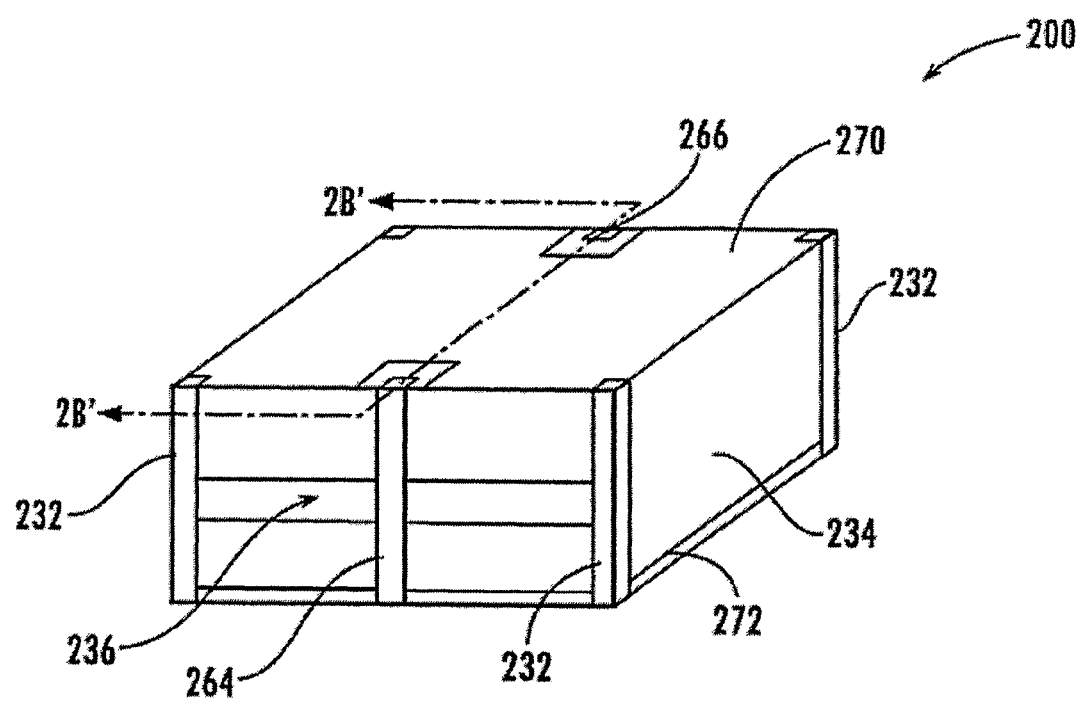
FIGS. 2A-2C show several views of a first organic dielectric filter according to an embodiment of the present invention.
Figure 2B:
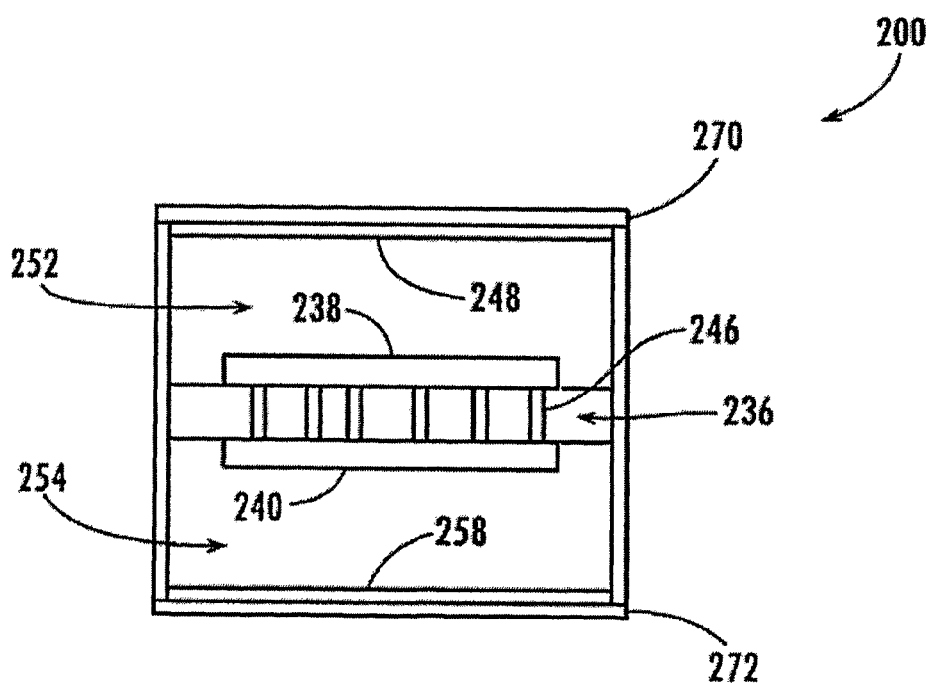
Figure 2C:
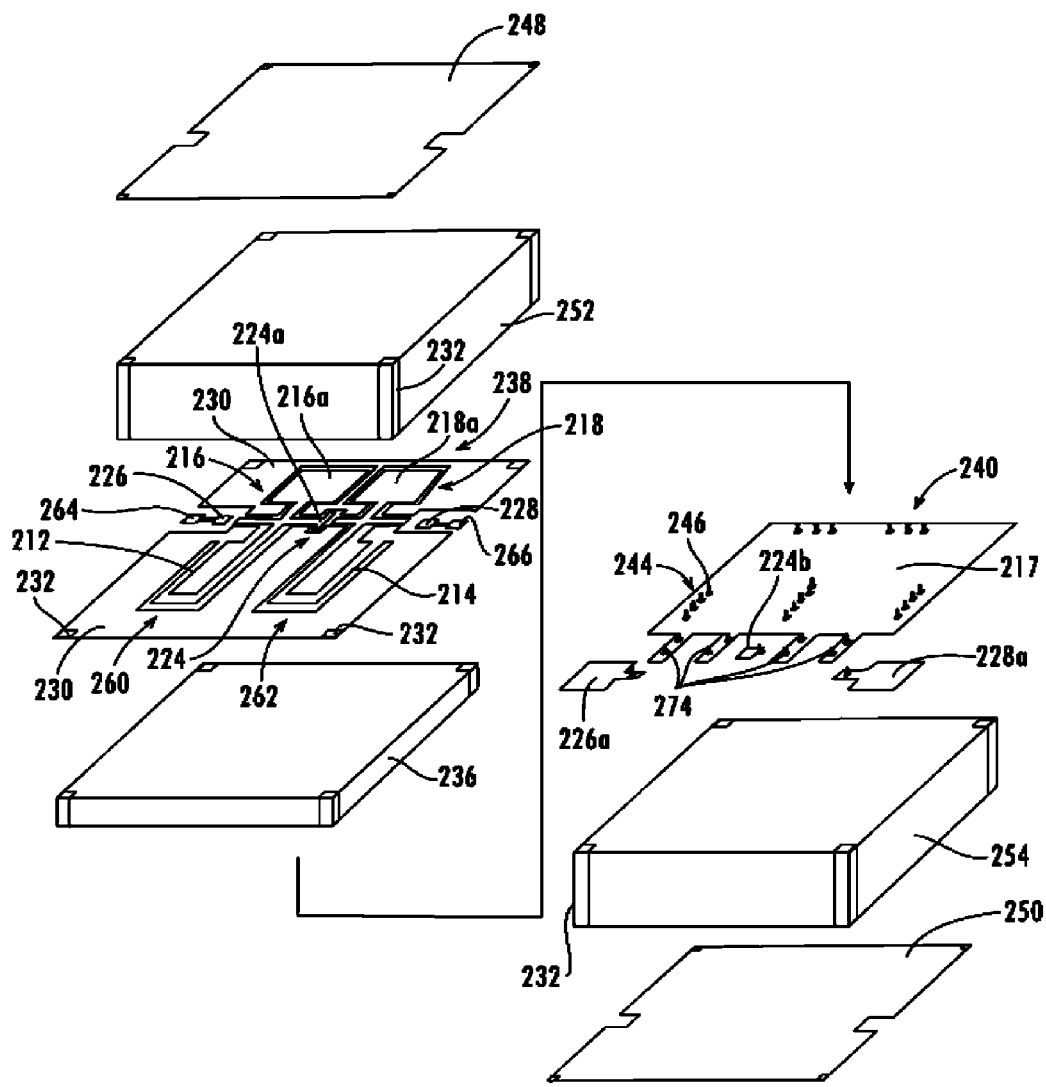

With general reference to FIGS. 2A-2C, illustrated is a surface mounted device (SMD) embodiment of the filter illustrated by the circuit of FIG. 1A in accordance with the present invention. Specifically, the organic bandpass filter 200 comprises inductors 212 and 214, which are meandering inductors formed close to each other on an organic dielectric layer 236 (which can be a thin laminate such as LCP or PPE, but is not limited to these) and is preferably configured as either a shorted hybrid CPW-stripline (where lines that form meandering inductors 212 and 214 are connected to a coplanar ground, that is, in-built shielding 230), or a stripline in the presence of coplanar in-built shielding 230 and additional grounds 248 and 250 that are connected to the plated through holes 232 and/or external shield electrodes 234.

Since these inductors are very close to each other, the magnetic coupling between these filters, represented by M in FIG. 1A, can increase the pass bandwidth of the filter, thereby decreasing its performance. However, an inter-resonator parallel plate coupling capacitor 224, (with or without the coplanar in-built shielding 230) formed using two disconnected metal plates (one plate formed using patterning conductive layer 238 and the other plate formed using patterned conductive layer 240) and shown as capacitor plates 224a, 224b is provided. The capacitor plates 224a, 224b sandwich the first organic dielectric layer 236 in such a manner that the each plate of the inter-resonator coupling capacitor electrode is connected to separate resonators which helps compensate the effect of the magnetic coupling and helps make very compact filters. The center capacitance can be as small as femptoFarads or as large as picoFarads for achieving the specified bandwidths. The smaller capacitance helps reduce the bandwidth. Additionally, capacitor 224 in parallel with the mutual inductance equivalent gives a pole in the lower band or upper band.

The bottom plate formed by the conductive layer 240 connects to inductor 212 using one or more microvias in the organic dielectric layer 236, such as the vias 244 with pads 246 for landing and capturing the via. First and second shield electrodes 248, 250 formed respectively on the organic core layers 252, 254, wherein the core layer 252 and 254 are disposed so as to sandwich the organic dielectric layer 236 there between. A first resonator 260 formed by inductor 212 and capacitor 216 and a second resonator 262 formed by inductor 214 and capacitor 218 are electrically coupled to each other through the parallel plate capacitor 224, whereby an inter-resonator coupling is effected in combination with said magnetic coupling and electric coupling.

In a dielectric filter according to the present invention, where the inductors do not provide the needed capacitance in the desired length, the inductors 212, 214 can be connected in similar fashion as the capacitor 224 to separate grounded/shunted parallel plates 216a and 218a, respectively, of capacitors 216 and 218, respectively, using the same first organic dielectric layer 236 as the sandwiched dielectric, which then together form the resonator pairs 260, 262.

The equivalent inductance L obtained with one of the meander inductors, 212, 214, and the equivalent capacitance C due to one of the capacitors 216, 218, resonates approximately at frequency Fo, the center frequency of the filter, as defined by Equation (1) below:

$$\text{whereby } F_o \sim \sqrt{1/(LC)} \quad (1)$$

The capacitor plates 216a and 218a have a corresponding ground plate 217 on the opposite surface of the organic dielectric layer 236. Having a common plate does cause coupling between the capacitors which has to be accounted for during the design by including it as the mutual inductance between the parasitic inductance of each capacitor 216, 218. This coupling can be used to achieve further poles; however if the coupling causes problems in the passband during the synthesis stage it could be reduced by either dividing plate 217 into separate plates or by adding several vias on pads 274 that connect plate 217 to in-built shielding 230 on the side of the inductors 212 and 214, thereby helping excess currents to sink and thereby reducing coupling between components.

In addition, parallel plate/interdigital capacitors 226 and 228, can be used on either side of the first and last resonator elements 260, 262 at the input and output terminals of the device for impedance matching purposes. Alternatively, inductors or transmission lines or a combination of capacitor(s), inductor(s) and transmission line(s) can be utilized, as desired. If capacitors 226, 228 are used for matching purposes, it follows the center capacitance is that of capacitor 224 in terms of the nominal capacitances required, that is, the capacitance from capacitor 226 and capacitor 228 are proportional to capacitor 224.

A dielectric filter according to the embodiment of the present invention illustrated in FIGS. 2A-2C can comprise at least two external shield electrodes 234 respectively formed on different side surfaces of the laminated structure, which comprises at least the organic dielectric layer 252, 236, 254, and that are connected to the shield electrodes 248 and 250. This may or may not be desired for shielding purposes in a CPW topology, wherein the use of plated through holes 232 on the four corners is sufficient. Utilizing the plated through holes 232 may save additional room required for the external shield electrodes 234 and also may save the processing cost involved. However, in stripline and microstrip filter topologies, plated through holes 232 and external shield electrodes 234 together provide the connection for the shorted inductors/resonators and capacitors at any point along the respective sides. Alternatively, the CPW topology with coplanar in-built shielding 230 on the same plane of the first dielectric layer provides the shielding internally, and provides for the ground connectivity to the resonators/inductors and capacitors. However, in general, in more noisy environments it may be preferred to also have the external ground electrodes.

The dielectric filter 200 also comprises an external input terminal electrode 264 and an external output terminal electrode 266 which are formed on one side surface of a laminated body comprising at least dielectric sheets 252, 236, 254, and an external ground electrode, (such as shield electrodes 248, 250, through holes 232 or side shield electrodes 234) formed between said external input and output terminal electrodes 264, 266 on one side surface.

The shield electrodes 248 and 250 formed on the dielectric core layers 252 and 254, respectively, are preferably of the shape and patterned to leave room for the landing terminals of input and output terminal electrodes 264 and 266. For purposes of illustrating the present invention, the shield electrodes 248, 250 are shown in FIGS. 2B and 2C, but not 2A.

The first organic dielectric layer 236 can comprise single side copper LCP laminate or the like, such as PPE, N6000, epoxy based N4000-13, or any other suitable low loss dielectric.

The protective layers 270, 272 are formed on shield electrodes 248, 250 opposite dielectric core layers 252, 254, respectively, to protect the structure from environmental affects such as oxidation and also to create a pattern for solder to flow on to the input output terminals 264 and 266 and ground pads formed by plated through holes 232. The protective layers 270, 272 may comprise a solder mask, or in more demanding applications, with higher tolerances, other materials such as prepreg or LCP may be desired. For purposes of illustrating the present invention, the protective layers 270, 272 are shown in FIGS. 2A and 2B, but not 2C.

In the dielectric filter according to the present invention, as illustrated in FIGS. 2A-2C, an initial step to making a connection between devices using vias 244 is done by drilling through holes (as small in diameters as the thickness of the dielectric used) through the LCP layer (or any other appropriate organic dielectric) and copper layer. Then both sides of LCP copper laminate are metallized, such as by electroless or vacuum deposited copper. Copper is then electroplated on both sides of laminate to form the metallized patterns 238, 240 on the organic dielectric layer 236. The copper is then printed and etched to define the key filter components.

In the dielectric filter according to the embodiment illustrated in FIGS. 2A-2C, the dielectric core layers 252, 254 can be laminate LCP or appropriate dielectric with generally larger thickness than the first substrate and aluminum, copper, Molybenum metal (for high power applications) on both sides of filter to a given thickness to encapsulate components. All metals are preferably electroplate and etched and patterned on top and bottom of the device to leave space for signal input and output.

In a dielectric filter according to the embodiment illustrated in FIGS. 2A-2C, the side wall ground shield electrodes 232, 234 can be fabricated, if desired, by single or multiple connected drilled and plated through holes or using a saw cutting device and then connected via electroless or sputter seeded copper in through hole. The copper can be electroplated in the through hole and on the surface. The copper can then be printed and etched to form SMD connection. The process flow for a two layer plus the packaging of the SMD device is explained in greater detail in connection with FIG. 5.

Figure 3A:
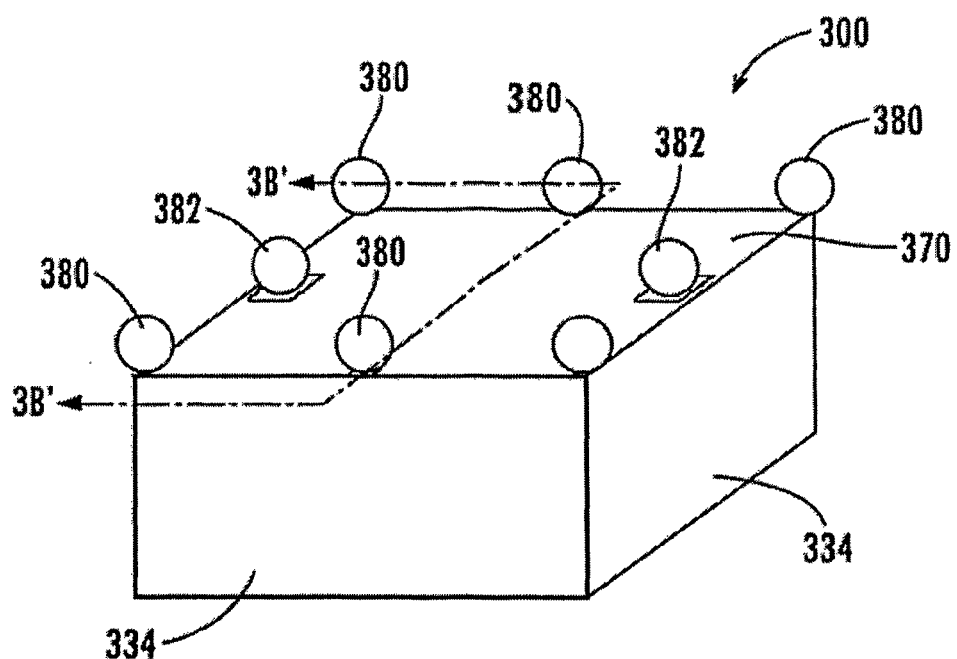
FIGS. 3A-3C show several views of a second organic dielectric filter according to an embodiment of the present invention.
Figure 3B:
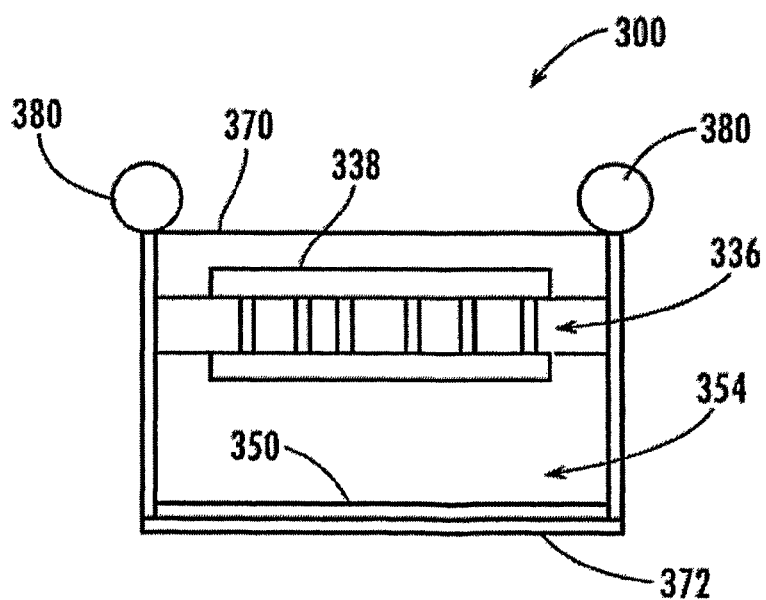
Figure 3C:
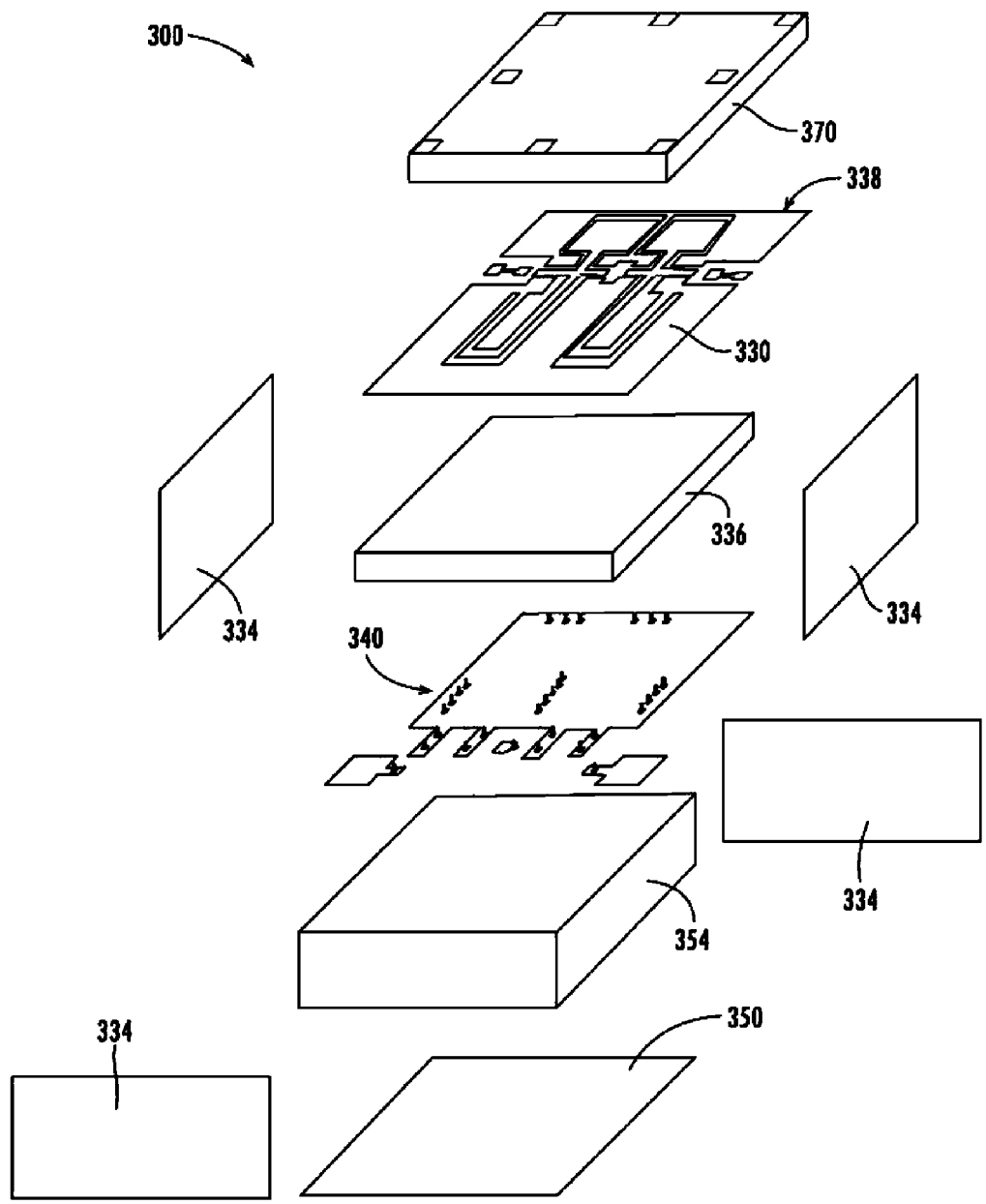

With reference to FIGS. 3A-3C, illustrated, is a BGA/CSP embodiment of an organic bandpass filter 300 in accordance with the present invention. Essentially, all of the internal structure in the filter depicted in FIGS. 2A-2C and FIGS. 3A-3C are similar except the packaging is different, and thereby, the means by which you package it. For example, in FIGS. 3A-3C the thin laminate (e.g., the organic dielectric layer 336) is not packaged between two thick cores, but is packaged with one core layer 354 on one side and a first protective layer 370 on the opposite side substrate 336. The opposite side of the thicker core 354 is metallized to form a shield electrode 350, and a second protective layer 372 is disposed over the shield electrode 350. The protective layers may comprise a solder mask, or in more demanding applications, with higher tolerances, other materials such as prepreg or LCP may be desired.

This packaging of filter 300 renders a microstrip or CPW/microstrip filter device with only shield electrode 350. Instead of using through holes to connect the device input/output and ground terminals, solder balls 380 are utilized. Side wall ground shield electrodes 334 are used to connect the in-built shielding electrodes 330 and shield electrode 350 and, if desired, to solder balls 380.

Alternatively, this could be done by plated through holes, if provided. As discussed above, having both plated through holes 332 and side wall shield electrodes 334 is not typically necessary, and generally they can be utilized in the alternative of one another. For purposes of illustrating the present invention, side wall grounded shield electrodes 334 are shown in FIG. 3A-3C. The solder balls 382 connect the input and output terminals to the bandpass filter. The solder balls and the packaging is constructed using the methodology provided below in connection with FIG. 6. The protective layer 370 (also known as a passivation layer mask, solder mask, bondply layer or low temperature thermoset, thermopolymer material compound to inner laminate) may be utilized to provide openings for the solder balls, as well known in the art.

Figure 4A:
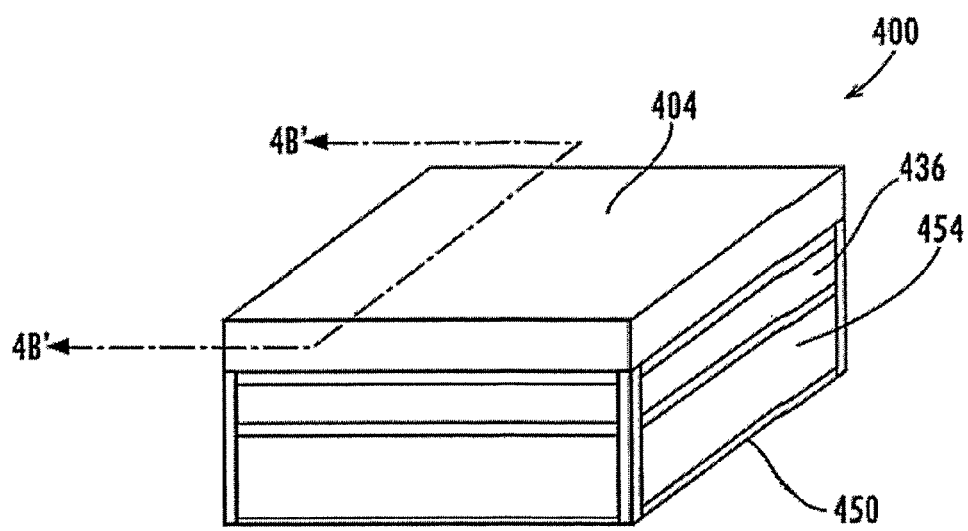
FIGS. 4A-4B show several views of a third organic dielectric filter according to an embodiment of the present invention.
Figure 4B:
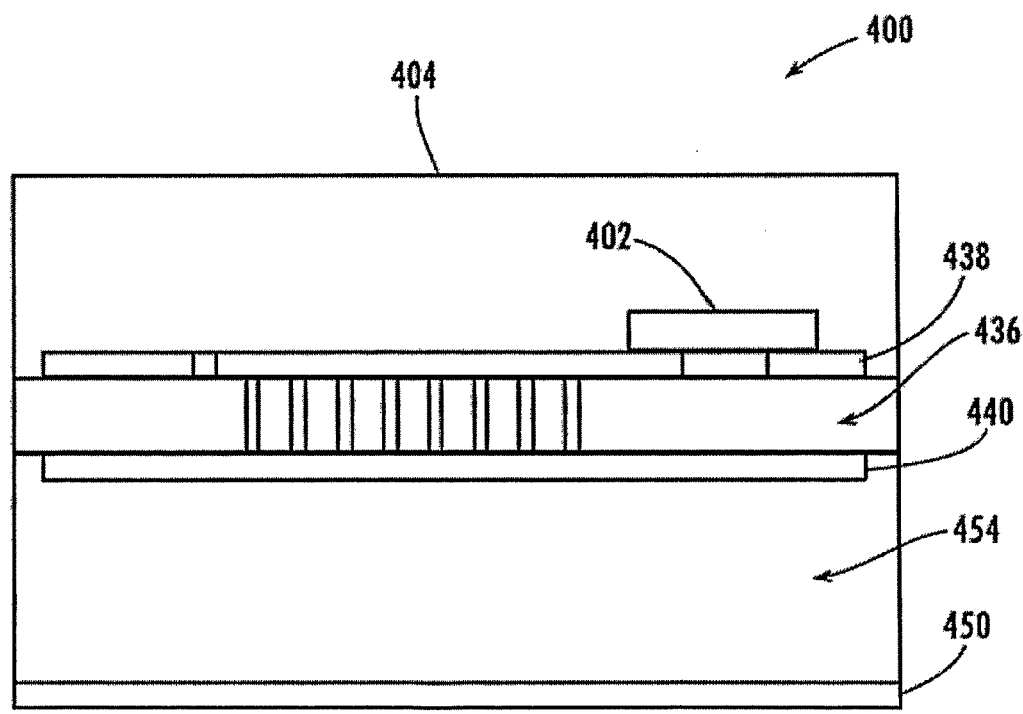

With reference to FIGS. 4A-4B, illustrated is an embodiment of a filter device 400 in accordance with the present invention, which utilizes discrete capacitors 402 and external shielded formed by a metallic case or cap 404. Essentially, all internal structure in FIGS. 2A-2C and FIG. 3A-3C are similar except the packaging is different in the embodiment of FIGS. 4A-4B, and thereby the means by which you package it. For example, in FIGS. 4A-4C, an organic dielectric layer 436 (e.g., a thin laminate substrate) is not packaged between two thick cores, but only one core layer 454 on one side, wherein a shielding electrode 450 is metallized on the opposite side of the core layer 454. On the other side of the organic dielectric layer 436 is a metallic cap 404 with the appropriate height, which is used to provide a second ground reference. The organic dielectric layer 436 is metallized on opposing surfaces by patterned conductive layers 438 and 440, which are electrically connected by at least microvias in layer 436, as discussed with regard to the embodiments of FIGS. 2 and 3. Instead of using a thicker core on both sides of the substrate 436, this embodiment uses a core layer on one side and air as a dielectric on the other. This renders itself into a stripline or CPW/stripline device. Through holes are used to connect only the core metal to the internal metallic structure whereas the metallic cap 404 is connected using solder connections to the relative terminals. The metallic cap 404 can have openings where needed for the input and output terminals. It is important to note that the embodiment is not restricted to using discrete capacitors. The capacitors shown in FIGS. 4A-4B can also be embedded in the substrate, if needed, as discussed previously.

The following are examples of various embodiments of the present invention, wherein each illustrative embodiments discloses several aspects of the invention.

II. Illustrative Methods for Fabricating Stand Alone Filters

Figure 5:
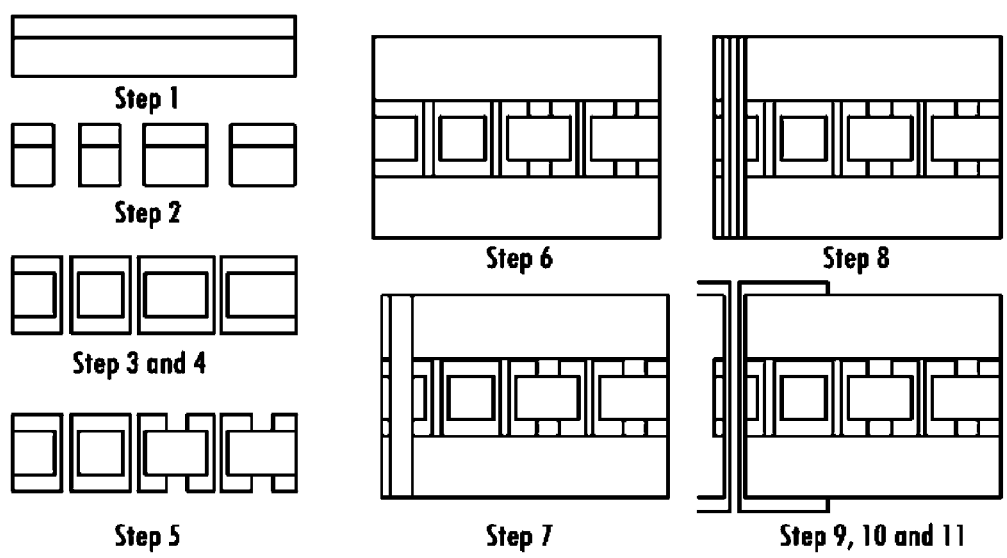
FIG. 5 illustrates a fabrication methodology for an organic dielectric filter according to the present invention, such as the first organic dielectric filter of FIGS. 2A-2C.

An illustrative process for fabricating an LCP based IPD, such as the filter illustrated in FIGS. 2A-2C, configured as a surface mount device (SMD) in accordance with an embodiment of the present invention is now described with reference generally to FIG. 5. Initially, a starting material is selected, which is preferably a reinforced or non-reinforced LCP laminate that can be unclad, or cladded with copper foil on one or both sides of the LCP, as illustrated in Step 1. Alternate materials include other low loss organic laminates like PPE, PTFE composites, hydrocarbon ceramic composites, BT resin composites (e.g., Speedboard C), and thermosets (e.g., Hitachi MCL-LX-67F). Next, through vias are drilled through the LCP or other laminate and the layers of copper, as illustrated in Step 2. These microvias can be drilled with mechanical drilling, laser drilling or other suitable methods known to those skilled in the art.

Steps 3 and 4 involve the metallization of the through vias and laminate. In additive, semi-additive, or subtractive processes starting with unclad or copper clad LCP or other laminates, both sides of the LCP or other laminate and the vias are seeded using electroless plated, vacuum deposited copper or another deposition methods to form a continuous copper film. To achieve the target metal thickness for the device, electrolytic plating is done to build the copper on both sides of the laminate and in the vias in a single step. The circuit definition for the filter component can be done using subtractive, semi-additive or fully additive processes with panel or pattern electroplating of the copper followed by print and etch steps to define the filter circuitry, as illustrated in Step 5.

The fabricated device circuits are then packaged using vacuum or non-vacuum lamination of LCP or alternate laminate materials as detailed above in connection with Step 1, and/or Al, Cu, Mo metal (for high power applications) on both sides of the filter to provide sufficient thickness to encapsulate components, as illustrated in Step 6. The internal and external metal layers are connected, as needed, using plated through holes that can be drilled mechanically or with laser, photo, or plasma processes to provide signal and ground connections and SMD terminals, as illustrated in Step 7. The two edges of the device without the through hole can also slotted using mechanical drill/rout/mill, laser cutting, or sawing processes to provide for additional shielding of the device during subsequent metallization. The drilled through holes and shielding slots are seeded with electroless plated or sputter/vacuum deposited copper to provide a bus layer in substantially the same manner as described above in connection with Step 3, as illustrated in Step 8.

With reference to Steps 9, 10, and 11, the final metal thickness for the outer layers is built up by electroplated copper in the through holes, shielding slots, and on the top and bottom surfaces. Subtractive, semi-additive, or additive processes may be used to define the outerlayer ground circuits and SMD terminals for connection, with print and etch processing of the copper, as described above in connection with Steps 4 and 5. The device is then finished with the addition of terminal metals appropriate for SMD assembly and soldering processes. These finishing metals on the device terminals are common plated metals or alloys like electroless Ni—Au, immersion tin, immersion silver, electroplated Ni—Au, solder (HASL), or organic finishes (OSPs) and the choice depends on the intended application.

The fully fabricated wafer is then singulated into individual filter components. The singulation can be done using high speed dicing saws or alternate methods such as punching or routing/milling. An advantage of this fabrication process is the ability to fully electrical test the components either before or after singulation.

Figure 6:
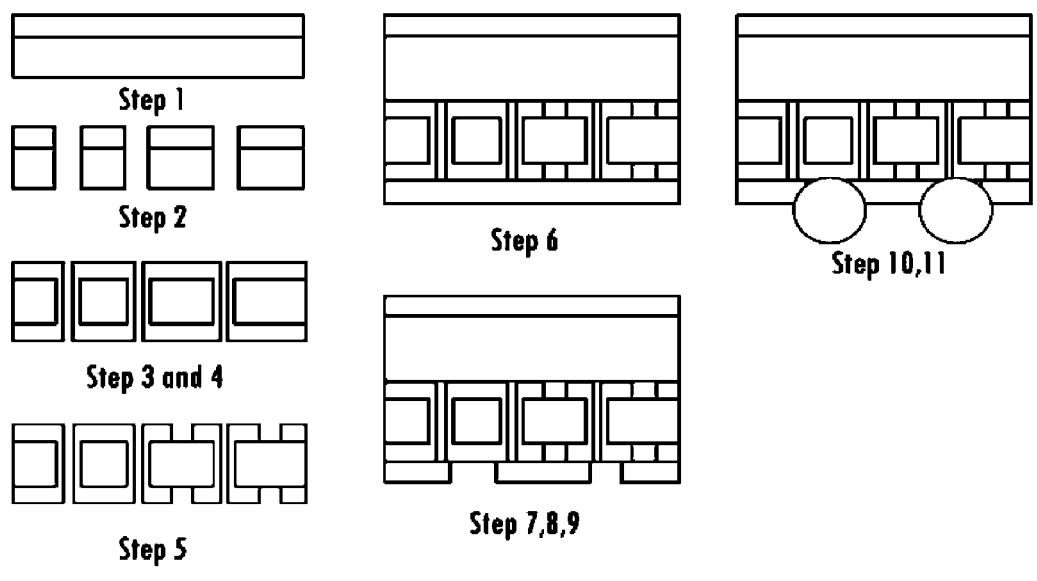
FIG. 6 illustrates a fabrication methodology for an organic dielectric filter according to the present invention, such as the organic dielectric filter of FIGS. 3A-3C.
Figure 1:
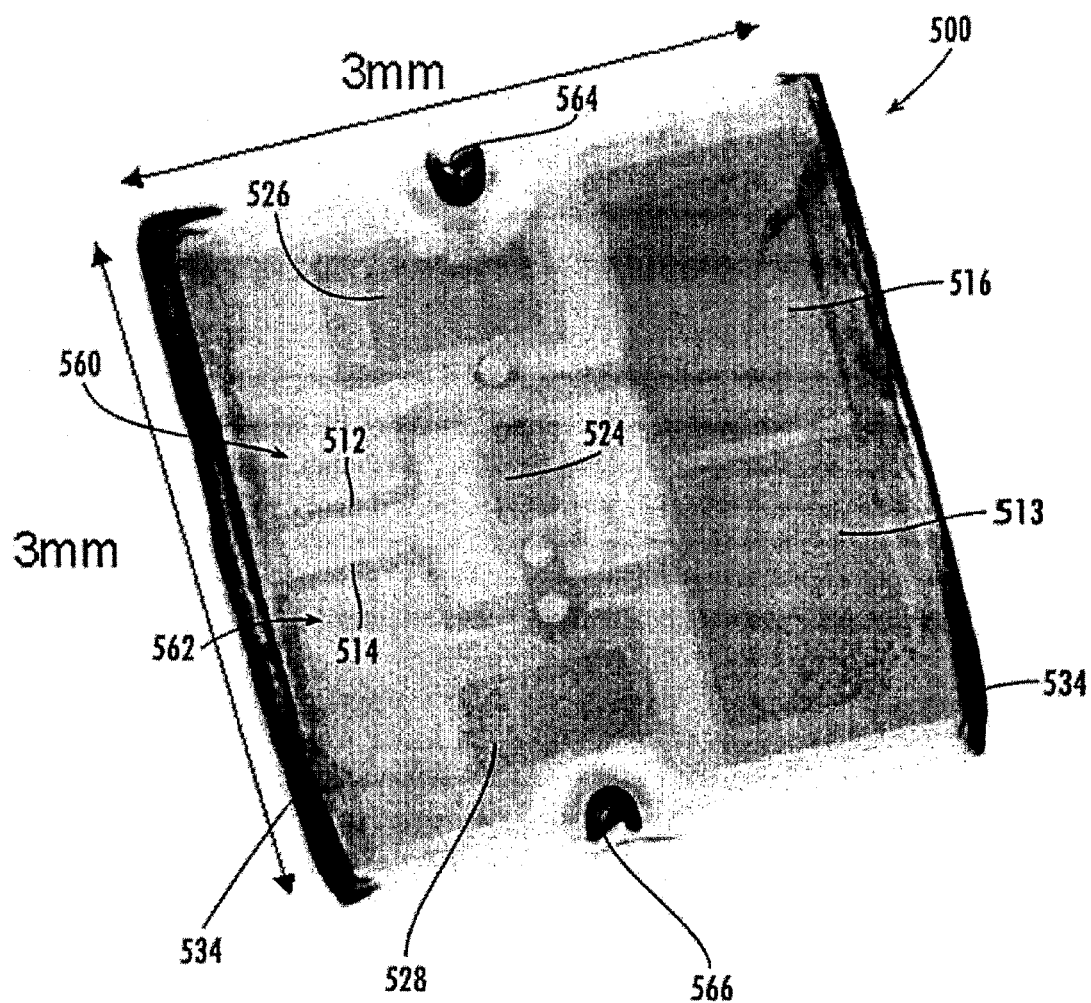

Another illustrative process for fabricating an LCP based IPD, such as the filter illustrated in FIGS. 3A-3C, configured as a ball grid array (BGA) or chip scale package (CSP) in accordance with an embodiment of the present invention is now described with reference generally to FIG. 6. Initially, a starting material is selected, preferably a reinforced or non-reinforced LCP laminate that can be unclad, or cladded with copper foil on one or both sides of the LCP, as illustrated in Step 1. Alternate materials include other low loss organic laminates like PPE, PTFE composites, hydrocarbon ceramic composites, BT resin composites (e.g., Speedboard C), and thermosets (e.g., Hitachi MCL-LX-67F). Next, through vias are drilled through the LCP or other laminate and the layers of copper, as illustrated in Step 2. The microvias can be drilled with mechanical drilling, laser drilling or other suitable methods known to those skilled in the art.

Steps 3 and 4 involve the metallization of the through vias and laminate. In additive, semi-additive, or subtractive processes starting with unclad or copper clad LCP or other laminates, both sides of the LCP or other laminate and the vias are seeded using electroless plated, vacuum deposited copper or other common deposition methods to form a continuous copper film. To achieve the target metal thickness for the device, electrolytic plating is done to build the copper on both sides of the laminate and in the vias in a single step. The circuit definition for the filter component can be done using subtractive, semi-additive or fully additive processes with panel or pattern electroplating of copper followed by print and etch steps to define the filter circuitry, as illustrated in Step 5.

The fabricated device circuits are then packaged using vacuum or non-vacuum lamination of LCP or alternate laminate materials detailed above in connection with Step 1, and/or Al, Cu, Mo metal (for high power applications) on both sides of the filter to a given thickness to encapsulate components, as illustrated in Step 6.

On the other side of the filter component, a cover coat material, liquid photo imagable (LPI), or dry film solder mask is deposited using standard processes such as spin coating, curtain or roller coating, dry film lamination, spray coating and others, as illustrated in Steps 7, 8 and 9. This layer acts as a barrier to solder flow between terminals during subsequent reflow and component assembly. The component terminals are defined by opening windows in the cover coat/soldermask material to open the BGA pads for board level interconnection. This is done with processes such as photolithography or laser ablation. The device is then finished with the addition of terminal metals appropriate for BGA assembly and soldering processes. These finishing metals on the device terminals are common plated metals or alloys like electroless Ni—Au, immersion tin, immersion silver, electroplated Ni—Au, solder (HASL), or organic finishes (OSPs) and the choice depends on the intended application and compatibility with the solder or other alloy used for device-to-module/PWB interconnection.

With general reference to Steps 10, 11, 12, the interconnects are formed in the windows in the manner defined in Step 8 using Pb/Sn solder, or other lead free solders and metal alloys. Processes such as screen or stencil printing of solder paste and reflow, or plating processes can be used to form the bumps for interconnection. The BGA/CSP format of the filter components enables the testing of the components on the large area board prior to singulation. The testing can be done, for example, with probing techniques or using test sockets or fixtures.

The fully fabricated wafer is then singulated into individual filter components. The singulation can be done using high speed dicing saws or alternate methods such as punching or routing/milling. An advantage of this fabrication process is the ability to fully electrical test the components either before or after singulation.

III. Actual Devices

Example I

Figure 8:
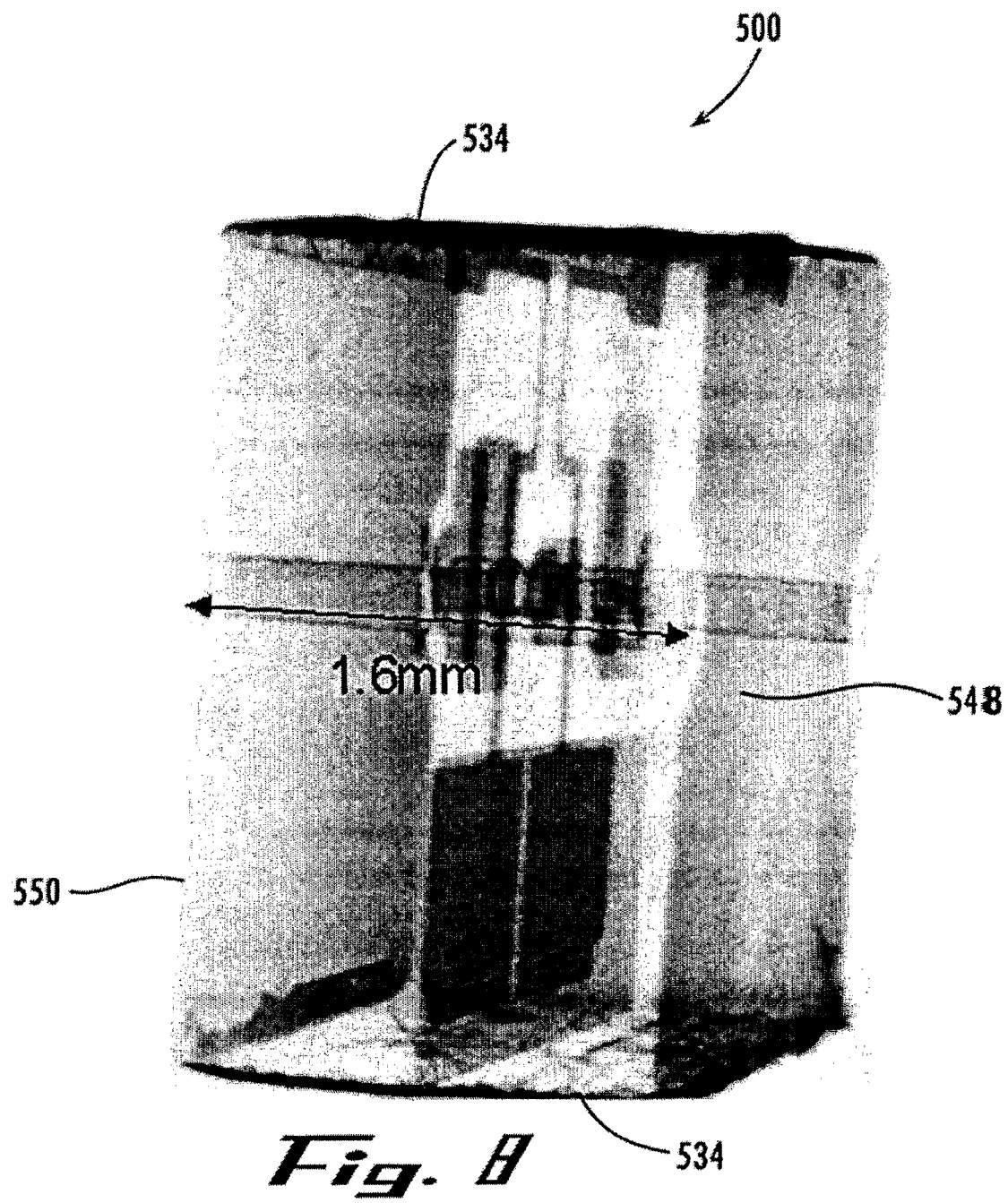
FIG. 8 is an X-ray from a side perspective view of the organic bandpass filter of FIG. 7.

An X-ray photograph of an organic bandpass filter 500 in accordance with an embodiment of the present invention is provided in FIGS. 7 and 8. The filter 500 comprises shorted hybrid CPW-stripline meander transmission line inductors 512, 514 formed close to each other on a first organic dielectric layer, which is a 50 μm thick layer of LCP, wherein the inductors 512, 514 are directly magnetically coupled to each other. Each inductor is connected to separate parallel plate capacitors 516, 518 by sandwiching the same dielectric sheet. An inter-resonator parallel plate coupling capacitor 524, is formed using two disconnected metal plates that sandwich the same organic dielectric sheet in such a manner that the each plate of the inter-resonator coupling capacitor electrode connects to separate inductors. In addition, a second organic dielectric layer and a third organic dielectric layer sandwich the first organic dielectric layer, and comprise a high frequency hydrocarbon material with a thickness of 30-40 mils, which are disposed so as to sandwich said first dielectric sheets there between.

The bandpass filter 500 further comprises an additional dielectric layer, in this case solder mask, provided on an outermost one of the shield electrodes to protect the outermost shield electrodes. The inductors 512, 514 did not provide the needed capacitance in the desired length, and therefore each are connected to a separate grounded/shunted parallel plate using the same first organic layer as the sandwiched dielectric, which then together form the resonator pairs 560, 562, as illustrated. In the illustrated device, parallel plate capacitors 526, 528 are utilized on either side of the first and last resonator elements at the input and output terminals of the device for impedance matching purposes. If greater density is desired multiple thin layers such as the first dielectric layer can be used to form multi (>2) plate capacitors.

The bandpass filter 500 further comprise at two external ground shield electrodes 534 respectively formed on different side surfaces of a laminated body comprising said first through three or more dielectric layers and connected to said shield electrodes. Additionally these provide the connection for the shorted inductors/resonators and capacitors. Moreover, the presence of these external electrodes makes it a CPW/stripline topology, where the reference is on the same first dielectric layer provides the shielding internally, and also provides for the ground connectivity to the resonators/inductors and capacitors.

The bandpass filter further comprises an external input terminal electrode 564 and an external output terminal electrode 566 which are formed on one side surface of a laminated body comprising said first through three or more dielectric sheets. External side wall shield electrodes 534 (FIG. 7) are provided between said external input and output terminal electrodes on the side surfaces of the laminated body and external ground shield electrodes 548 are provided on opposing top and bottom surfaces of the laminated body and are electrically connected to the side wall shield electrodes 534.

The patterning of the external ground shields electrodes 548 on the top and bottom surfaces is required for leaving space for the signal input output as shown in FIGS. 7 and 8.

In the organic bandpass filter 500, the first step to making connection between devices is done by drilling through holes as small as 2 mils with pads as big as three times the size of the via through LCP and copper. Both sides of LCP copper laminate are then metalized via electroless. The copper on both sides of laminate is then electroplated, and the copper layer is printed and etched to define filter component.

The second and third organic dielectric layers are Rogers 4350 from Rogers Corporation with a generally larger thickness than the first organic dielectric layer, such as approximately 35 mils, with copper metal (for high power applications) on both sides of filter to a given thickness to encapsulate components. All metals are electroplate and etched and patterned on top and bottom of the device to leave space for signal input and output.

The side wall grounded shield electrodes 534 can be obtained by single or multiple connected drilled plated through holes and then connected via electroless or sputter seeded copper in through hole. Electroplate copper in through hole and on surface. Print and etch copper to form SMD connection. The copper electrodes may be electroless NiAu plate to prevent excess oxidation.

Figure 9:
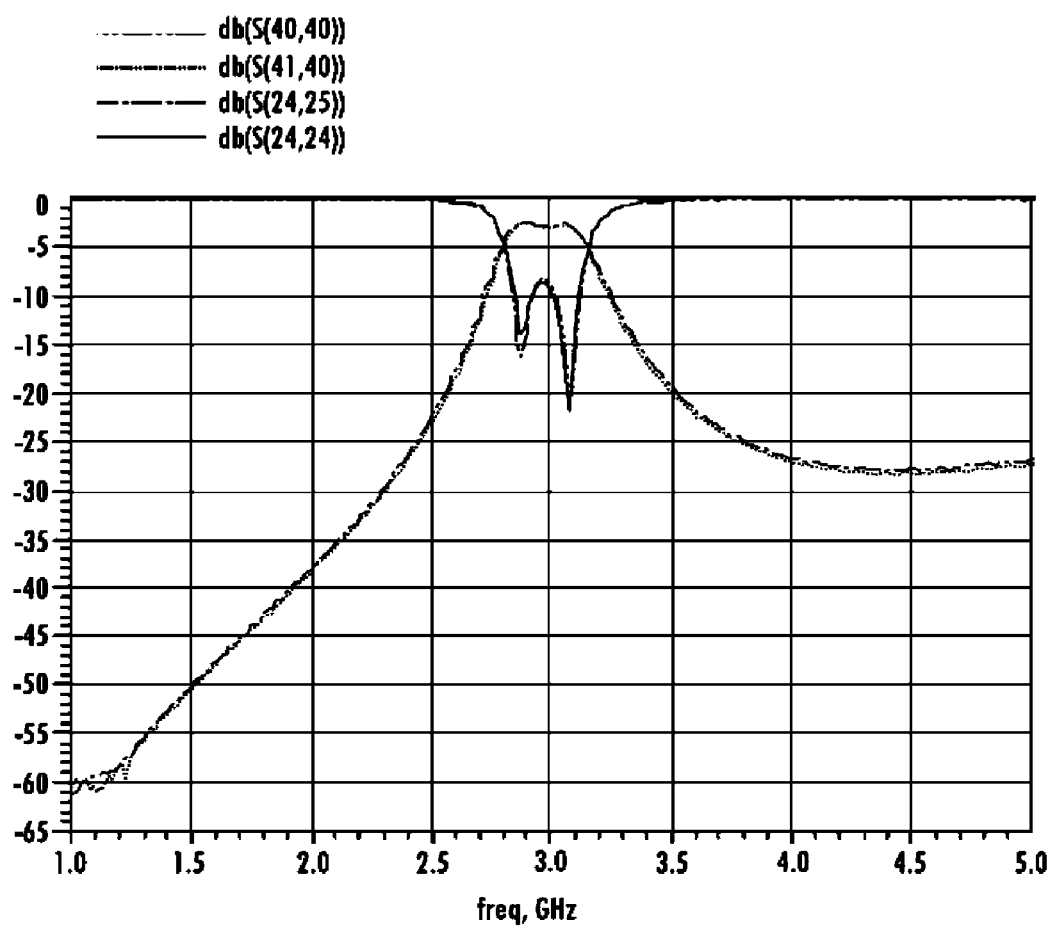
FIG. 9 is a graphical representation of a model to hardware correlation for the organic bandpass filter of FIG. 7.

FIG. 9 shows model to hardware correlation for the organic bandpass filter 500 in FIGS. 7 and 8. The filter was measured using an HP 8720ES Vector Network Analyzer after performing a SOLT calibration. The measured data for the fabricated filter and simulated data is shown. As evident from FIG. 9, there is excellent correlation between measured data and simulated data. The organic bandpass filter 500 was fabricated using LCP for the first organic dielectric layer, and shows an insertion loss of only 1.88 dB at 3 GHz and a 1 dB bandwidth of 200 MHz. Such a filter would be suitable for IF frequency use in fixed wireless type receivers where the carriers frequency of the incoming signal is approximately 14 GHz and has to be down-converted to several lower frequency signals.

The organic bandpass filter 500 utilizes a CPW/stripline topology with only two metallization levels and all embedded passives in an organic substrate, which resulted in better performance than non-standardized multilayer (>5) ceramic processes, as seen in FIG. 9.

It is worth noting that while the Q of the capacitors for filter 500 was measured as high as 200 at 3 GHz using LCP, the Q for the inductor was kept at the required level of approximately 100 at 3 GHz. This was done to understand the advantages of using a material such as LCP without optimizing the design for the inductors. However, Qs exceeding 200 are also attainable for inductors on organic substrates. A resimulation for the filter circuit shown, but with Qs of 200 for the inductors, showed an insertion loss of 1.15 dB when simulated. A filter with a loss of 1.15 dB at the frequency and bandwidth can be alternatively achieved only by using the bulkier and costlier ceramic cavity and monoblock filters.

Example II

Figure 10:
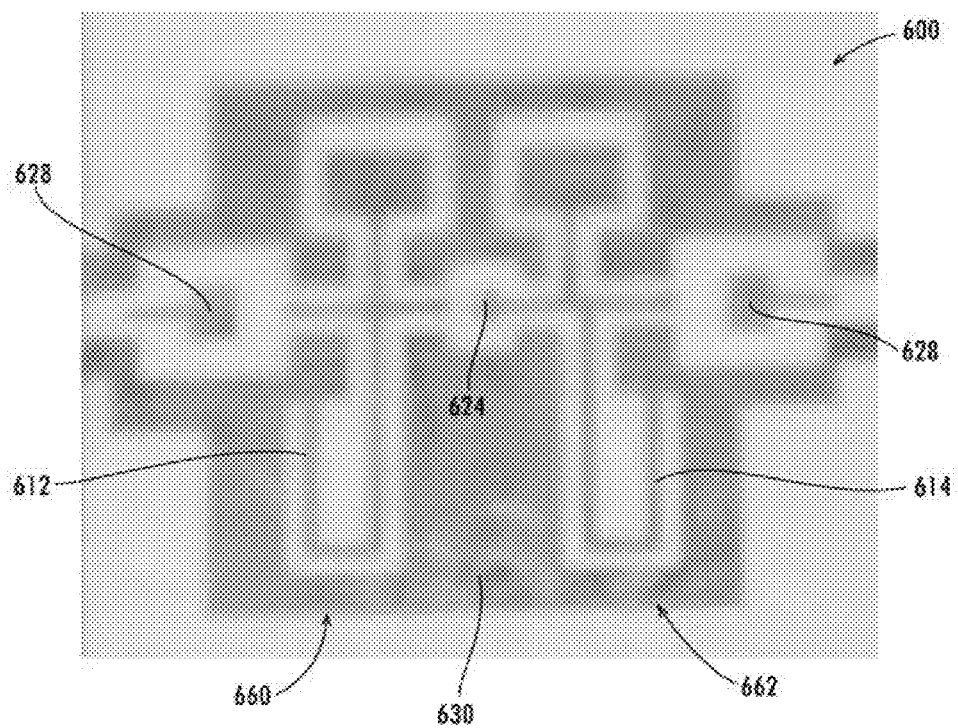
FIG. 10 is a picture from a top plan view of a BGA style organic filter, in accordance with an embodiment of the present invention.

Another organic bandpass filter 600 in accordance with an embodiment of the present invention is shown in the picture of FIG. 10. The filter 600 comprises shorted hybrid CPW-microstrip, meander inductors 612, 614 formed close to each other on a first organic dielectric layer, which is a layer of LCP, directly magnetically coupled to each other. The term "shorted" refers to one end of each inductor connected to the large metallic area, which in this case serves as the in-built shield 630 (also referred to as a coplanar ground ring). In addition, the filter 600 includes an inter-resonator parallel plate coupling capacitor electrode 624 with in-built shield 630 formed using two disconnected metal plates that sandwich the first organic dielectric layer in such a manner that the each plate of the inter-resonator coupling capacitor electrode connects to separate resonators. Yet further, the filter 600 includes a first shield electrode formed respectively on a second organic dielectric layer, which in this case is Rogers 4350 from Rogers Corporation, and which is disposed over the circuitry described above, so as to sandwich and substantially completely shield one surface of the filter.

The filter may further comprise a third organic dielectric sheet, if needed, provided on the outside of the shield electrode to protect the outermost shield electrode. In this filter, the inductors 612, 614 did not provide the needed capacitance in the desired length, and therefore each is connected to a separate grounded/shunted parallel plate (two plate) using the same first organic layer as the sandwiched dielectric, which then together form the resonator pairs. In addition, parallel plate/interdigital capacitors 626, 628 are utilized on either side of the first and last resonator elements at the input and output terminals of the device for impedance matching purposes. If greater density is desired, then multiple thin layers such as the first dielectric layer can be used to form multi (>2) plate capacitors. In addition, another dielectric layer such as lower temperature melt LCP compare to the higher melt temp LCP used as the first dielectric is laminated on the other side of the first substrate (not the same side as the second substrate), and then solder bump openings are made where ground and input output connections are required to connect the device to corresponding terminals on the board.

The CPW topology, where the reference is on the same first dielectric layer provides the shielding internally, provides for the ground connectivity to the resonators/inductors and capacitors. However in more noisy environments the external electrodes, such as those in Example I, could be added for added shielding.

In the second bandpass filter, the openings in the third substrate allow for the ground connection connected to the CPW ground and two other openings not connected to each other or the ground serving for input and output terminals.

The first step to making connection between devices is by drilling through holes (as small in diameters as the thickness of the dielectric used) through the first organic dielectric layer of LCP and copper. Then both sides of LCP copper laminate are metalized via electroless copper. Copper is then electroplated on both sides of laminate. The copper is then printed and etched to define filter component.

The second organic dielectric layer can be laminate LCP or another appropriate dielectric with generally larger thickness than the first organic dielectric layer with copper metal (for high power applications) plated on top of the filter to a given thickness of approximately 20-30 µm to encapsulate components. The third organic dielectric layer is laminate LCP or another appropriate dielectric with generally larger or smaller thickness than the first organic dielectric layer with copper plated in the openings to a given thickness to provide for solder landing pads. The openings in the third substrate are filled with screen solder paste and reflowed to form bumps.

Figure 11:
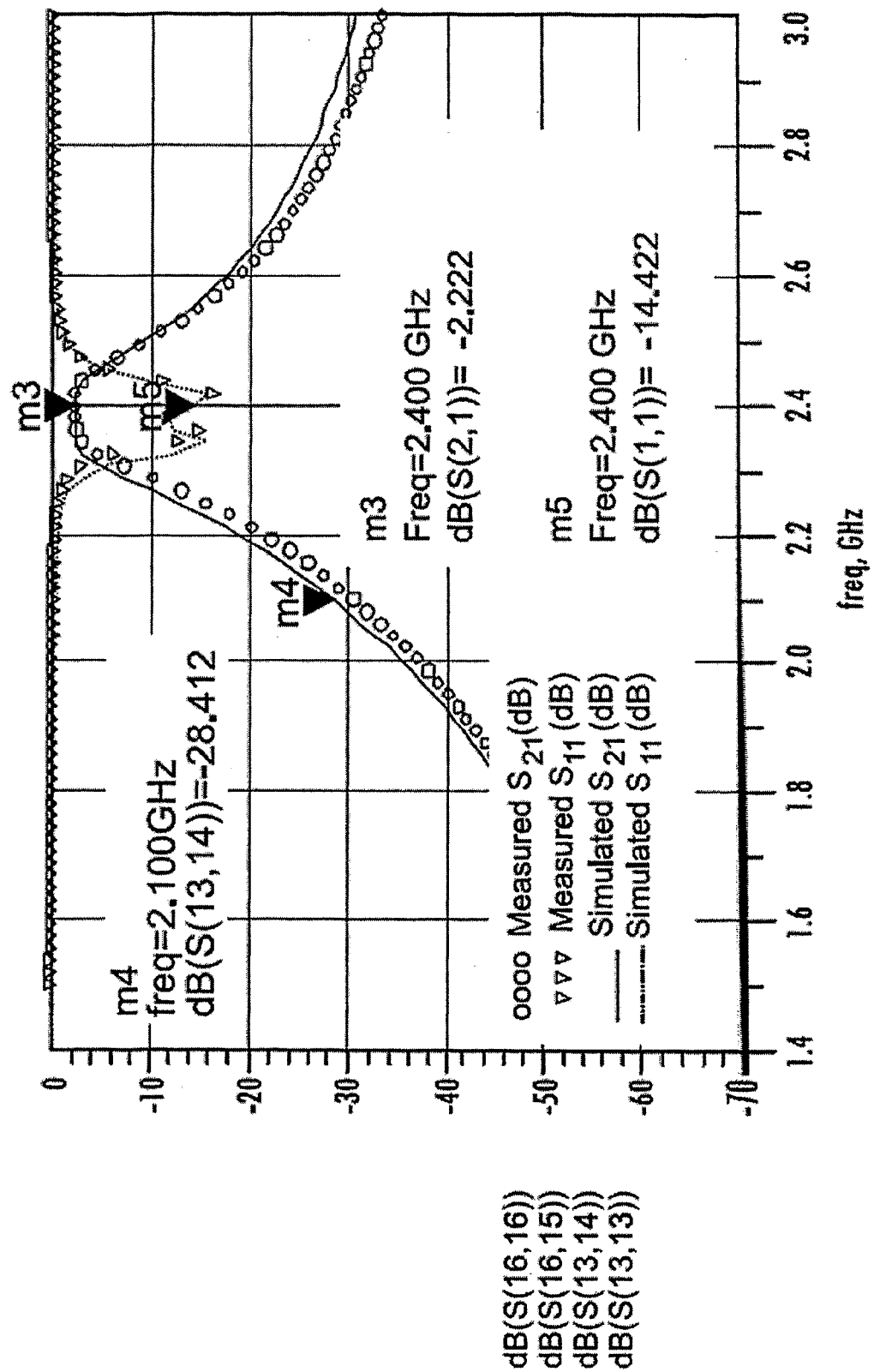
FIG. 11 is a graphical representation of measured and modeled data for the BGA style organic filter in FIG. 10.

FIG. 11 shows model to hardware correlation for the organic bandpass filter 600 in FIG. 10. In summary, the filter utilizes a CPW topology with only two metallization levels and all embedded passives in an organic substrate, which resulted in better performance than of non-standardized multilayer (>5) ceramic processes. As the adoption of lower loss materials, such as LCP, becomes more common, this design shows the feasibility of integrating very low loss filters for applications such as Bluetooth/WLAN in compact boards and packages.

The measured data for the filter 600 and simulated data is shown in FIG. 11. As seen there is excellent correlation between measured data and simulated data. The filter 600 has an insertion loss of only 2.22 dB.

It is worth noting that while the Q of capacitors may be as high as 300 using LCP, the Q for the inductor was kept at the required level of approximately 130. The insertion loss was 0.6 dB lower than the MLC filters with similar footprint. A resimulation for the filter circuit shown, but with Qs of 200 for the inductors, showed an insertion loss of 1.65 dB when simulated. A filter with a loss of 1.65 dB at the frequency and bandwidth desired of the Bluetooth/WLAN filter can be alternatively achieved only by using the bulkier and costlier ceramic cavity and monoblock filters.

Example III

Figure 12:
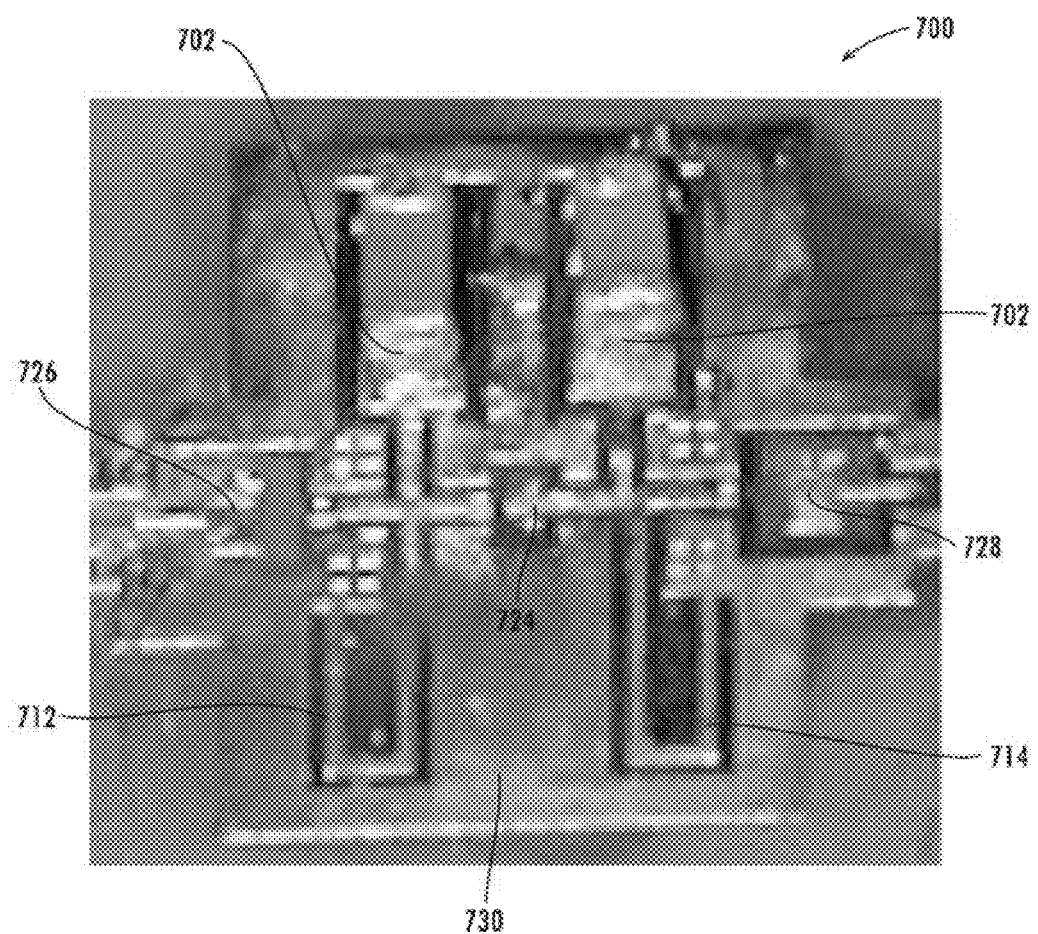
FIG. 12 is a picture from a top plan view of an organic dielectric filter that includes SMD capacitors in accordance with an embodiment of the present invention.
Figure 17:
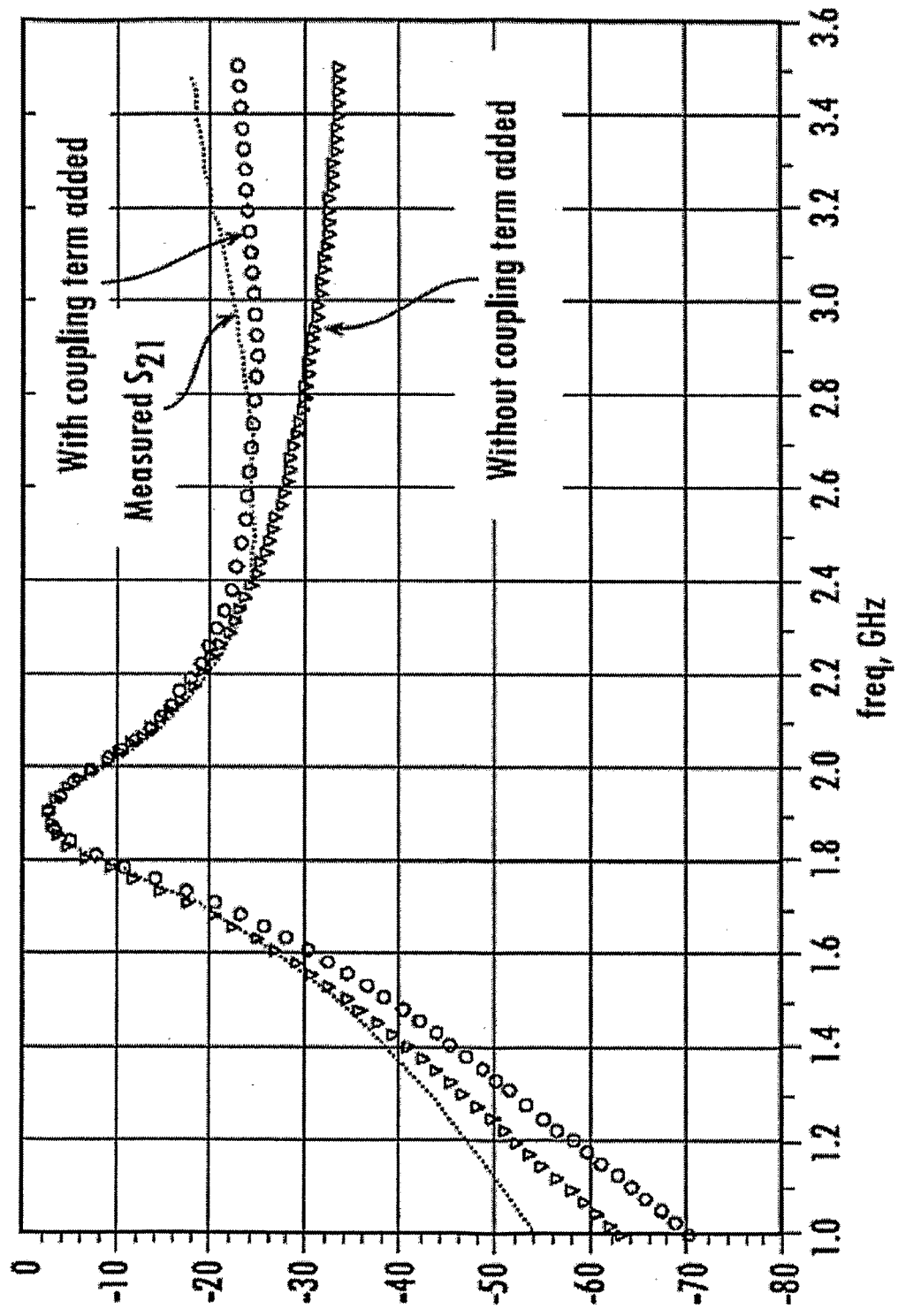
FIGS. 17A-17F illustrates substrate variations according to an embodiment of the present invention.

Yet another organic bandpass filter 700 in accordance with an embodiment of the present invention is shown in the picture of FIG. 12. The organic bandpass filter 700 comprises shorted hybrid CPW-microstrip meander inductors formed close to each other on a first organic dielectric substrate, such as epoxy based Vialux by E.I. du Pont de Nemours and Company, directly magnetically coupled to each other. In addition, the third bandpass filter comprises an inter-resonator parallel plate coupling capacitor electrode 724, with ground ring, formed using two disconnected metal plates that sandwich the same organic dielectric sheet in such a manner that the each plate of the inter-resonator coupling capacitor electrode connects to separate resonators.

The transmission line inductors 712, 714 did not provide the needed capacitance in the desired length. Since the dielectric is lossy for the capacitor application, each is replaced by a separate discrete capacitor 702, such as a chip capacitor or ceramic capacitor with one terminal of one capacitor connected to one resonator and the other shorted to the in-built shielding electrode 730. The same can be done for the other capacitor 724 where one terminal is grounded, i.e., connected to a CPW ground electrode 730 and the other terminal is connected to the resonator section. In addition, a parallel plate/interdigital capacitors 726, 728 are utilized on either side of the first and last resonator elements at the input and output terminals of the device for impedance matching purposes. If greater density is desired multiple thin layers such as the first dielectric layer can be used to form multi (>2) plate capacitors.

The organic bandpass filter 700 may further comprise another monoclad second organic dielectric layer that is laminated on the one side of the first organic dielectric layer (opposite the side of the discrete capacitors). In addition, it may further comprise multiple plate through holes going through first and second organic dielectric layer connected to the in-built shielding electrode 730 and metal sheet of the monoclad dielectric. This may or may not be desired for cost saving purposes, though adding these vias makes it a true CPW/microstrip hybrid device. The CPW topology, where the reference is on the same first organic dielectric layer, provides the shielding internally, and also provides for the ground connectivity to the resonators/inductors and capacitors. However in more noisy environments the external through holes can be added for added shielding.

The organic bandpass filter 700 may further comprise a third organic dielectric layer on the same side as the discrete capacitors 702 providing for protection of the circuits and seal the device from moisture uptake and corrosion. This material could be the same as solder mask materials, which would be used by the board manufacturers to protect other circuits on the board. In addition, the bandpass filter 700 may further comprise a metallic lid or cap/electromagnetic shield which encloses the device on the top surface and prevents EMI interference and radiation effects from affecting the performance of the filter.

FIG. 13 shows model to hardware correlation for the organic bandpass filter 700 in FIG. 12. In particular, FIG. 13 shows a model to hardware correlation for the filter with all embedded components, except the two discrete capacitors. As shown, there is very good agreement between measured and predicted results. The measured filter has a center frequency=1.9 GHz, a 1 dB passband of 60 MHz, and a 3 dB bandwidth of 120 MHz. The attenuation at 1.5 GHz is ~40 dB, as desired. The insertion loss is approximately 3.8 dB at 1.9 GHz, which is greater than the specification of 3 dB for such applications. This is due to the use of center and matching capacitors with Qs of 40 in Vialux rather than the required Q of 60 needed to achieve a lesser loss of 3 dB. This insertion loss can be lowered by using A-PPE™ or LCP™ from Rogers Corporation dielectric materials for the organic dielectric layer. Such a filter would be applicable in cellular phones as the intermediate RF filter or in cordless phones as the front-end RF filter.

As seen in FIG. 13, there is a discrepancy in the measured and predicted results beyond 2.5 GHz for $S_{21}$. This discrepancy is due to the coupling between the two discrete capacitors. The simulations were done for individual components and for optimizing the spacing between the inductors. The discrete capacitors were measured as individual components without any coupling between them. The tight spacing between the capacitors could have resulted in unwanted coupling effects which show up at frequencies greater than 2.5 GHz. After including a mutual coupling term between the two discrete capacitors, the results show better agreement with measurements.

Thus, the organic bandpass filter 700 utilizes a CPW topology with only two metallization levels and an epoxy based substrate along with discrete capacitors, which achieves the performance of non-standardized multilayer (>5) ceramic processes. Additionally, the MLC filters cannot be integrated with other components in the same layers of the ceramic package due to several reasons, a few of which include: firstly, because of the use of a filter-specific dielectric which is incompatible with other dielectrics; secondly, because of the specificity of certain attributes such as 100 µm thick aluminium conductor lines required to lower the attenuation present due to standard 5 µm lines used in ceramic processes. The design discussed in this section was fabricated using standard design rules pertinent to multilayer laminate boards and can be directly implemented on the board without the need for a separate surface mount device. Furthermore, the model to hardware correlation shows validity of the design technique used.

IV. RF/Wireless Signal Passive Processing Components

Integration of high performance passives such as filters, diplexers, couplers, baluns, multiplexers, and other RF signal processing passive functions in organic substrates or the PCB can eliminate the dependence on LTCC and would help reduce module surface area, save costs and increase reliability. The present invention provides fully-packaged miniature bandpass filters, baluns, diplexers, multiplexers, couplers and a combination of the above using LCP and novel multilayer polymer based substrates. The components fabricated according to an embodiment of the present invention offer one or more of the following distinctive features: 1) since these components are implemented using a hybrid coplanar waveguide (CPW)/stripline topology, they can be completely shielded on all sides except the locations used as input/output terminals, thus minimizing radiation losses and electromagnetic interference, 2) using a combination of lumped and distributed elements and coupling between components in multilayer substrates provides size reduction on the order of λ/40, 3) low insertion loss comparable to ceramic monoblock filters for comparable size, bandwidth and attenuation specifications, 4) a high reliability demonstrable by extensive life testing, 5) minimal temperature dependence performance variation, 6) fewer metal layers to achieve the same density as LTCC, 7) a single substrate that may be used at multiple frequencies (1 GHz-100 GHz) to implement different functions such as filters, diplexers and baluns, 8) conducive for large area (12×18 square inch) processing, 9) faster time to market due to lesser number of layers, 10) excellent hermetic properties (e.g., 0.04% moisture absorption) comparable to ceramics, and 11) eliminates several levels of packaging such as integrated circuit (IC) and discretes on LTCC on PCB on PCB, or TFOS and IC on PCB on PCB, or LTCC on PCB and other variants to ultimately multiple ICs on single PCB or multilayer polymer substrate.

Bandpass Filter Design

Radio frequency (RF) filters are generally used to remove the out-of-band energy and perform rejection of image-band signals. The design of RF filters in most architectures is becoming a problem since center frequencies are scaling towards the multi-gigahertz range for most RF standards. As the carrier frequency becomes higher, the loaded Q (carrier frequency/3 dB bandwidth) for filters becomes higher, which places higher demand on the unloaded quality factor for components such as inductors, capacitors and resonators that make up the filter device. These filters and signal processing units can meet the specifications of cavity filters, MLC and LTCC filters and signal processing devices with equivalent or better performance in smaller or similar footprints. In particular, the present invention comprises a multilayer organic substrate that utilizes thin dielectric layers such as liquid crystalline polymer films that are either filled with high k dielectric constant particles or unfilled, and interconnected in a configuration that allows for blind and buried via structures to support the integration of multiple RF components such as filters, baluns, diplexers, and a combination thereof within the substrate for different communication standards such as 802.11a/b/g, local multipoint distribution service (LMDS)/multichannel multipoint distribution service (MMDS), satellite/digital TV, UWB, cellular and Bluetooth type applications.

Figure 14A:
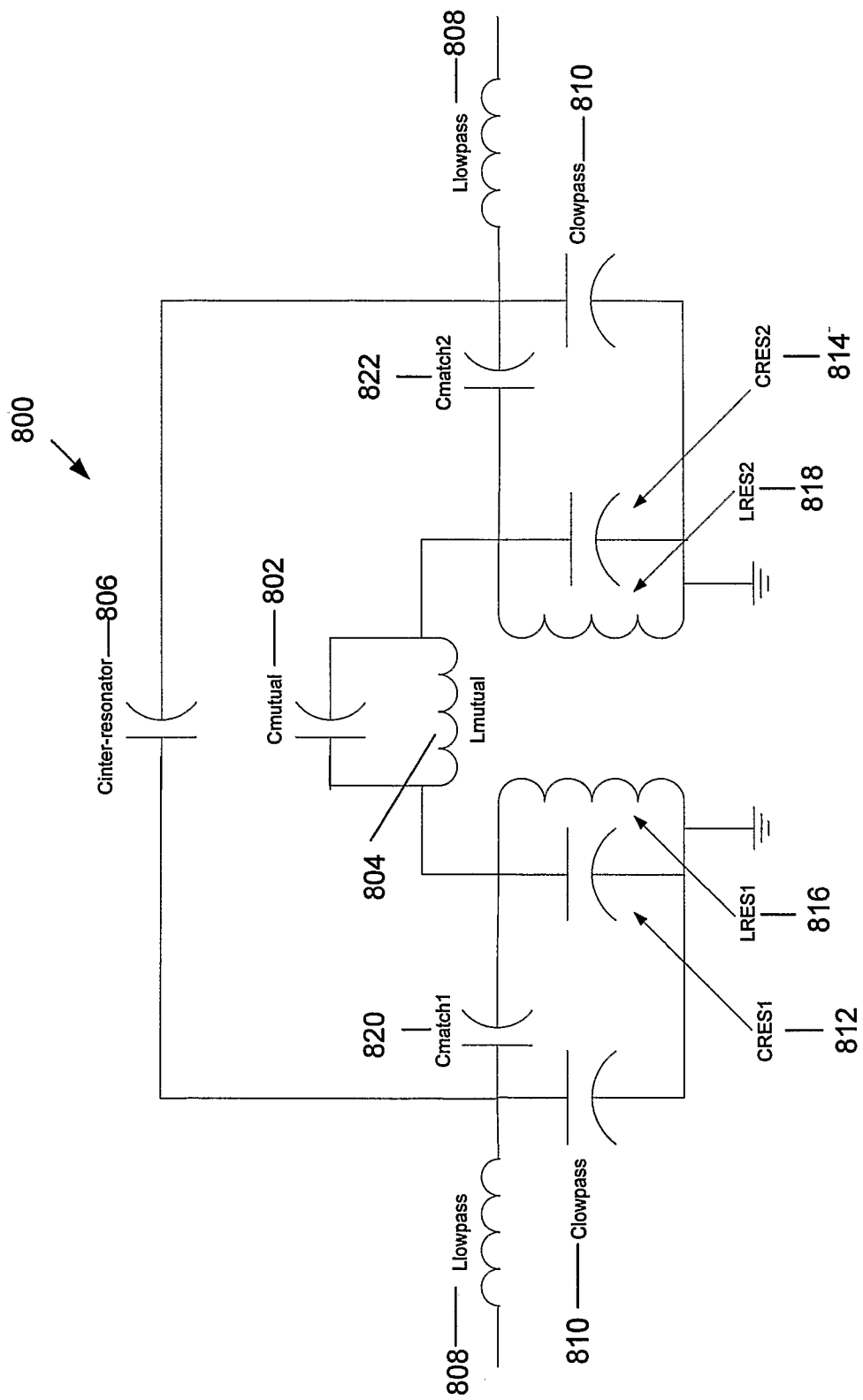
FIG. 14A is a schematic of a two-pole second-order bandpass filter according to an embodiment of the present invention.
Figures 14B, 14C, 14D:
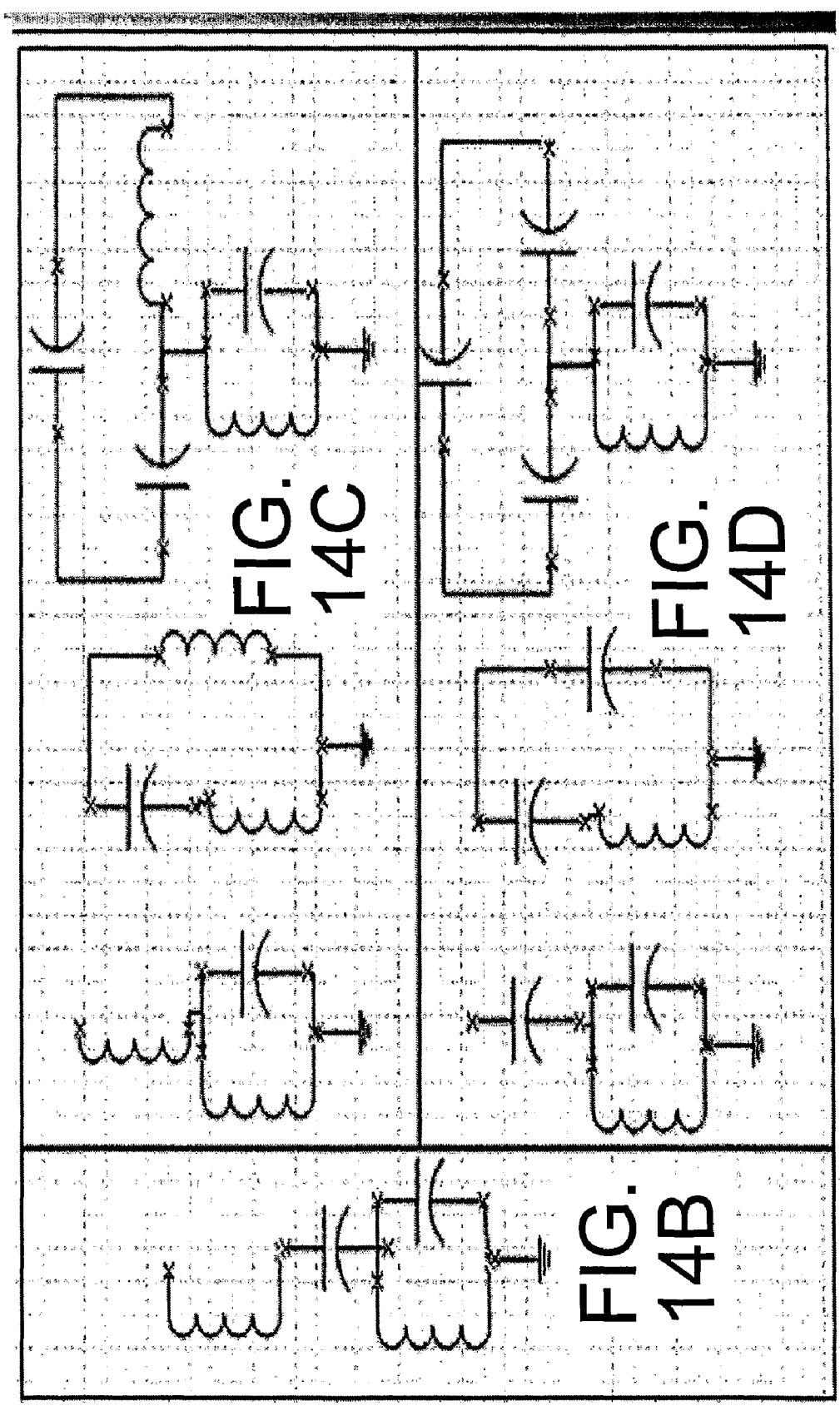
FIG. 14B-14D show variations of the resonator arms in FIG. 3A.

Different filters have been implemented using the circuit configuration shown in FIG. 14A. FIG. 14A is a circuit diagram of a two-pole, second order filter 800 in accordance with an embodiment of the present invention. The second order filter 800 includes a second order coupled resonator bandpass filter (with capacitive coupling through the capacitor Cmutual 802 and inductive coupling through inductor Lmutual 804) in parallel with a feedback capacitor CInter-Resonator 806. In accordance with an embodiment of the present invention, a small, thin plane type narrow-band bandpass filter to be used for a portable telephone, cell phones, wireless infrastructure, WLAN, and the like, includes a plurality of end short-circuited hybrid CPW/stripline/microstrip meander/straight inductors or transmission line resonators (i.e., LRES1 816, LRES2 818) formed close to one another on a first organic dielectric substrate or on multiple dielectric substrates interconnected by via connections, and in proximity to one another in order to be directly magnetically coupled to each other. A primary attenuation zero in the lower or upper stopband is achieved by using the parallel resonator formed by a combination of elements Lmutual 804 and Cmutual 802. The purpose of the feedback capacitor Cinter-Resonator 806 is to alter the location of this primary zero by bringing it closer to the passband for increased steepness/roll-off and to introduce another transmission zero. This could also be done by using the resonant property of lumped capacitors CRES1 812 and CRES2 814 which resonate with their respective parasitic inductances to provide transmission zeroes. The lumped capacitors CRES1 812 and CRES2 814 are used if the parasitic capacitance inbuilt into the resonators LRES1 816, LRES2 818 are not sufficient for a band pass type response. Some of these variants are discussed above in more detail. Variants of this design schematic have been shown in FIGS. 14B, 14C, and 14D. In particular, for simplicity, only the variants of the resonator arms (CRES, LRES) in FIG. 16A have been shown in FIGS. 14B, 14C, and 14D. FIG. 14B shows elliptical type resonator sections. FIG. 14C shows resonator sections that provide higher transmission zeroes. FIG. 14D shows resonator sections that provide lower transmission zeroes. These resonator arms can be connected using capacitive coupling or inductive coupling between the resonators. The Cinter-resonator 806 conceptually represents reactance present in the form of capacitance, inductance, and mutual inductance between adjacent resonators or non-adjacent resonators which help in attaining more degrees of freedom based on control theory for the addition of transmission zeroes, control of bandwidth, and control of center frequency.

In addition, with respect to FIG. 14A, lowpass filter elements are provided at the input and output, such as the inductors Llowpass 808 and capacitors Clowpass 810, to achieve high attenuation at the second harmonic and third harmonic of the center frequency. In addition, the capacitors Cmatch1 820 are provided to match impedances between sections. For simplicity, however, no parasitic components have been shown in FIG. 14A.

As an example, a two pole filter constructed in accordance with the present invention using two metal layers on two sides of a thin laminate substrate and then shielded on both sides has a footprint of 3×3 mm, a height of 1.5 mm and emulates the performance of a 4×5 mm monoblock filter having a height of 1.8 mm. Using processing techniques in accordance with the invention on a 12"×12" substrate, it is possible to fabricate approximately 6500 such components with filter-to-filter spacing included, which illustrates its cost effectiveness. A filter according to the present invention requires just two metal layer pattering because of the CPW-type topology compared to the multi-layers in ceramic filters or molded cavity filters. This also reduces design time and processing time as compared to ceramic filters or molded cavity filters. Such a design is discussed in U.S. Publication No. 20040000701A1, published Jan. 1, 2004, entitled "Stand-Alone Organic-Based Passive Devices," and assigned to the owners of the present application.

Figure 15:
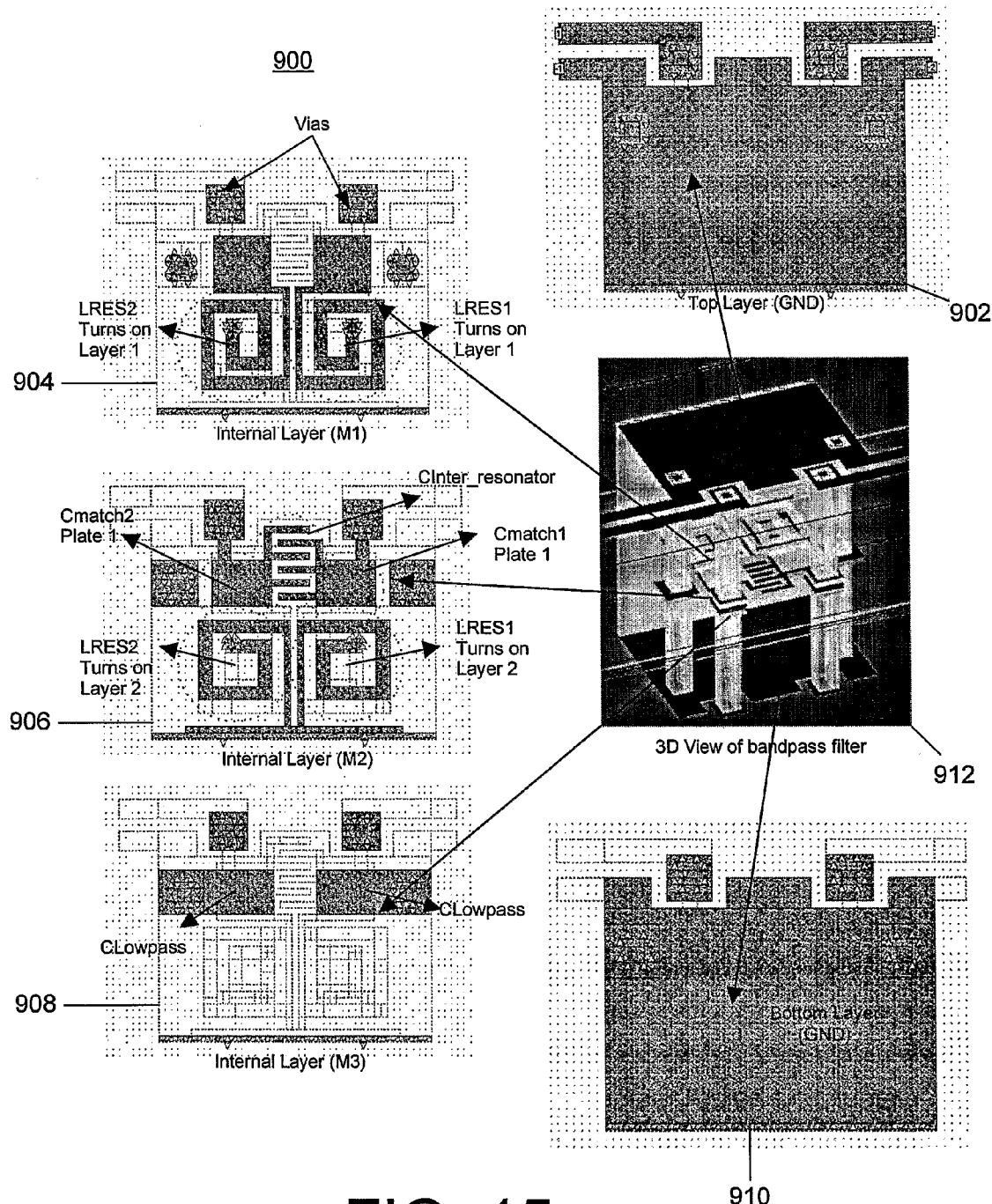
FIG. 15 shows a 3D view of the 2.4 GHz bandpass filter according to an embodiment of the present invention.
Figure 16:
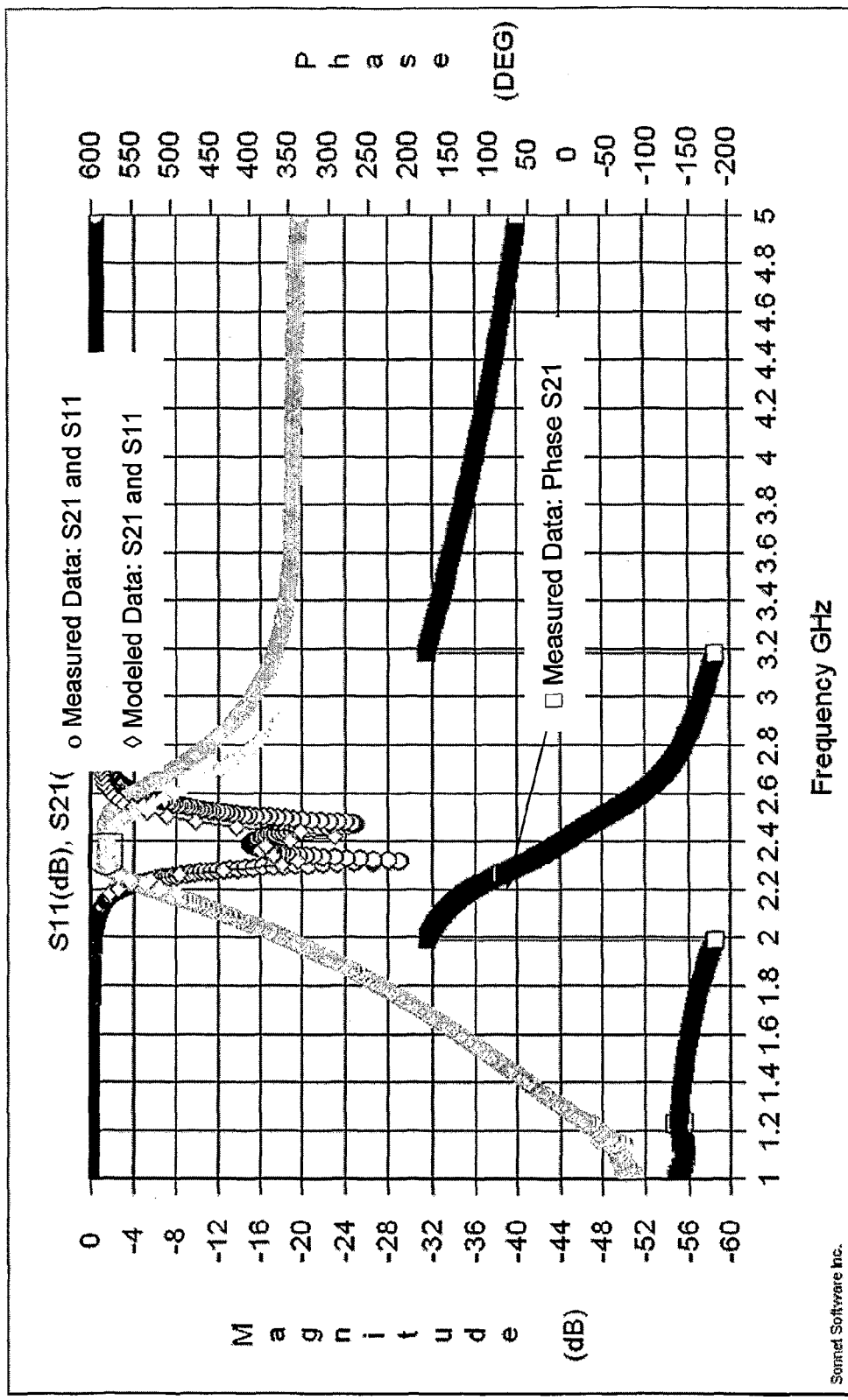
FIG. 16 shows the measured and modeled data for the 2.4 GHz bandpass filter according to an embodiment of the present invention.

In an exemplary embodiment, a bandpass type filter 900 in FIG. 15 was designed for WLAN (802.11b/g) type applications and can also be used for Bluetooth, and other ISM band type applications. The bandpass type filter 900 intended for 2.4 GHz WLAN front-end RF filter type applications was designed using the following lumped element components illustrated in FIG. 14A: LRES1 816–LRES2 818=5.1 nH, CRES1 812=CRES2 814=0.9 pF, Lmutual 804=26 nH, Cmutual 802=0.088 pF, Cmatch1 820=0.3 pF, Clowpass 810=0.52, Llowpass 808=0.35 nH, and Cinter-resonator 806=0.05 pF. In this instance CRES1 812, CRES2 814 exist as the parasitics of the inductors LRES1 816 and LRES2 818 and shunt capacitance of Cmatch1 820 and Cmatch2 822. As illustrated in FIG. 16, the filter depicts a 1 dB passband of 100 MHz with insertion loss less than 1.3 dB from 2.4-2.5 GHz and transmission zeroes at 2.8 GHz and 1.6 GHz. Referring to FIG. 15, this filter is constructed using one layer of LCP that is 2 mils thick and metal layers M1 904 and M2 906 on either side. In addition, the internal metal layers M1, M2, and M3 and the top and bottom shielding layers 902, 910 may contain vias, which are denoted throughout the application by the small triangles arranged in a circular pattern. It is packaged with 4 mil prepreg (e.g., Rogers 4450B) on either side (refer above and to U.S. Publication No. 20040000701A1, which is referenced above, for variations) followed by 8 mil hydrocarbons (e.g., Rogers 4003, 4350 type) on either side. This stack up conforms to the one shown in FIG. 17A and discussed herein.

Figure 17A:
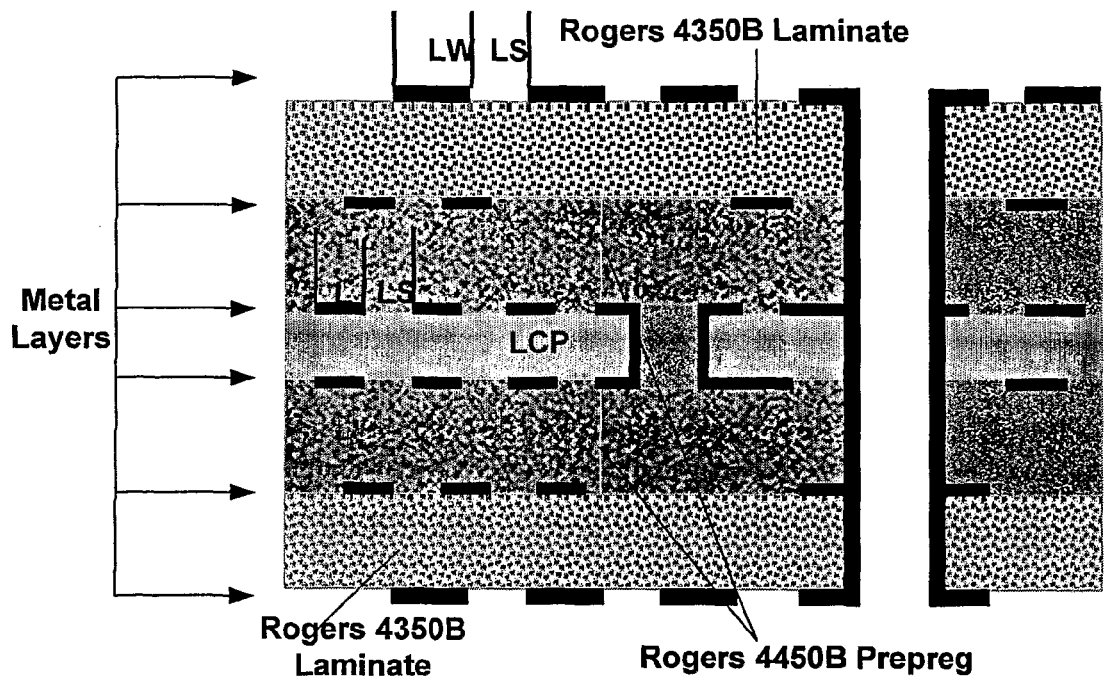
Figure 17B:
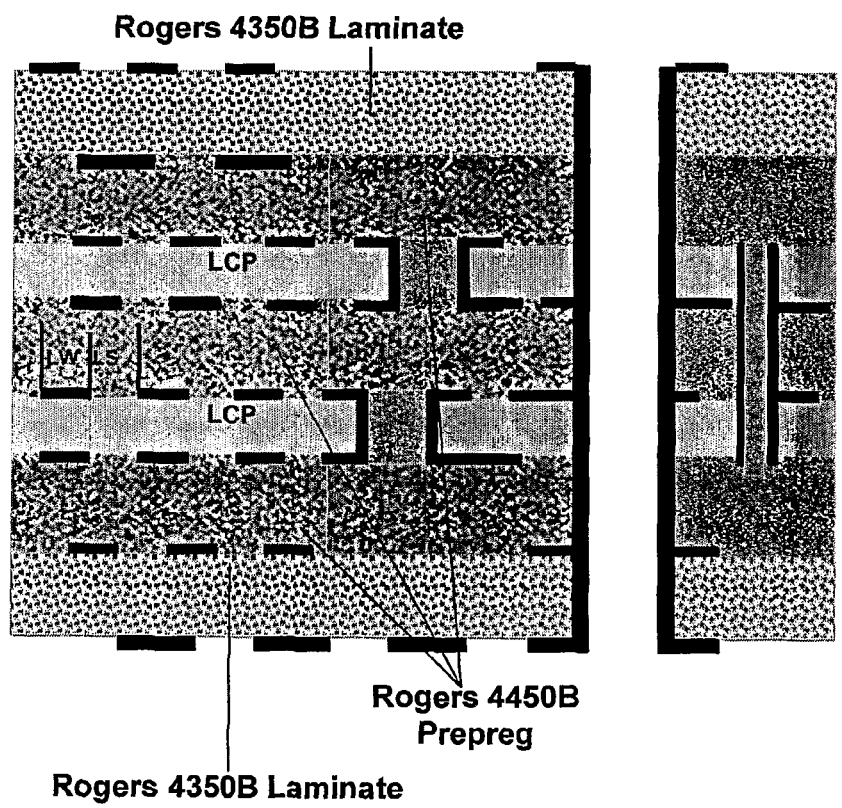

Specifically, FIG. 17A discloses six metal layers (metal being denoted by the dark lines). Both the top and bottom metal layers may function as ground shields. The metal layers on each surface of the LCP layer may contain inductors and parallel plate capacitors. The metal layers on the laminate layers adjacent the prepreg layers are optional and may contain additional components if desired, such as for added density. In accordance with an embodiment of the present invention, the inductors are preferably formed on the LCP layers and the capacitors are formed on either the LCP layer or the Laminate layers. FIG. 17B is an extension of FIG. 17A, in which an additional LCP layer with metal layers on opposite sides thereof has been added. More components, including parallel plate capacitors and inductors can be placed on this additional LCP layer. This additional LCP layer is separated from the other LCP layer by an additional prepreg layer, though the layer may be electrically connected by microvias.

Figure 17C:
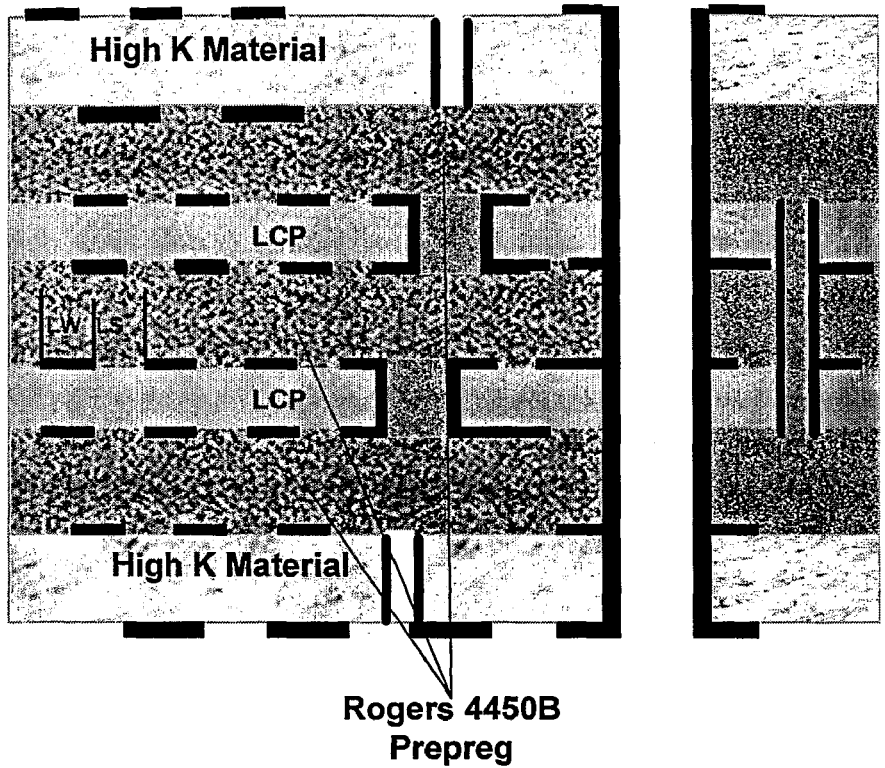
Figure 17D:
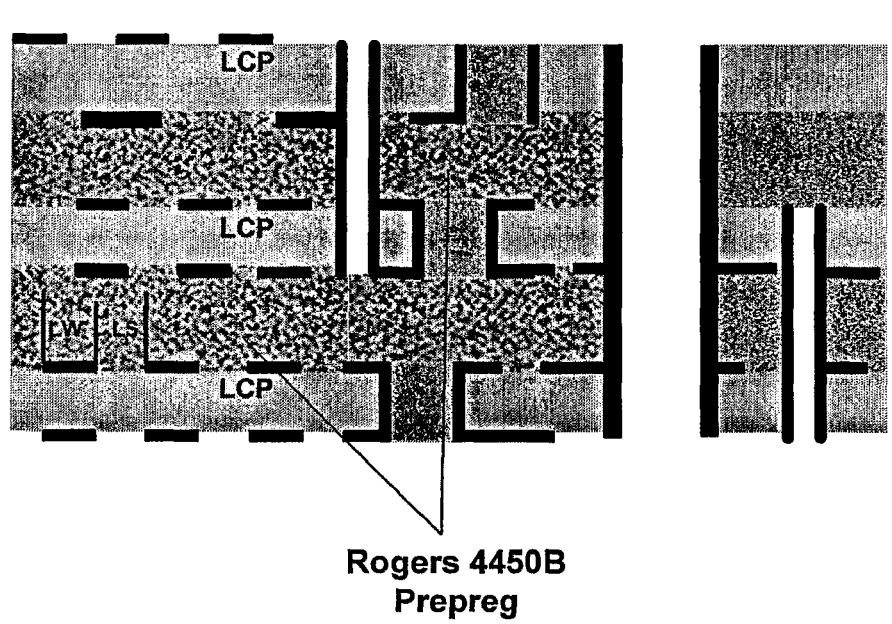

FIG. 17C illustrates the layers shown in FIG. 17B, except that high K layers have been substituted as for the laminate layers. When compared to the laminate layers, the high K layers increase the separation and increase the capacitance for capacitor components that may be placed on the high K layers. Generally, the non-critical, lower-performing components would be placed on the high K layers. FIG. 17D illustrates three LCP layers that are separated by two prepreg layers. An aspect of the stackup shown in FIG. 17D compared to the previous stickups in FIGS. 17A-C is that this is an extremely thin stackup which may be on the order of a 0.3 mm thick substrate. Four metal layers are shown in FIG. 17D, which may contain components such as capacitors and inductors, providing for excellent density. FIG. 17D may be known as a high performance substrate. One of ordinary skill would recognize that the stackup in FIG. 17D is not limited to 3 LCP layers, but could contain additional layers, including another LCP layer that is separated from the other LCP layer by a prepreg layer.

Figure 17E:
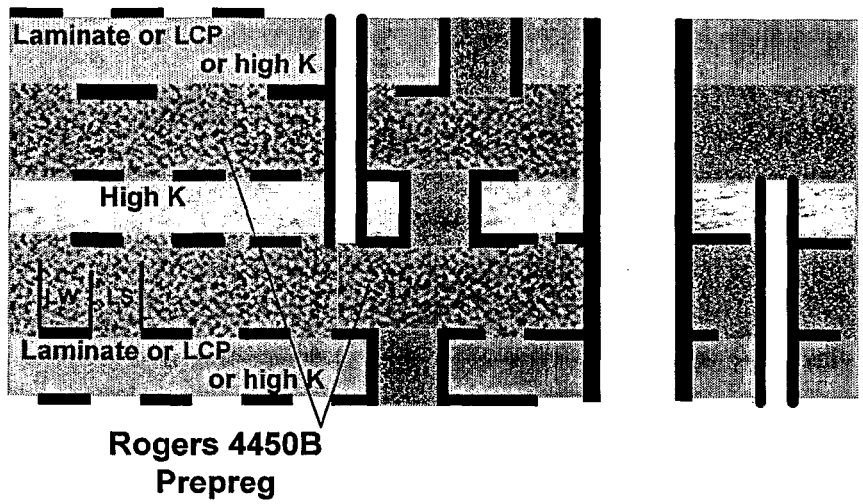
Figure 17F:
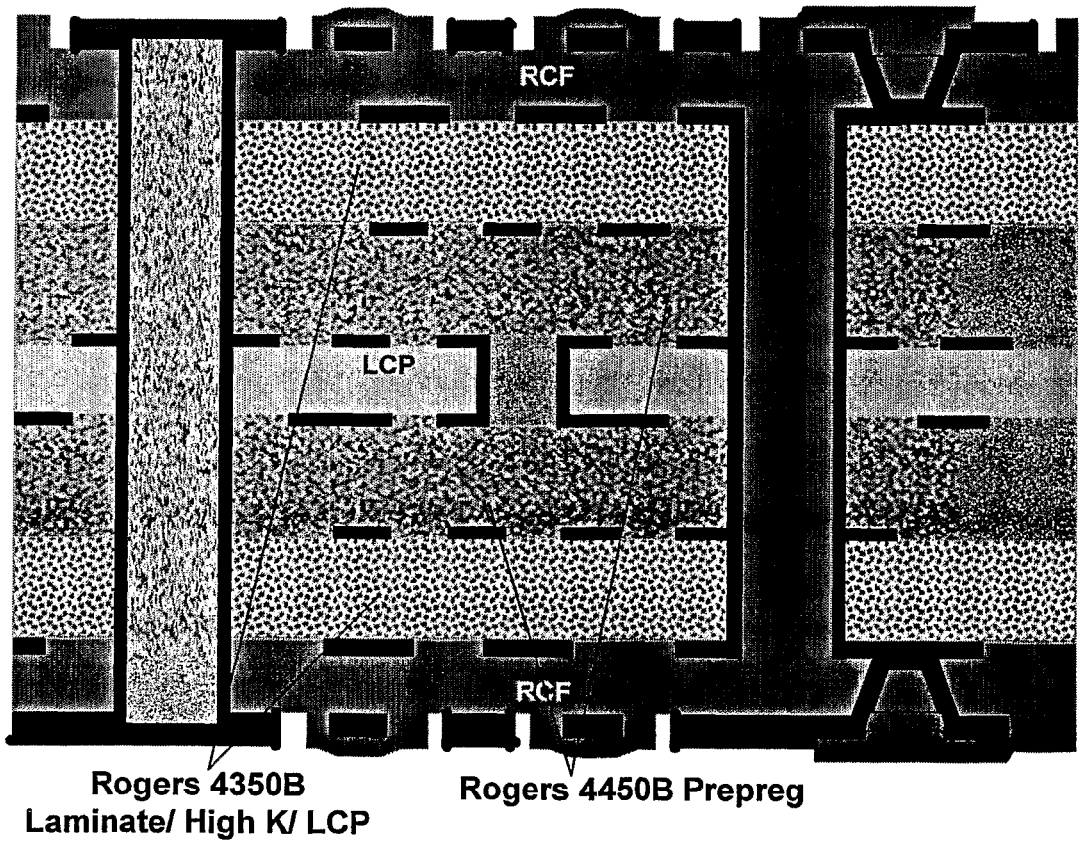

FIG. 17E illustrates an inner high K layer that is positioned between two laminate, LCP, or high K layers. In particular, the high K layer is separated from each laminate, LCP, or high K layer by prepreg layers on opposite sides of the high K layer. The high K layer and each of the laminate, LCP, or high K layers may contain metal layers on each surface to provide for integrated components such as inductor and capacitors. The stackup shown in FIG. 17E may be suitable for a baluns which may have a more relaxed performance specification. In such a case, the high K middle layer does not have to be fabricated with such stringent requirements (e.g., thickness), and is appropriate for use as an inner layer. FIG. 17F discloses a stackup similar to that shown in FIG. 17A, with the addition of exterior RCF (resin coated foil) layers. RCF (resin coated foil) allows for the same densities for lines and spacing and microvias but at a lower cost compared to high K and LCP. In addition, in FIG. 17F, the laminate layers could also be substituted with high K or LCP layers.

When working with hybrid CPW-stripline topology, the higher performance components will typically need to be further away from ground while the lower performance components may be closer to ground. For example, in FIG. 17B, inductors may be placed in the inner LCP layers while parallel plate capacitors may be placed on the laminate layers. However, parallel plate capacitors could also be placed on the inner LCP layers as well.

Referring back to FIG. 15, this topology uses the distance between the coils of the inductors to control the Cmutual 802 and Lmutual 804 to control the bandwidth and the fundamental transmission zero on the lower side or higher side of the center frequency. The Cinter-resonator 806 can be added as inter-digital or a parallel plate capacitor. Other degrees of freedom are the LCP or internal polymer thickness. For example the same inductor on 1 mil LCP gives a LRES1 816=LRES2 816=10 nH, but with a parallel CRES1 812=CRES2 814=0.12 pF. The Cmatch1 820/Cmatch2 822 on either side controls the desired impedance of the filter. Such a topology can be used as a one pole or multiple pole filter with topologies shown in FIG. 14A or variations shown in FIGS. 14B-14D. Another possible variation for this design is to use the stackup in FIG. 17B with two LCP layers. As seen from internal layers M2 906 and M3 908 in FIG. 15, there are limitations to the ways of laying inductors next to each other. This becomes a limitation for the different kinds of filters. In this scenario, inductors can be split up between four metal layers which are adjacent to the LCP layers shown in FIG. 17B. The inductors now can be vertically above each other or offset from each other in X, Y, and Z dimensions which gives designers more freedom for design parameters such as BW, and transmission zeroes. Finally, another mechanism for optimal size reduction is to place the capacitors CMatch1 820, CMatch2 822 and CRES1 812, CRES2 814, essentially all capacitors on LCP layers away from the central LCP layers which preferably includes only of inductors. FIGS. 17C and 17D can now be used for such a design. The outer LCP cores (i.e., the laminate layers) or the high K layers have to be now further away from the innermost layer containing the high current carrying inductors. In such a case, thicker prepreg layers should be used to maintain the required distance (for isolation) of the inductors from the grounds.

In comparison to this design, design examples shown in US Publication No. 20040000701A1, which is referenced above, show a possible generic design, which does not use significant parasitics of components. Such designs are useful at higher frequencies where component values become smaller and parasitics become difficult to control or at lower frequencies in applications such as basestations, LMDS, MMDS and access points where space is not critical but performance and integration are.

Figure 18:
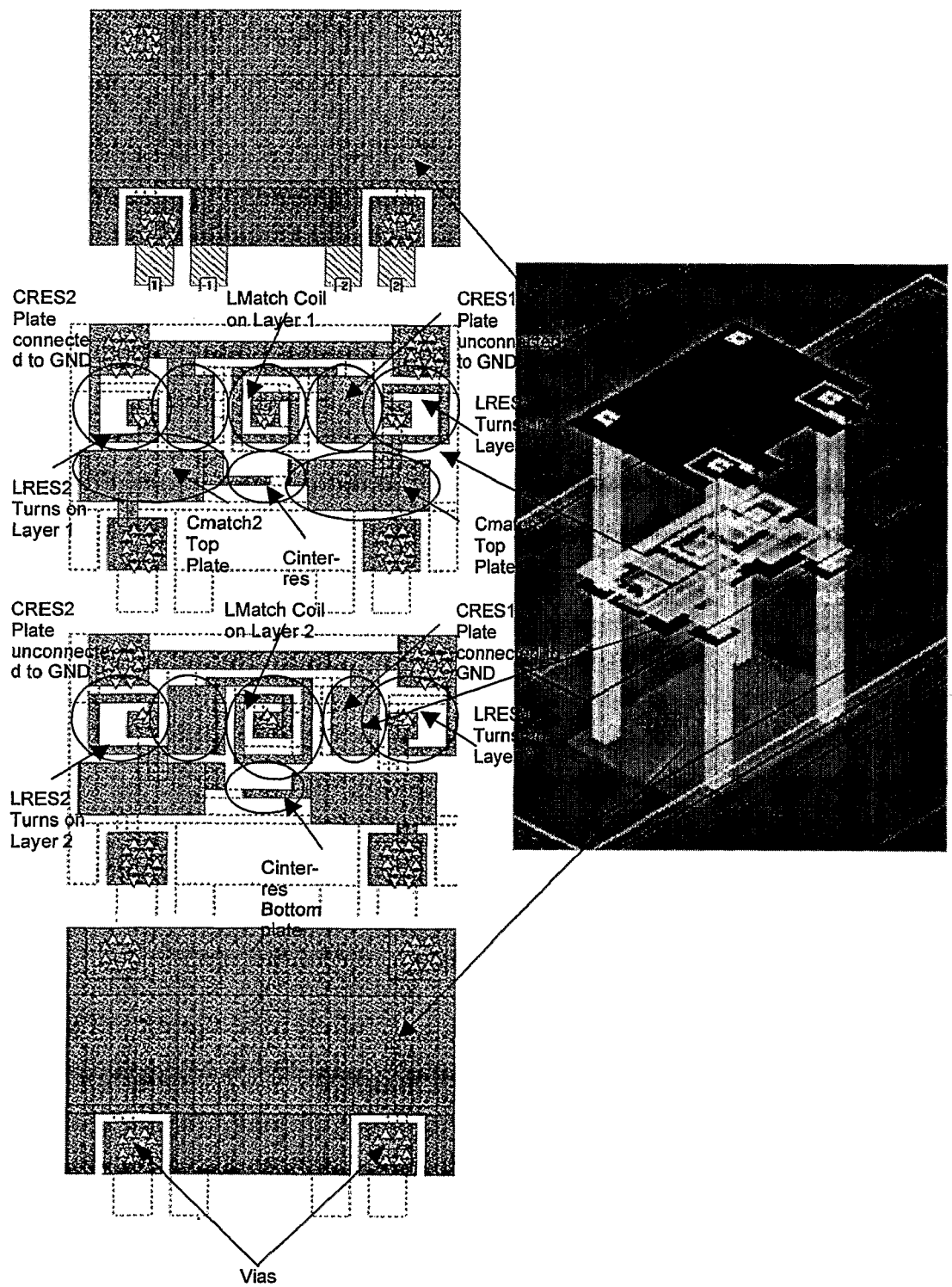
FIG. 18 shows a 3D view of a type 2 bandpass filter with fewer parasitics in individual components according to an embodiment of the present invention.

FIG. 18 shows an illustrative embodiment of a wider bandwidth filter applicable for application as a bandpass filter that passes 4.9-5.9 GHz with low insertion loss and attenuation of $2^{nd}$ and $3^{rd}$ harmonics of the pass band (9.8-11.8 GHz, 14.7-18 GHz) and also attenuates 802.11b/g frequencies and cellular frequencies below 2.2 GHz. This stack up conforms to the one shown in FIG. 17A. However, 1 mil LCP is used with 4 mils of Rogers 4350 laminate and Rogers 4450 prepreg on either side. Similar design principles presented for the previous circuit in FIG. 15 are also applicable for this particular circuit shown in FIG. 18. The size of the above mentioned circuits are roughly 2 mm×2 mm and integrate nine components at 2400 MHz and seven components at 5500 MHz, which equates to a component density upwards of 150-200 components/cm2. The other design suggestions may increase this count to upwards of 500-100 components/cm2.

The use of high K layers will now be discussed in more detail. An LCP layer or other laminate layer can be filled with high K dielectric particles or incorporate a high K deposited thin film. Incorporation of the high K particles may be achieved by introducing a surfactant onto high k particles, such as Barium titinate, lead magnesium nitrate, or titatium dioxide to minimize particle clustering, followed by drying and then subsequent introduction in the organic melt prior to drawing and pressing the cladded organic layer into finished sheets. The resultant high K layers sandwiched between copper sheets or planes can serve as embedded decoupling layers that can be processed in the multilayer stack for noise suppression and other benefits. The amount of high k particle incorporated into the organic layer will determine the resultant dielectric constant values and mechanical integrity. Typical volume fraction will vary from 10% to 50%. Additionally, high K organic layers that are either deposited or filled enable passive components and arrays that can support applications beyond 6 GHz. This is achieved, at least in part, by lithographically defining the top and bottom conductor layers to form a parallel plate construction. The filled organic as well as the non-filled organic is sandwich between the lithographically defined top and bottom conductor layers.

High K layers can be used for matching capacitors since they do not impact the insertion loss of bandpass circuits tremendously. However, capacitors in resonator tanks, namely CRES1 812 and CRES2 814 need to be examined carefully. The loss tangent (tan δ) of the material dictates the quality factor (Q) of the capacitors. The quality is inversely proportional to the loss tangent and the maximum possible quality excluding conductive losses is 1/(tan δ). For a bandpass circuit, the quality of LRES and CRES in each tank determines the overall quality of the component, which in turn controls loss in the circuit. In the case of LCP, the maximum quality factor is 1/0.002=500. In this instance, the inductor Q almost equals the quality of each resonator and dominates the performance of the filter.

While the results presented thus far are for two pole resonator designs, one of ordinary skill in the art would appreciate that the designs could be easily extended to filters with additional poles when additional zeros and different passband characteristics are required. In addition, while the above embodiments in accordance with an aspect of the present invention are disclosed in the context of filters and resonator elements, the teaching of the present invention can be readily applied to other integrated passive devices (IPDs) such as diplexers, duplexers, multiplexers, baluns, power combiners, band-stop/band elimination filters and power dividers, low-pass filters and high-pass filters. All of these different components only comprise inductors, capacitors and/or transmission lines in topologies only slightly different from the bandpass filters disclosed herein.

Diplexer and Multiplexer Design

Diplexers are common components in multi-band systems, and perform a multitude of functions. In some instances they help isolate transmit and receive channels, and in other cases separate bands at different carrier frequencies for different receiver channels.

Further to the discussion of bandpass filters above, if one connects one port of the higher band filter with the lower band filter then a diplexer which is 3 port device if formed. These can be stacked next to each other. An exemplary way to vertically stack them is to have a very thick ground plane which is sufficiently thicker than the skin depth between them. One could stack up the cross-section shown in FIG. 17A, one on top of the other, either as two discrete devices or in a single device, or use more than 3 layers of LCP in a single device to achieve the desired isolation as well as the increased number of metal layers.

Figure 19:
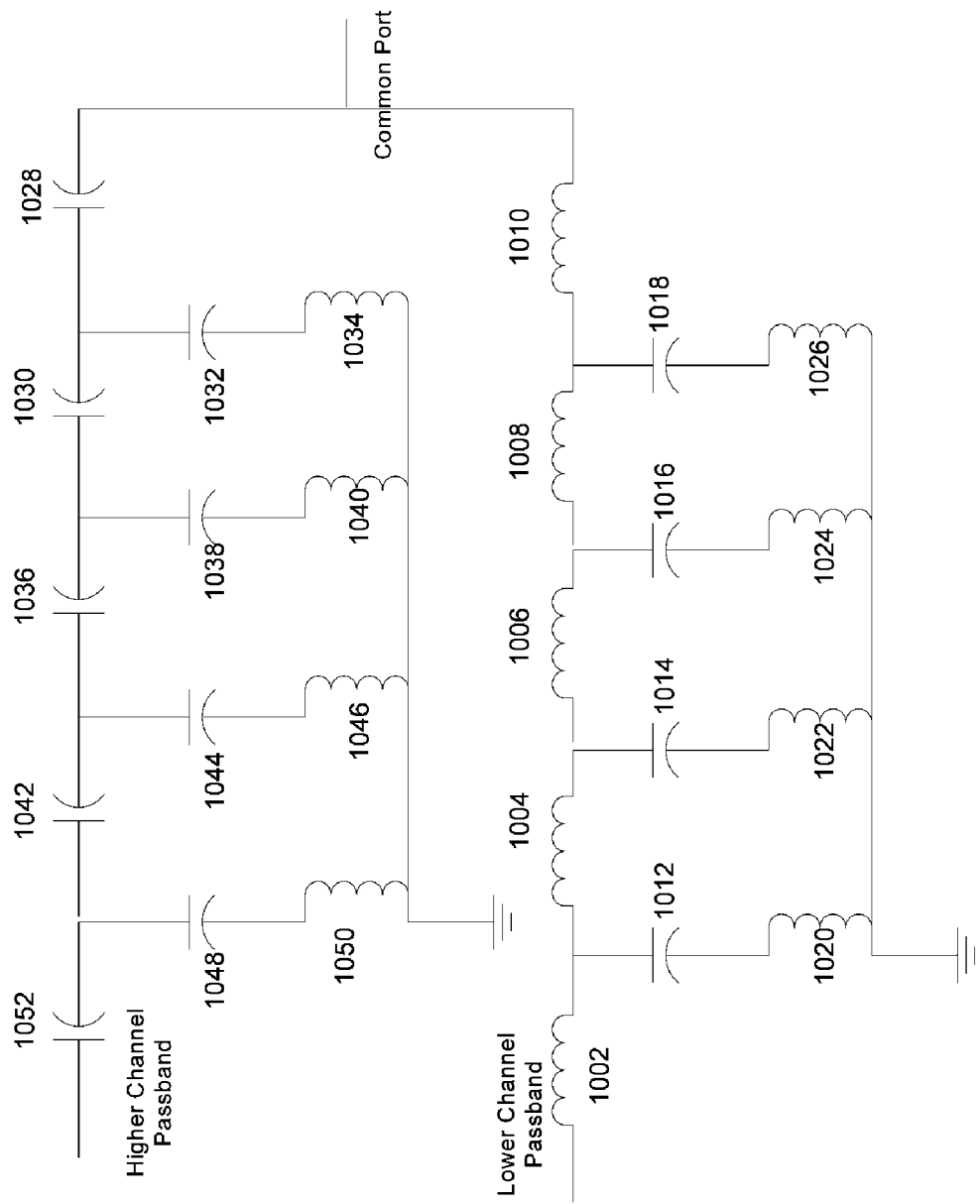
FIG. 19 is a schematic of a diplexer according to an embodiment of the present invention.

As a more complex example, a diplexer can be used in the IF (intermediate frequency) stages of satellite TV systems to help isolate different channels. The performance required for a diplexer in such an application is as follows: channel 1 passband of 900-1450 MHz with insertion loss less than 3 dB and stopband rejection of >40 dB from 1650-2100 MHz; channel2 passband of 1650-2100 MHz respectively with insertion loss less than 3 dB and stopband rejection of >40 dB from 900-1450 MHz. FIG. 19 illustrates the circuit diagram of such a diplexer.

Figure 20:
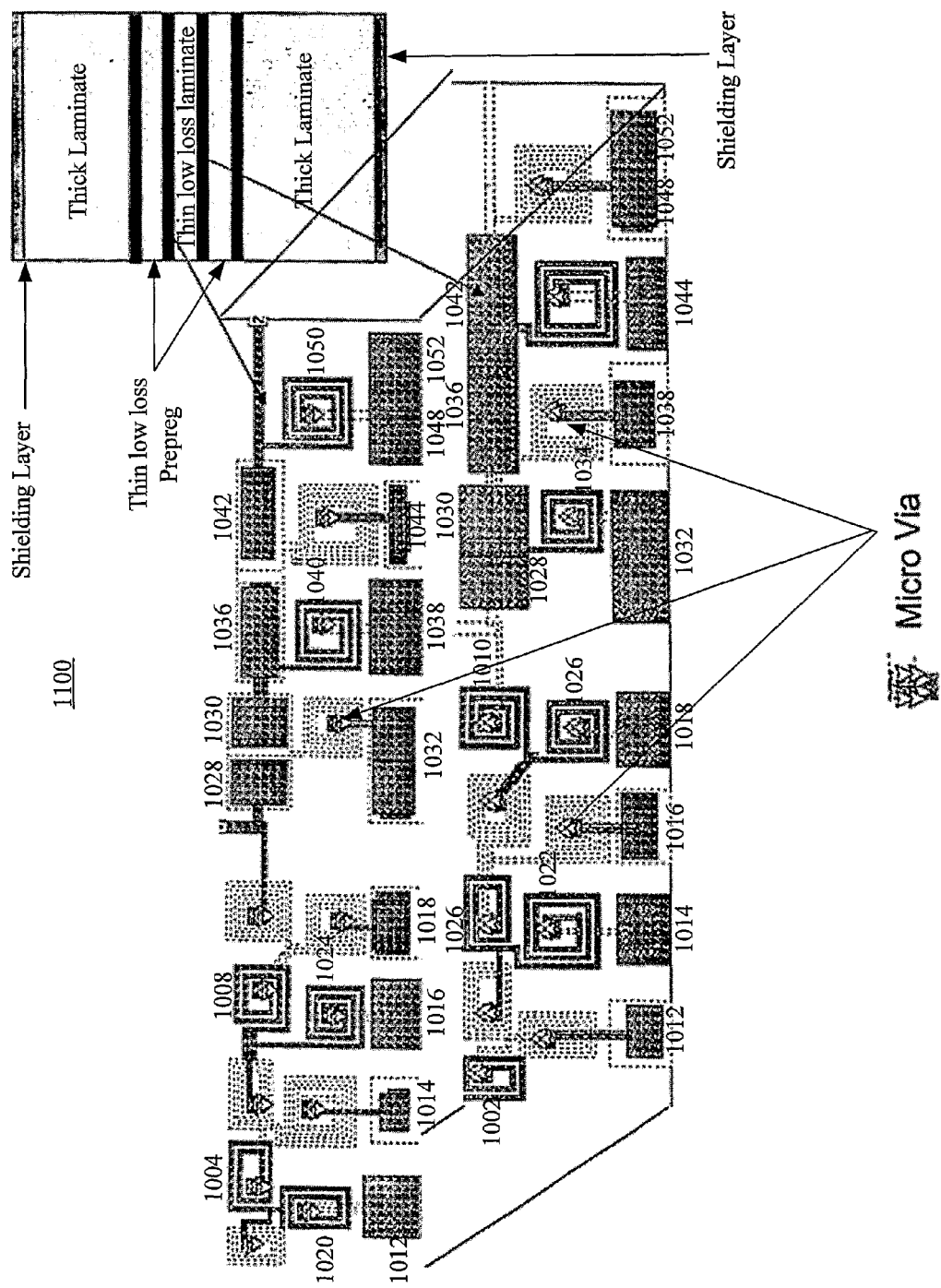
FIG. 20 illustrates a 3D view of a first diplexer according to an embodiment of the present invention.
Figure 21:
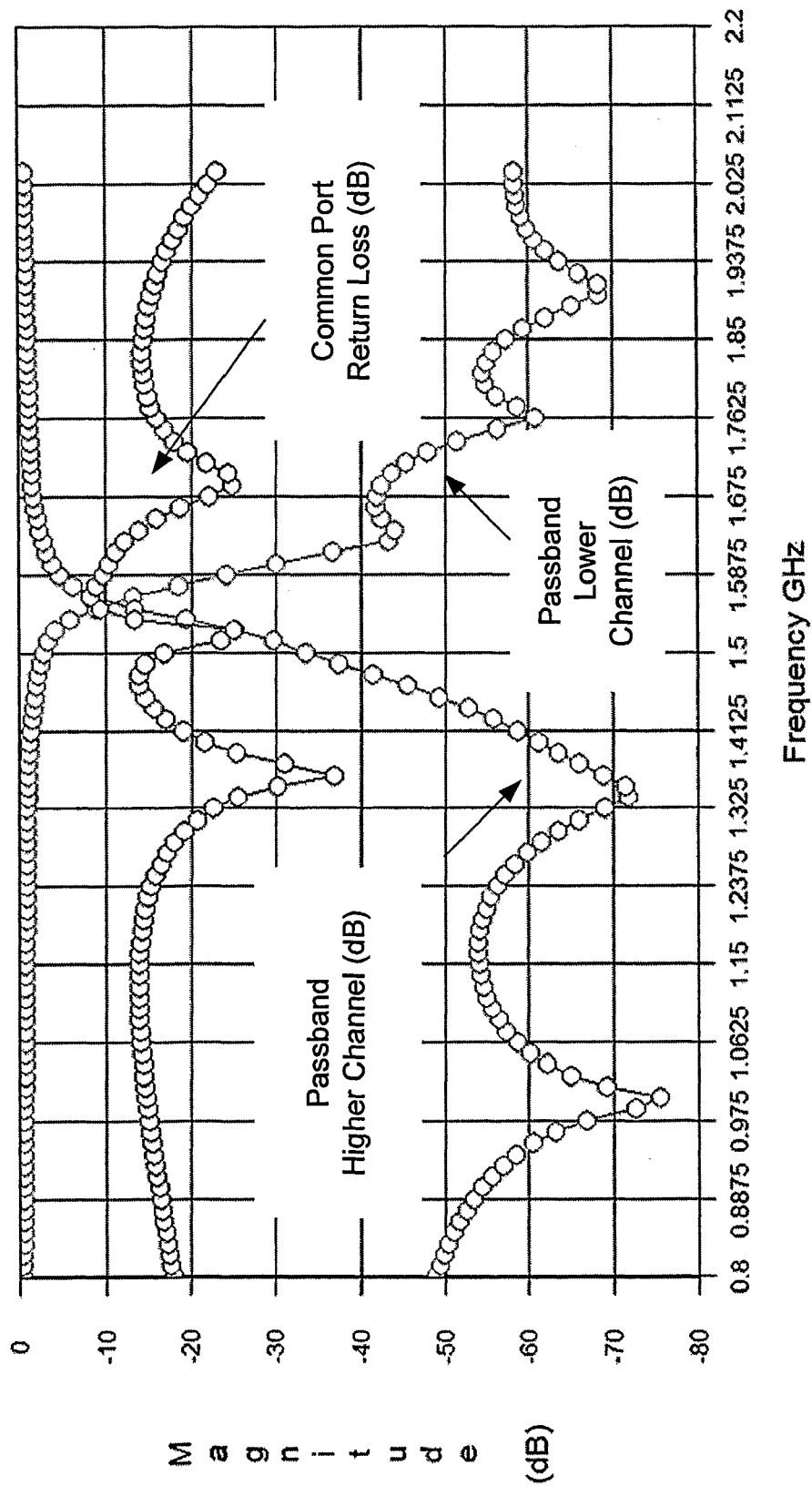
FIG. 21 shows measured data for a diplexer according to an embodiment of the present invention.

According to an embodiment of the present invention, the equivalent circuit as illustrated in FIG. 19 was designed using similar layers and cross-section used for design of the bandpass filters previously discussed. In particular, the entire circuit was designed using four metal layers, which includes two metal layers for the top and bottom shields and two inner metal layers for the inductors and capacitors cross-section used for design of the bandpass filters discussed earlier. FIG. 20 shows one possible layout for the resultant structure which achieves the desired specifications. The solid lines shown in FIG. 20 show the metal pattern on one of the inner layers and the dotted lines show the metal patterning on the corresponding layer either above or below. The capacitors 1012-1052 and inductors 1002-1050 in FIG. 20 correspond to the similarly labeled capacitors and inductors in FIG. 19. The top and bottom stripline grounds are each approximately 1 mm away from the inner layers. Using low loss ($\in_r$=2.9, tan δ=0.002 below 10 GHz, and tan δ=0.003 below 100 GHz) 2 mil thick LCP for embedded parallel plate capacitors or inter-digital capacitors helps achieve unloaded Q>200 for capacitances in the range of 0.1-5 pF for frequencies >2 GHz with capacitance densities on the order of 2 pF/mm². The resultant size for the finished component was approximately 20 mm×5 mm×2 mm. This can be compared to common ceramic monoblock diplexers used for such applications are on the order of 35 mm×12 mm×5 mm. The measured data for such a diplexer is shown in FIG. 21. The insertion loss within the passband is <3 dB, and the attenuation of the respective bands meets the specifications listed earlier.

Figure 22:
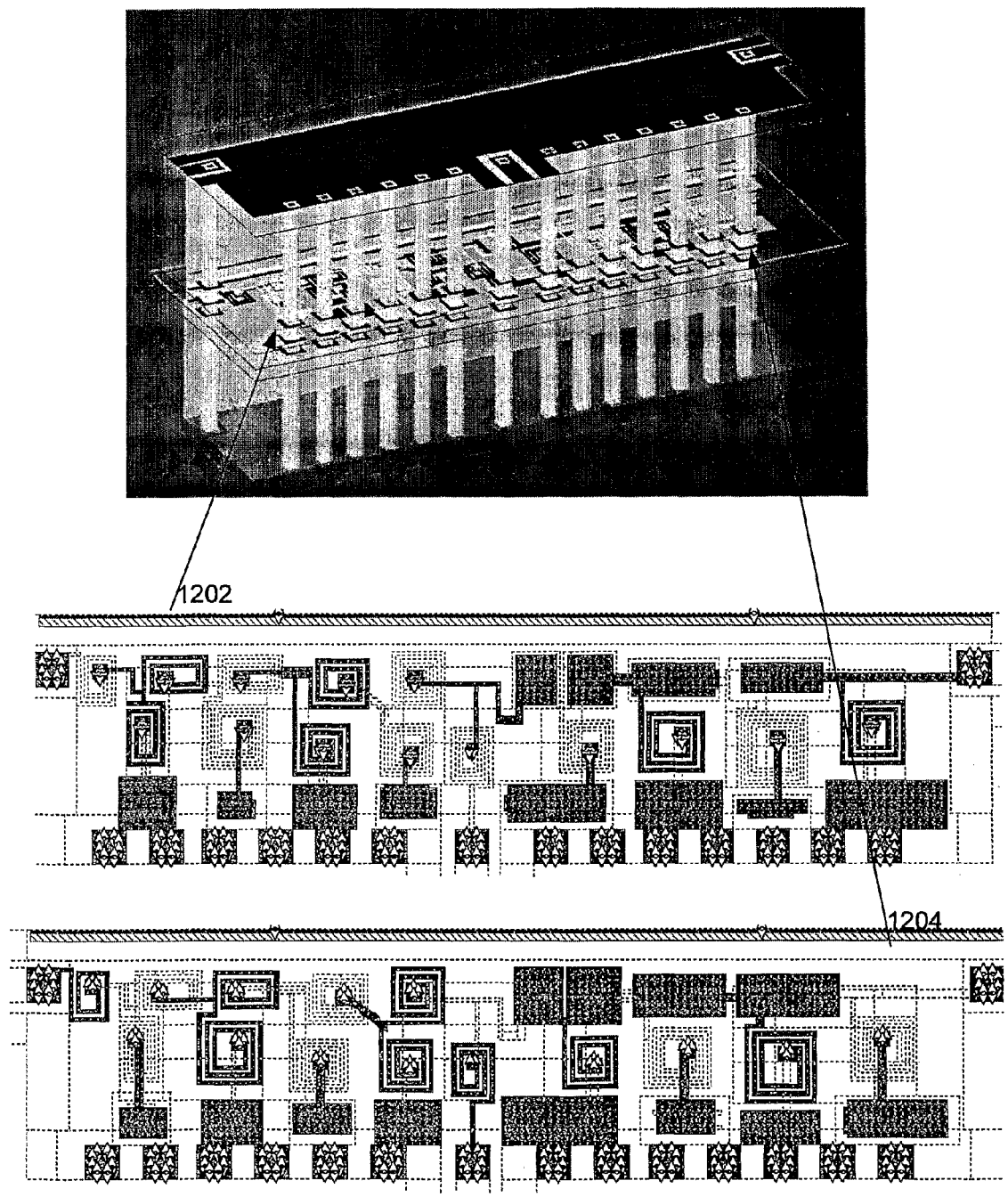
FIG. 22 illustrates a 3D view of a second diplexer according to an embodiment of the present invention.

FIG. 22 shows another illustrative implementation of a layout the high performance diplexer in FIG. 19. The layout in FIG. 22 embeds the functionality of 35 components and is used for the separation of IF bands of the down converted frequency in satellite TV link. The performance of this device controls the clarity and resolution of channels to the TV units that the satellite TV feeds. The inner layers are shown as 1202 and 1204 in FIG. 22. The number of components can be reduced significantly for devices which may not require as high a performance as the one shown.

While the particular embodiments described above are for the IF stage of a satellite TV, other embodiments may include miniature front-end diplexer modules (FEM), which possess narrow pass-bands and have sharp rejection out of band as well as reasonable attenuation of the second and third harmonics. In addition, the front-end diplexer modules would have low insertion loss while being small in size, and oftentimes small in height if they need to be mounted on power amplifier modules. In this instance it is not possible to use multiple layers for inductors since inductors stacked on different layers using series coils can exhibit process variations. However, in this instance the stack up in FIG. 17B is ideal for further size reduction where all capacitors especially those in series with inductors can be implemented in one layer of LCP while all inductors can be on the other. High performance bandpass and bandstop filters which would be used in diplexers and multiplexers and as standalone components could also be implemented using a similar design scheme. This enables manipulation of process parameters to get tighter control of line widths (lw) and spacing (ls) on inductor layers and control dielectric thickness on the other LCP layer which controls capacitance.

Less complex diplexers or multiplexers are used for narrower band applications such as cellular, GPS, and WLAN. The number of devices reduces significantly compared to that shown in FIG. 6 and also allows the use of smaller dimensions and the same sort of topologies and stackup as those mentioned for the bandpass filters in the previous section.

Figure 23:
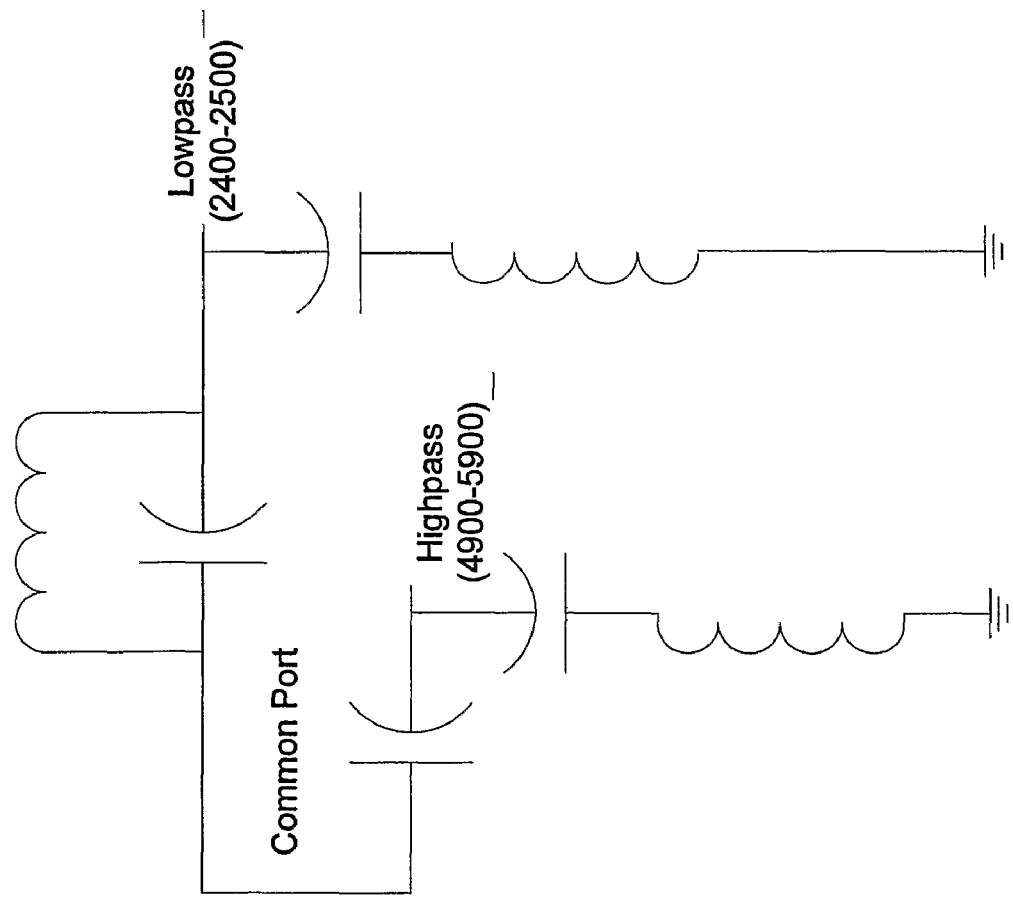
FIG. 23 is a schematic of a compact diplexer according to an embodiment of the present invention.
Figure 24:
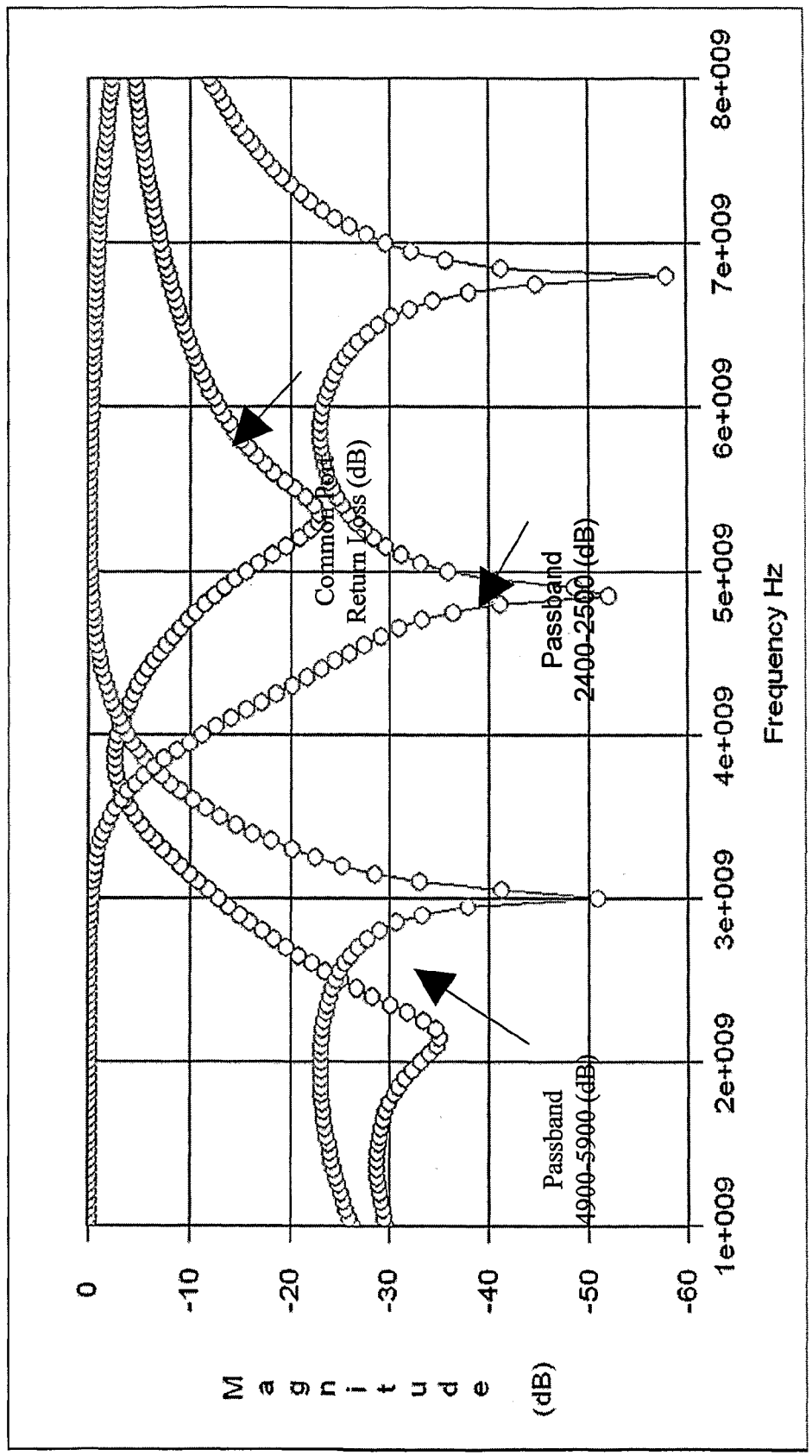
FIG. 24 shows measured data for a compact diplexer according to an embodiment of the present invention.

An example of a compact diplexer for 802.11a/b/g applications consists of a lowpass/highpass diplexer which attenuates the respective stopbands by >20 dB and depicts a common port return loss <12 dB. This device is also laid out using the same number of layers as the previous diplexer and measures 2.2 mm×1.5 mm×0.75 mm. The circuit elements used to implement this function are shown in FIG. 23. The fullwave response for the layout of this diplexer shown in FIG. 23 is illustrated in FIG. 24. The lowpass filter that passes 2400-2500 MHz uses two resonant circuits to attenuate the $2^{nd}$ harmonic (4800-5000 MHz) by 30 dB and the 5150-5900 MHz band by 20 dB. The highpass filter which uses only resonant circuit attenuates the 2400-2500 MHz band by >20 dB. The insertion loss in both bands is <1 dB.

Figures 25A, 25B, 25C:
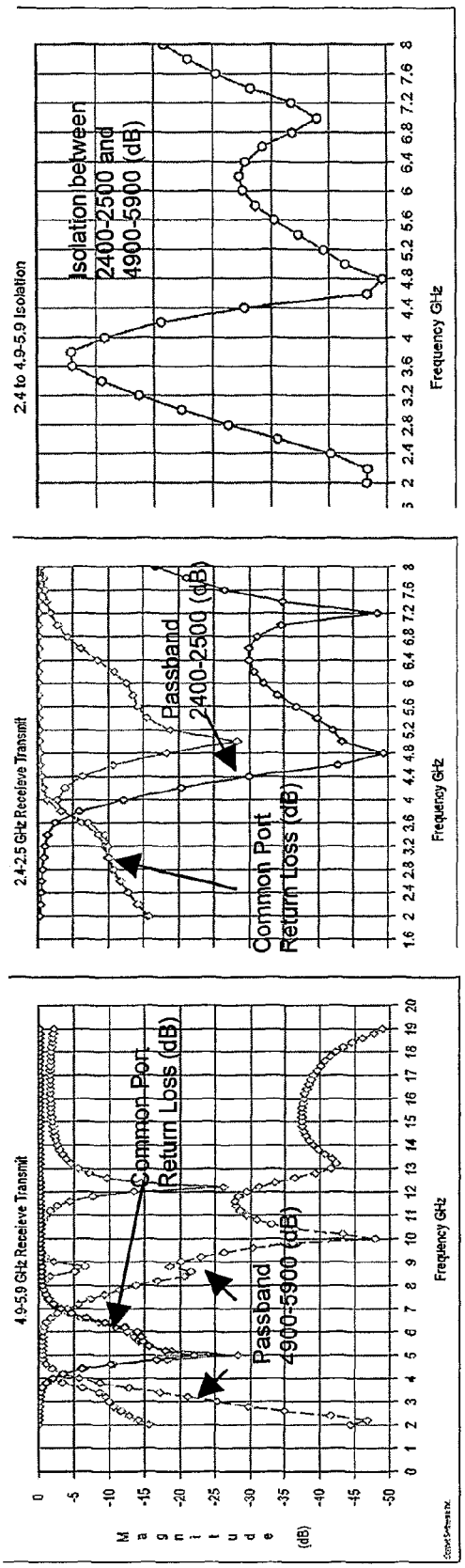
FIGS. 25A-25C show the response for a lowpass/bandpass diplexer.

A more aggressive diplexer for the same 802.11a/b/g application has also been implemented with more components to implement a lowpass/bandpass diplexer device. The diplexer in this instance uses 13 embedded components in a device size of 3.5×2.2×0.75 mm. The response for the layout of this diplexer is shown in FIGS. 25A-25C. FIG. 25A shows the bandpass response of the higher band (4900-5900 GHz) and common port return loss. The bandpass section which passes 5150-5900 MHz attenuates 2400-2500 MHz by 30 dB and its second and third harmonics by approximately 30 dB. FIG. 25B shows the lowpass response of the lower band (2400-2500 GHz). The lowpass section which passes 2400-2500 MHz attenuates its second and third harmonic by 40 dB and 30 dB respectively and the 5150-5900 MHz band by 30 dB. FIG. 25C shows the isolation between the two bands of interest—2400-2500 GHz and 4900-5900 GHz. The insertion loss in both bands is <1.5 dB from −25° C. to 85° C.

The use of high K layers is more appropriate for compact diplexers. high K layers can be used typically for capacitors and inductors and transmission line resonators in this instance since they do not impact the insertion loss of diplexer circuits tremendously. Diplexers are much more relaxed in specification.

A multiplexer comprises lowpass, highpass, and several band pass filters connected to a common port of in series to deal with more than one band. An example for the use of a multiplexer would be for true global radio which can use all cellular bands, WLAN, GPS and Bluetooth bands simultaneously by using a triplexer in series with an antenna that can capture signals from 800 MHz (where cellular begins) to 6 GHz (where WLAN ends). Such a triplexer would allow for one signal containing information for all applications to be split up for respective receivers without interferences from one another. Quadplexers and heptaplexers are viable as the need for additional standards such as WiMAX, and UWB becomes important for ubiquitous wireless computing. The discussions above with regard to resonator types and coupling elements possible in bandpass filters are also applicable to these diplexers and multiplexers to achieve the required isolation between bands.

Baluns Design

Radio Frequency (RF) baluns are generally used to divorce transmission lines from the antennae. Baluns, which is a contraction of the words balanced and unbalanced, are simply transformers whose function is to connect unbalanced feeds to balanced circuits. Conveniently, the balun or phase matching circuit can also match differing impedances between two circuits with required phase information. Couplers, provide required but not equal amounts of energy into multiple ports while maintaining good isolation from each of the coupled ports.

Baluns may be an important component in the front-end of RF receivers, especially those that contain an integrated differential low-noise amplifier (LNA) as the very first active component. The balun is used to convert a single ended signal from the bandpass filter that follows the diplexer and antenna to a balanced differential signal for the input to the LNA. Since on-chip baluns and transformers take up valuable real estate and are limited in terms of performance due to poor Qs, an off-chip miniature balun with low loss and good phase and amplitude balance becomes very important.

Figure 26:
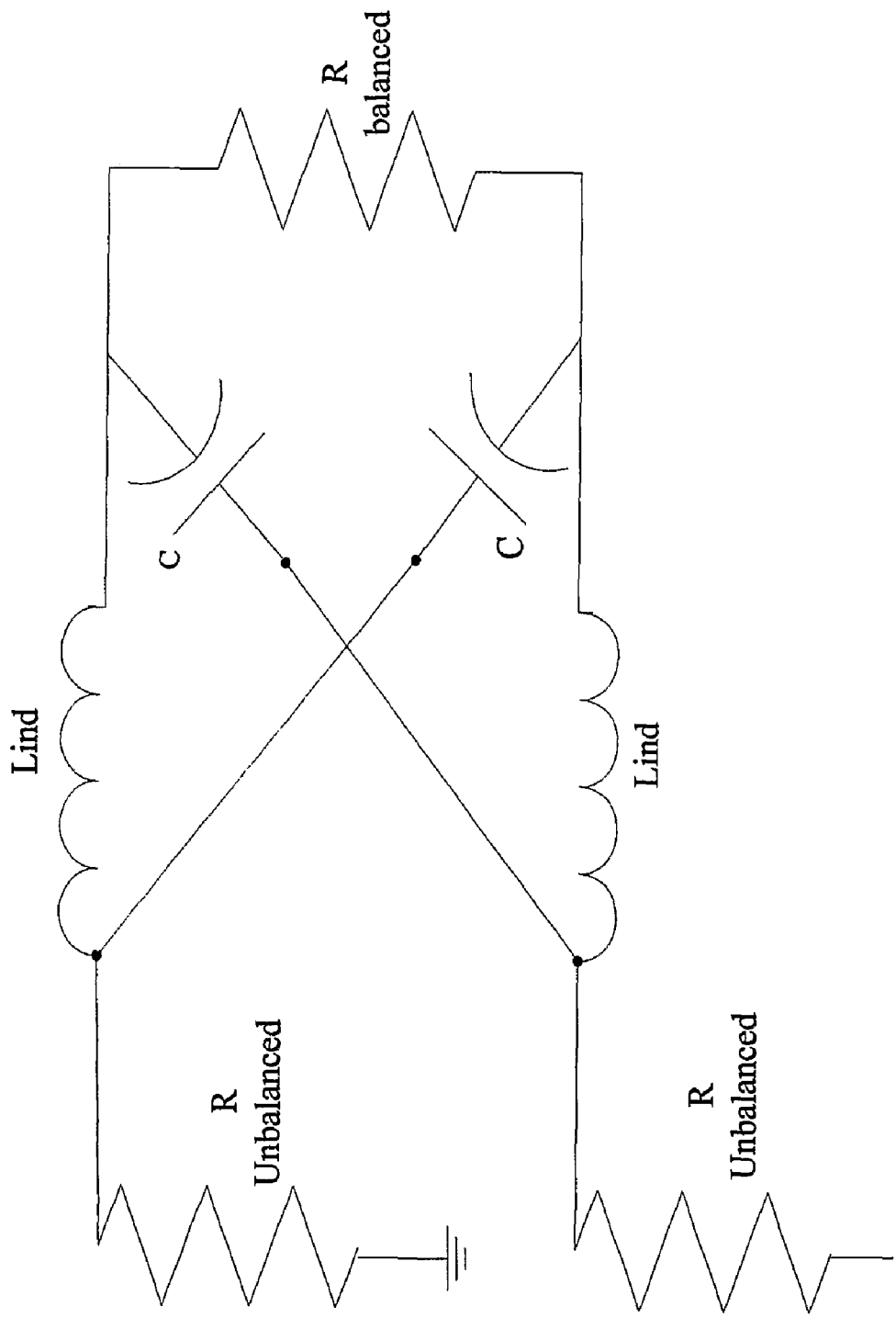
FIG. 26 is a schematic of a lattice type balun according to an embodiment of the present invention.
Figure 27:
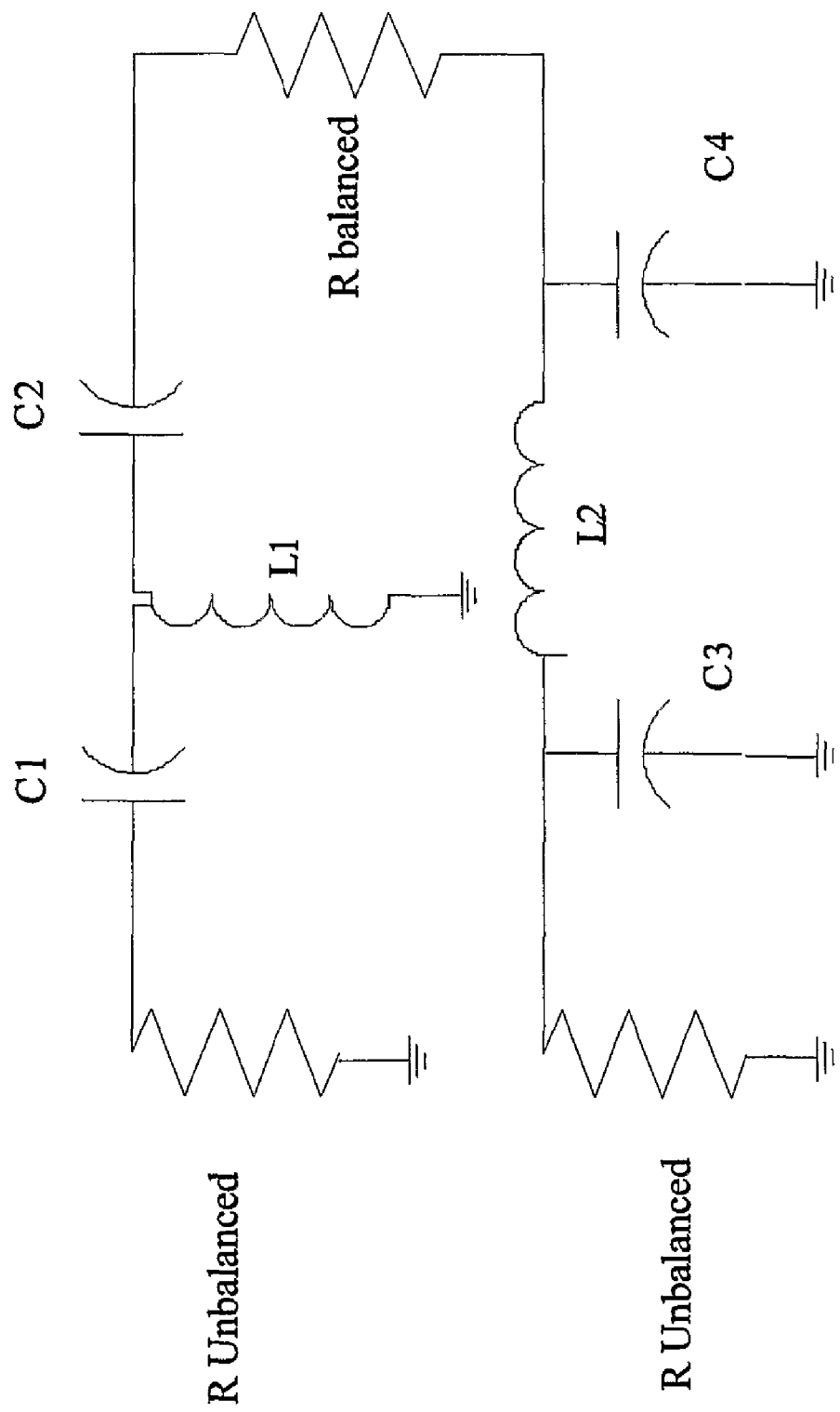
FIG. 27 is a schematic of a second balun according to an embodiment of the present invention.

Lattice type baluns such as the one shown in FIG. 26 are ideal for narrowband applications such as 802.11b/g, Bluetooth, cellular and GPS where the operating frequency is 2.45 GHz±50 MHz. For larger bandwidth applications such as 802.11a and ultra wideband (UWB) where the operating frequency is 5.4 GHz±500 MHz or even wider as in UWB, the schematic shown in FIG. 27 has been used. More elements can be added to each arm for control of impedance and transmission zeroes and power distribution. FIGS. 26 and 27 show lowpass and highpass type baluns were the 3 dB frequencies are typically designed as the center frequency of the band. However, the circuits can be transformed to bandpass and bandstop type circuits which can provide phase imbalance as well as band selectivity.

The lumped elements in circuits in FIGS. 26 and 27 were designed using five metal layers, which includes the top and bottom ground planes. The resultant size for the finished component was approximately 2 mm×1 mm×1.5 mm. This compares well with LTCC type baluns which use in excess 10 layers to achieve the same size and performance.

Figure 28:
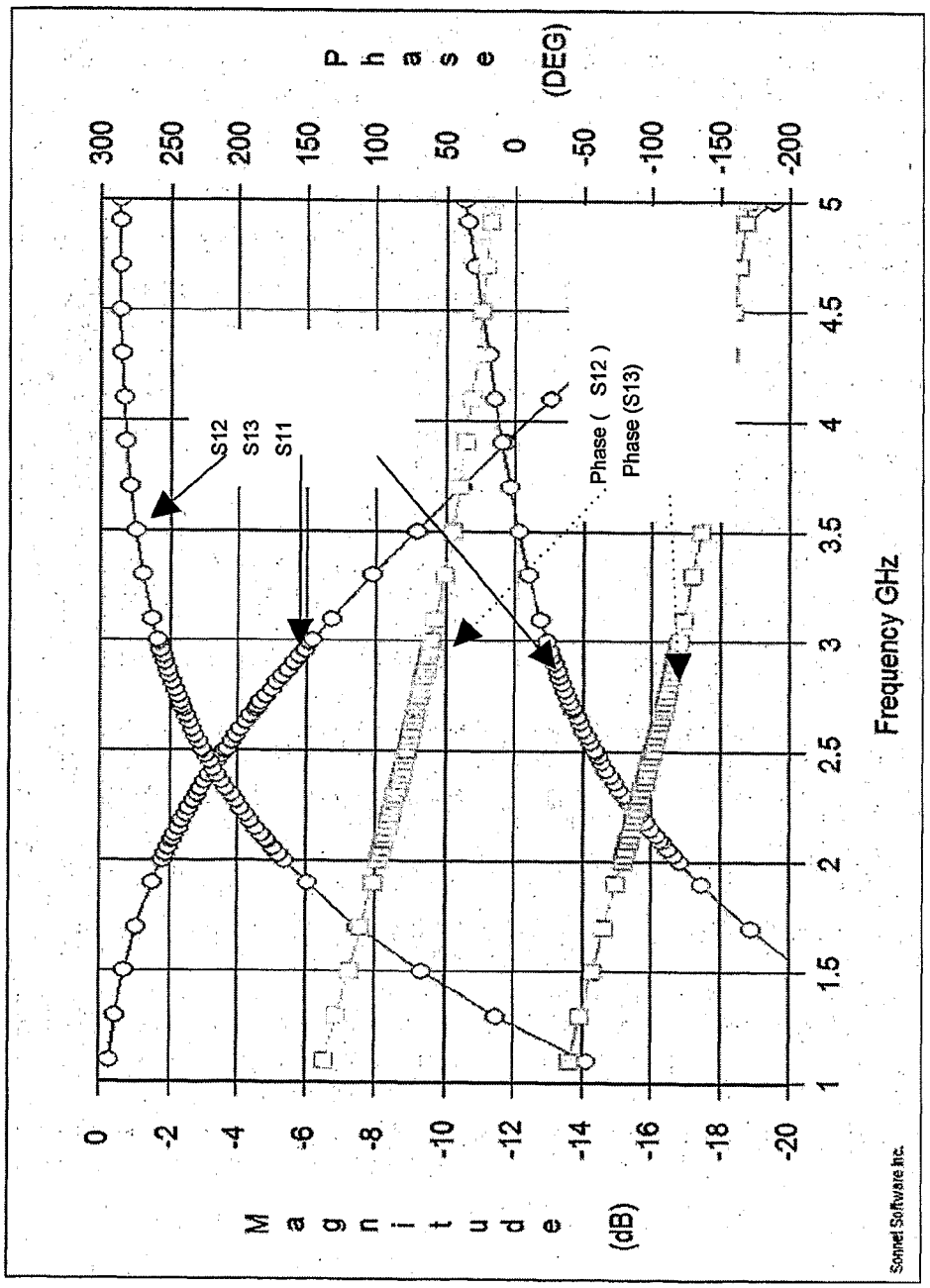
FIG. 28 shows the response for an 802.11b/g type balun according to an embodiment of the present invention.
Figure 29:
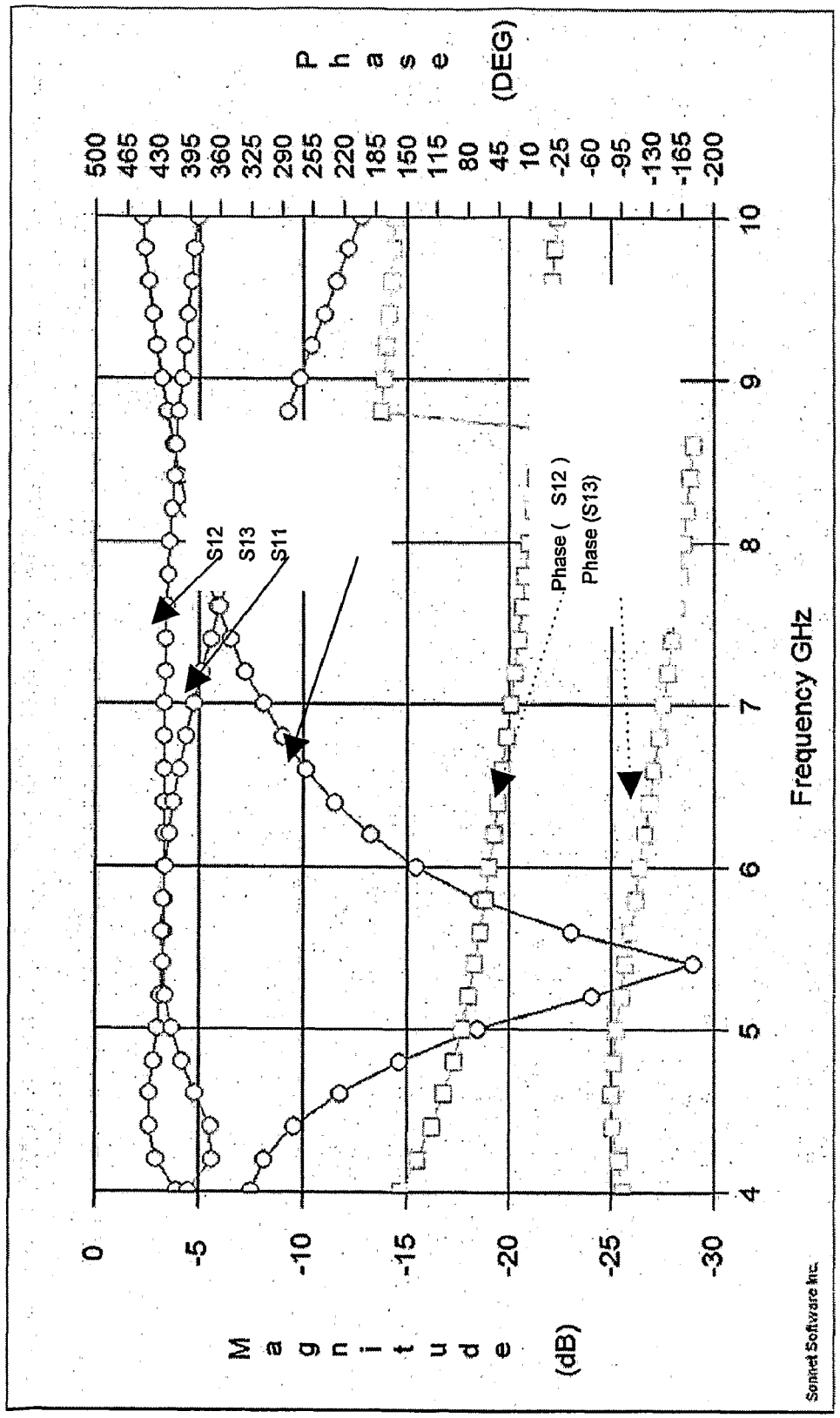
FIG. 29 shows the response for an 802.11a type balun according to an embodiment of the present invention.

FIGS. 28 and 29 show the data for a 2.4 GHz balun and 5.4 GHz balun, respectively. The response in FIG. 29 is an example of a balun in FIG. 26 whereas the response in FIG. 29 is an example of a balun in FIG. 27. The data for the narrowband balun (FIG. 26) shows a worse case amplitude imbalance of ±0.75 dB in 2.45 GHz±50 MHz and a corresponding phase imbalance of ±2 degrees. The data for the wideband balun (FIG. 27) shows a worst case amplitude imbalance of ±0.75 dB in 5.4 GHz±500 MHz and a corresponding phase imbalance of ±2 degrees.

Figure 30:
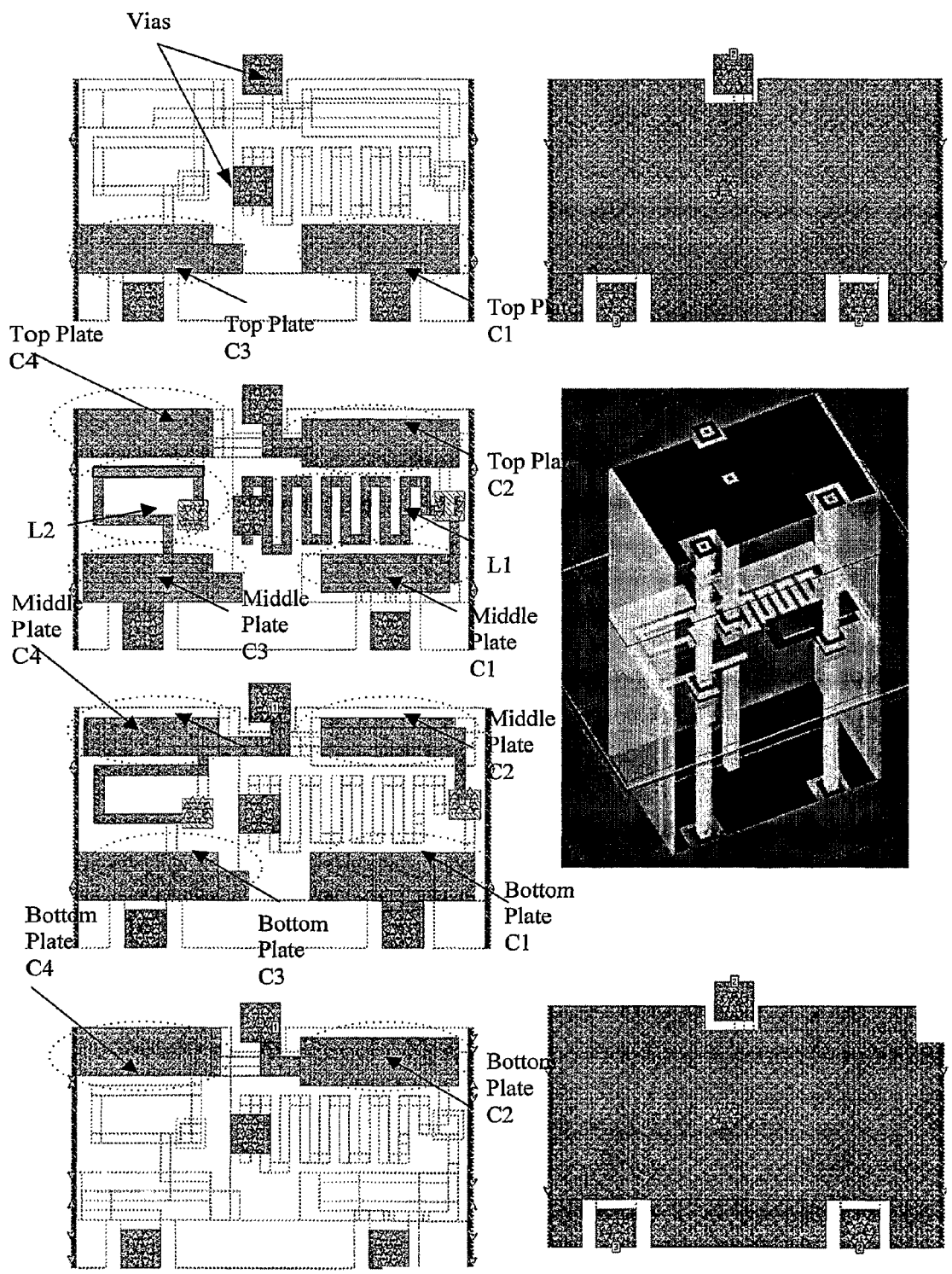
FIG. 30 shows a 3D view for an 802.11a type balun according to an embodiment of the present invention.

FIG. 30 shows the 3D view and layers for a 802.11a type balun which implements schematic in FIG. 27. The baluns use six layers on stack and conforms to the one shown in FIG. 17A. In particular, 1 mil LCP is used with 4 mils of Rogers 4450 prepreg and Rogers 4350 laminate on either side of the 1 mil LCP.

The use of high K layers is more appropriate for compact baluns. high K layers can be used typically for capacitors and inductors and transmission line resonators in this instance since they do not impact the insertion loss of diplexer circuits tremendously. Apart from loss the designs need to be tolerate process variations. Baluns and compact narrow-band diplexers are much more relaxed in specification. Stack up shown in FIG. 17E becomes appropriate where the need for LCP is completely eliminated from the center of the device. high K can be exclusively used for integration of all passives. Laminate or LCP may be used on the outside layers.

Estimating Q's for the Components

The circuit prototypes with ideal components in FIGS. 14A-14D, 19, 23, 26, and 27 can be simulated in a circuit simulation tool to estimate the Qs required for the individual components. Once the Qs are estimated, topologies similar to those described above can be used as guidelines for the design of stand alone components. Inductors in the range of 1 nH-10 nH can be embedded in stripline, CPW, microstrip or a combination of the above with Qs in the range of 30-200 based on the topology and configuration used. Using low loss ($\in_r$=2.9, tan δ=0.002 below 10 GHz, and tan δ=0.003 below 100 GHz) 1 mil/2 mil thick LCP for embedded parallel plate capacitors or inter-digital capacitors helps achieve unloaded Q>200 for capacitances in the range of 0.1 pF-5 pF for frequencies greater than 2 GHz with capacitance densities on the order of 2 $pF/mm^2$.

In accordance with an aspect of the present invention, the dielectric material(s) used to achieve capacitance is virtually any low cost, high performance organic, such as liquid crystalline polymer (LCP) or polyphenyl ether (PPE), in a laminate or thin film. The dielectric constant, loss and thickness of the organic laminate is imperative to achieve the range of capacitances, and density needed for such applications. For example, the dielectric constant should be between approximately 2 and 100, the loss should be less than approximately 0.01, and the thickness should be between approximately 10 microns and 1000 microns. The present invention comprises the range(s) of capacitances made by sandwiching thin organic dielectrics (e.g., approximately less than 10-100 um). The capacitance range available is from 100 s of picofarads to unit femtofarads.

An aspect of the present invention further comprises using a hybrid of co-planar waveguide (CPW)-type, microstrip and stripline topologies which makes it convenient to add grounded/shunted elements, high Q elements, and completely shielded components. The use of CPW topologies allows for additional paths for excess currents to sink from areas of current concentration, thereby reducing coupling of devices magnetically and electrically. Additionally, CPW topologies allow for referencing of voltage in proximity to the signal carrying elements, which enables larger components like diplexers, duplexers that need many more components than what is required in a filter and other passive circuits discussed above.

In accordance with an aspect of the present invention, an all organic substrate with embedded or integrated circuitry such as passive signal distribution and manipulation components in accordance with the present invention can be integrated in a multilayer board because both use organic technology. A board is used ordinarily as a carrier of such devices, which are typically mounted on the board in SMD or BGA/CSP configuration. However, if desired, components in accordance with the present invention using organic materials can be constructed in a stand alone SMD or BGA/CSP form to make it mountable on a multilayer board.

The design of components is accomplished in such a way that the final packaging of the device in stand-alone form or as an integrated device is done by sandwiching one or more thicker organic cores with metal on one or more sides to provide shielding from interferes and radiation.

In accordance with the present invention, multi-layer components using any suitable low cost, high performance organic (e.g., LCP and PPE) can be used not only for integration, but also miniaturization of several components. For example, a two pole filter constructed in accordance with the present invention using two metal layers on two sides of a think laminate substrate and then shielded on both sides has small footprints which are comparable to $\lambda/40$ where $\lambda$ is the wavelength of electromagnetic wave at a particular frequency (f). Such reduction in size is available for all passive signal distribution devices where f is typically the center frequency of balun, coupler, filter or the 3 dB transmission points of low pass filter, high pass filters, diplexers, and multiplexers. Using known processing techniques on a 9"×12", 12"×12", 18"×12", 20"×24", 40"×48" and similar large area substrate, it is possible to fabricate approximately thousands of such components with component-to-component spacing included, which illustrates its cost effectiveness and cost reduction. The spacing and design rules used for the substrates, components and between components includes both the tooling for dicing, encapsulation, wirebondability, direct chip attach such as flip chip, and lastly also includes pads and openings for RF testability. A component or combination of components according to the present invention requires a minimum of two metal, three or four metal layers pattering because of the CPW, microstrip, stripline type topologies respectively compared to the multi-layers in ceramic, molded cavity, LTCC components. It thus becomes possible to eliminate the need for multiple levels of packaging from a performance and size standpoint and have ultimately this particular solution as the final or the only PCB required for communication devices. This also reduces design time and processing time as compared to ceramic filters or molded cavity filters.

Multiple Components Design

While the filters, diplexers, multiplexers, and baluns above have each been described separately, one of ordinary skill in the art would recognize that other embodiments in accordance with the present invention could contain one or more of the filters, diplexers, multiplexers, and baluns. For example, a fabricated device in accordance with the present invention could contain at least one filter, at least one diplexer, and at least one balun. In order to include filters, diplexers, multiplexers, and baluns or other components in the same device while keeping the size of the device small, an embodiment of the presention may place high performance and low performance components on particular layers and further, high K dielectric particles may be incorporated into certain layers of the device.

Figure 32:
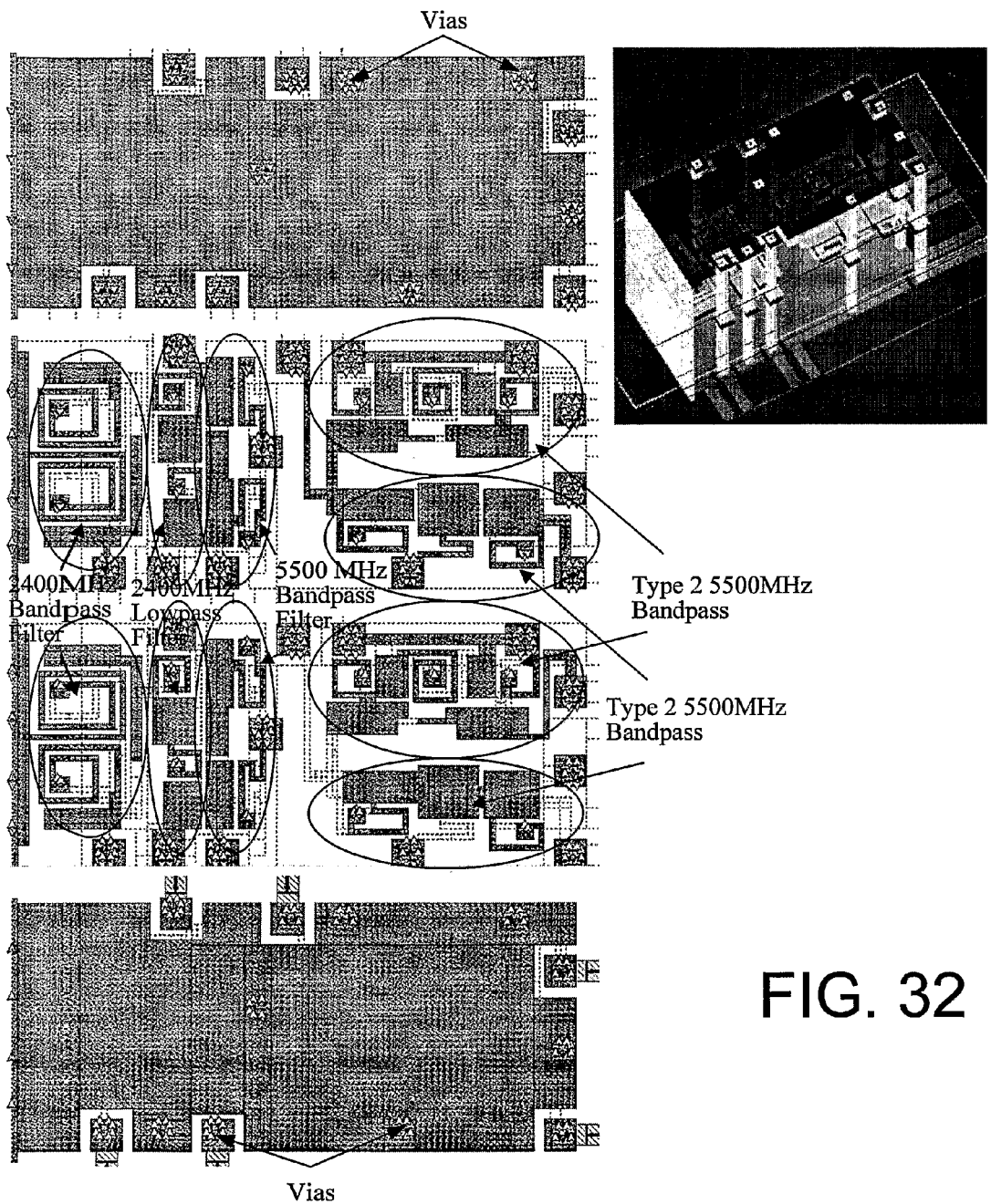
FIG. 32 shows a 3D view for an integrated device with multiple integrated passive devices according to an embodiment of the present invention.

FIG. 32 illustrates the integration of several components to achieve the functional description shown in FIG. 31. This integrates all components needed for dual band WLAN application. FIG. 31 shows two common ports, RX Antenna and TX Antenna, which denotes terminals that are connected to the receive antenna and transmit antennas respectively. Ports identified as 2.5 GHz RX, 2.5 GHz TX, 5 GHZ RX, 5 GHz TX denotes ports that connect to the 2.5 GHz Low noise amplifier, 2.5 GHz Power Amplifier, 5 GHz Low Noise Amplifier, and 5 GHz Power Amplifier respectively. FIG. 32 shows the 3D view of the design used to implement this function and shows that it integrates a 2400 MHz Bandpass, two 2400 MHz Low pass filters, and two types of 5500 MHz bandpass filters.

This design in FIG. 32 integrates all the functions in a size of 7×3 mm. The size is determined by the amount of performance required and isolation required from port to port and antenna to antenna. The stack up shown uses that shown in FIG. 17A with 4 mil prepreg and laminate on either side of 1 mil LCP. Baluns can be further added if the circuits at the non-antenna ports are all balanced.

For further size reduction stackups which use a combination of high K and LCP are most appropriate since this integrated devices incorporates both diplexers, baluns and bandpass filters.

Stackups shown in FIGS. 17A-E allow for integration of components, as explained above and in U.S. Publication No. 20040000425A1, published Jan. 1, 2004, entitled "Methods for Fabricating Three-Dimensional All Organic Interconnect Structures," and assigned to the owners of the present application, allow for the mounting of ICs using Flip Chip, direct chip attach or wire bonding technology. The stack up shown in FIG. 17F is yet another way of allowing ICs, IPDs, and other SMT (surface mount) devices to be mounted on top of substrates or boards manufactured using the described technologies. RCF (resin coated foil) shown in FIG. 17E allows for the same densities for lines and spacing and microvias but at a lower cost compared to high K and LCP.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A signal processing module for wireless applications, comprising:
   a Liquid Crystalline Polymer (LCP) layer having a first surface and a second surface opposite the first surface;
   a first patterned metal layer on the first surface of the LCP layer;
   a second patterned metal layer on the second surface of the LCP layer, wherein the first and second metal layers are patterned to form integrated components such that the first and second metal layers interact with one another to form a first resonator and a second resonator;
   a first prepreg layer on the first metal layer opposite the LCP layer and a second prepreg layer on the second metal layer opposite the LCP layer;
   a first laminate layer on the first prepreg layer opposite the first metal layer, and a second laminate layer on the second prepreg layer opposite the second metal layer;
   a third metal layer on a first surface of the first laminate layer and patterned to form a first capacitor plate; and
   a fourth metal layer on a second surface of the first laminate layer opposite the first surface and patterned to form a second capacitor plate, wherein the first capacitor plate and second capacitor plate form a parallel plate capacitor.

2. The module of claim 1, wherein the first resonator comprises a first inductor formed in the first patterned metal layer and a second inductor formed in the second patterned metal layer, wherein the first inductor is connected by a first microvia to the second inductor.

3. The module of claim 1, wherein the first resonator is magnetically coupled to the second resonator.

4. The module of claim 1, further comprising a third resonator formed in the first and second metal layers and electrically connecting the first resonator to the second resonator, wherein the third resonator provides a primary attenuation zero in a stopband.

5. The module of claim 1, wherein the first and second resonators comprise transmission line resonators.

6. The module of claim 1, wherein the first and second resonators comprise one or more of co-planar waveguide, stripline, or microstrip topologies.

7. The module of claim 1, further comprising a first shielding layer on the first laminate layer opposite the first prepreg layer and a second shielding layer on the second laminate layer opposite the second prepreg layer.

8. The module of claim 1, wherein the integrated components include at least one of capacitors or inductors.

9. A diplexer for a multi-band wireless application, comprising:
a Liquid Crystalline Polymer (LCP) layer having a first surface and a second surface opposite the first surface;
a first patterned metal layer on the first surface of the LCP layer;
a second patterned metal layer on the second surface of the LCP layer, wherein the first and second metal layers are patterned to form integrated components such that the first and second metal layers interact with one another to form a first filter and a second filter connected by a common port;
a first prepreg layer on the first metal layer opposite the LCP layer, and a second prepreg layer on the second metal layer opposite the LCP layer;
a first laminate layer on the first prepreg layer opposite the first metal layer, and a second laminate layer on the second prepreg layer opposite the second metal layer;
a third metal layer on a first surface of the first laminate layer and patterned to form a first capacitor plate; and
a fourth metal layer on a second surface of the first laminate layer opposite the first surface and patterned to form a second capacitor plate, wherein the first capacitor plate and second capacitor plate form a parallel plate capacitor.

10. The diplexer of claim 9, wherein the first filter comprises a first inductor formed in the first patterned metal layer and a second inductor formed in the second patterned metal layer, wherein the first inductor is connected by a first microvia to the second inductor.

11. The diplexer of claim 9, wherein the first and second metal layers comprise one or more of co-planar waveguide, stripline, or microstrip topologies.

12. The diplexer of claim 9, further comprising a first shielding layer on the first laminate layer opposite the first prepreg layer and a second shielding layer on the second laminate layer opposite the second prepreg layer.

13. The diplexer of claim 9, wherein the integrated components include at least one of capacitors or inductors.

14. A balun for a wireless application, comprising:
a high K organic layer having a first surface and a second surface opposite the first surface;
a first patterned metal layer on the first surface of the high K organic layer;
a second patterned metal layer on the second surface of the high K organic layer, wherein the first and second metal layers are patterned to form integrated components such that the first and second metal layers interact with one another to form a first passive device and a second passive device;
a first prepreg layer on the first metal layer opposite the high K organic layer, and a second prepreg layer on the second metal layer opposite the high K organic layer;
a first outer organic layer on the first prepreg layer opposite the first metal layer, and a second outer organic layer on the second prepreg layer opposite the second metal layer, wherein the first metal layer is patterned to form a first capacitor plate and the second metal layer is patterned to form a second capacitor plate; and
a third metal layer on the first outer organic layer patterned to form a third capacitor plate, wherein the first, second and third capacitor plates form a capacitor.

15. The balun of claim 14, wherein the first outer organic layer comprises one of a laminate layer, LCP layer or high K organic layer.

16. The balun of claim 14, wherein the integrated components include at least one of capacitors or inductors.

17. The balun of claim 14, further comprising a first shielding layer on the first outer organic layer opposite the first prepreg layer and a second shielding layer on the second outer organic layer opposite the second prepreg layer.

18. A signal processing module for multi-band wireless applications, comprising:
a first Liquid Crystalline Polymer (LCP) layer having a first surface and a second surface opposite the first surface;
a first patterned metal layer on the first surface of the first LCP layer;
a second patterned metal layer on the second surface of the first LCP layer;
a second LCP layer having a first surface and a second surface opposite the first surface;
a third patterned metal layer on the first surface of the second LCP layer;
a fourth patterned metal layer on the second surface of the second LCP layer, wherein the first, second, third and fourth metal layers are patterned to form integrated components, the integrated components comprising at least a first filter and a second filter connected by a common port;
a first prepreg layer disposed between the first and second LCP layers;
a second prepreg layer on the second metal layer opposite the first LCP layer, and a third prepreg layer on the third metal layer opposite the second LCP layer; and
a first outer organic layer on the second prepreg layer opposite the second metal layer, and a second outer organic layer on the third prepreg layer opposite the third metal layer.

19. The module of claim 18, further comprising a first shielding layer on the first outer organic layer opposite the second prepreg layer and a second shielding layer on the second outer organic layer opposite the third prepreg layer.

20. The module of claim 18, wherein the first outer organic layer comprises one of a laminate layer, LCP layer or high K organic layer.

21. The module of claim 18, further comprising a first RCF layer on first outer organic layer opposite the second prepreg layer; and
a second RCF layer on the second outer organic layer opposite the third prepreg layer.

22. A signal processing module, comprising:
- an unfilled Liquid Crystalline Polymer (LCP) layer having a first surface and a second surface opposite the first surface;
- a first patterned metal layer on the first surface of the LCP layer;
- a second patterned metal layer on the second surface of the LCP layer, wherein the first and second metal layers are patterned to form at least a first resonator, a second resonator, a third resonator, and a feedback capacitor, the third resonator connecting the first and second resonators, and the feedback capacitor connected in parallel with the third resonator;
- a first prepreg layer on the first metal layer opposite the LCP layer and a second prepreg layer on the second metal layer opposite the LCP layer;
- a first laminate layer on the first prepreg layer opposite the first metal layer, and a second laminate layer on the second prepreg layer opposite the second metal layer.

23. The module of claim 22, wherein the third resonator provides one or more attenuation zeroes in a stopband.

24. The module of claim 23, wherein the feedback capacitor alters a respective location of the one or more attenuation zeroes.

25. The module of claim 22, wherein the first and second metal layers are further patterned to form a first impedance matching capacitor and a second impedance matching capacitor, wherein the first impedance matching capacitor is connected between the feedback capacitor and the first resonator, and wherein the second impedance matching capacitor is connected between the feedback capacitor and the second resonator.

26. The module of claim 22, wherein the first resonator comprises a first inductor formed in the first patterned metal layer and a second inductor formed in the second patterned metal layer, wherein the first inductor is connected by a first microvia to the second inductor.

27. The module of claim 22, wherein the first resonator is magnetically coupled to the second resonator.

28. The module of claim 22, wherein the first and second resonators comprise transmission line resonators.

29. The module of claim 22, wherein the first and second resonators comprise one or more of co-planar waveguide, stripline, or microstrip topologies.

30. The module of claim 22, further comprising a third metal layer on a first surface of the first laminate layer and patterned to form a first capacitor plate, and a fourth metal layer on a second surface of the first laminate layer opposite the first surface and patterned to form a second capacitor plate, wherein the first capacitor plate and second capacitor plate form a parallel plate capacitor.

31. The module of claim 30, wherein the parallel plate capacitor is a lowpass capacitor connected in parallel with either the first resonator or the second resonator, the lowpass capacitor operative to provide one or both of second harmonic attenuation or third harmonic attenuation.

32. The module of claim 22, further comprising a first shielding layer on the first laminate layer opposite the first prepreg layer and a second shielding layer on the second laminate layer opposite the second prepreg layer.

33. The module of claim 22, wherein the integrated components include at least one of capacitors or inductors.

* * * * *